(12) United States Patent
Choi et al.

(10) Patent No.: US 12,740,111 B2
(45) Date of Patent: Sep. 15, 2026

(54) SEMICONDUCTOR DEVICES

(71) Applicant: Samsung Electronics Co., Ltd., Suwon-si (KR)

(72) Inventors: Seong Heum Choi, Suwon-si (KR); Gi Woong Shim, Suwon-si (KR); Rak Hwan Kim, Suwon-si (KR); Do Sun Lee, Suwon-si (KR); Hyo Seok Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 338 days.

(21) Appl. No.: 18/624,253

(22) Filed: Apr. 2, 2024

(65) Prior Publication Data

US 2024/0421190 A1 Dec. 19, 2024

(30) Foreign Application Priority Data

Jun. 19, 2023 (KR) ........................ 10-2023-0078405

(51) Int. Cl.
*H10D 62/10* (2025.01)
*H10D 30/01* (2025.01)
(Continued)

(52) U.S. Cl.
CPC ......... *H10D 62/121* (2025.01); *H10D 30/014* (2025.01); *H10D 30/43* (2025.01); *H10D 30/6735* (2025.01); *H10D 30/6757* (2025.01); *H10D 64/017* (2025.01); *H10D 64/021* (2025.01)

(58) Field of Classification Search
CPC ........... H10D 30/6735; H10D 30/6757; H10D 64/021; H10D 64/017; H10D 62/121; H10D 30/43; H10D 30/014
See application file for complete search history.

(56) References Cited

U.S. PATENT DOCUMENTS

| | | | |
|---|---|---|---|
| 11,069,535 | B2 | 7/2021 | Lai et al. |
| 2004/0025932 | A1 | 2/2004 | Husher |

(Continued)

FOREIGN PATENT DOCUMENTS

| | | |
|---|---|---|
| KR | 1019930005118 | 3/1993 |
| KR | 20020045657 A | 6/2002 |
| KR | 20220116254 A | 8/2022 |

*Primary Examiner* — Changhyun Yi
(74) *Attorney, Agent, or Firm* — Wolf, Greenfield & Sacks, P.C.

(57) ABSTRACT

A semiconductor device may include a substrate, an active pattern extending in a first horizontal direction on the substrate, a gate electrode extending in a second horizontal direction different from the first horizontal direction on the active pattern, a source/drain region on at least a first side of the gate electrode on the active pattern, and a source/drain contact connected to the source/drain region on the first side of the gate electrode. The source/drain contact may include first, second, and third layers which are sequentially stacked, the first to third layers including the same metal, with each layer having a respective crystal orientation. The source/drain contact may include a first grain boundary at an interface between the first layer and the second layer, and a second grain boundary at an interface between the second layer and the third layer.

20 Claims, 47 Drawing Sheets

(51) Int. Cl.

| | |
|---|---|
| ***H10D 30/43*** | (2025.01) |
| ***H10D 30/67*** | (2025.01) |
| ***H10D 64/01*** | (2025.01) |

(56) References Cited

U.S. PATENT DOCUMENTS

2007/0049017 A1 3/2007 Hsieh
2016/0190008 A1 6/2016 Chandrashekar et al.
2022/0115506 A1 * 4/2022 Lee ........................ H10D 30/43

* cited by examiner

SEMICONDUCTOR DEVICES

CROSS-REFERENCE TO RELATED APPLICATION

This application claims priority from Korean Patent Application No. 10-2023-0078405 filed on Jun. 19, 2023, in the Korean Intellectual Property Office, and the benefits of priority under 35 U.S.C. § 119, and the entire contents of the above-identified application are herein incorporated by reference.

BACKGROUND

1. Technical Field

The present disclosure relates to semiconductor devices, and particularly, to semiconductor devices including a multi-gate transistor, such as a Multi-Bridge Channel Field Effect Transistor (MBCFET™).

2. Description of the Related Art

One scaling technique for increasing the density of a semiconductor device that has been suggested is a multi-gate transistor in which a fin- or nanowire-type silicon body is formed on a substrate and a gate is formed on the surface of the multi-channel active pattern.

As the multi-gate transistor uses a three-dimensional (3D) channel, scaling may be facilitated. Furthermore, current control capabilities may be improved without requiring an increase in the gate length of the multi-gate transistor. Additionally, the short channel effect (SCE), which refers to the potential disruption of the channel region caused by a drain voltage, may be effectively mitigated.

SUMMARY

Aspects of the present disclosure provide semiconductor devices, which may include a plurality of layers that may be formed by multiple physical vapor deposition (PVD) processes. The semiconductor device can be efficiently formed in a relatively small space and may exhibit improved reliability.

Aspects of the present disclosure are not restricted to those explicitly set forth above. The above and other aspects of the present disclosure will become more apparent to one of ordinary skill in the art to which the present disclosure pertains by referencing the detailed description of the present disclosure given below.

According to some embodiments of the present disclosure, there is provided a semiconductor device, comprising a substrate, an active pattern that extends in a first horizontal direction on the substrate, a gate electrode that extends in a second horizontal direction different from the first horizontal direction on the active pattern, a source/drain region on at least one side of the gate electrode on the active pattern, and a source/drain contact connected to the source/drain region on the at least one side of the gate electrode, the source/drain contact including first, second, and third layers which may be sequentially stacked, the first, second, and third layers including the same metal, the first layer having a first crystal orientation, the second layer having a second crystal orientation different from the first crystal orientation, and the third layer having a third crystal orientation different from the second crystal orientation. The source/drain contact may include a first grain boundary at an interface between the first layer and the second layer, and a second grain boundary at an interface between the second layer and the third layer.

According to some embodiments of the present disclosure, there is provided a semiconductor device, comprising a substrate, an active pattern that extends in a first horizontal direction on the substrate, a gate electrode that extends in a second horizontal direction different from the first horizontal direction on the active pattern, a gate spacer on first and second sidewalls in the first horizontal direction of the gate electrode, an etch stopper layer in contact with first and second sidewalls in the first horizontal direction of the gate spacer, a source/drain region on at least a first side of the gate electrode on the active pattern, and a source/drain contact connected to the source/drain region on the first side of the gate electrode, the source/drain contact including first, second, and third layers which are sequentially stacked, each of the first, second, and third layers including tungsten (W), the first layer having a first crystal orientation, the second layer having a second crystal orientation different from the first crystal orientation, and the third layer having a third crystal orientation different from the second crystal orientation. The source/drain contact may include a first grain boundary at an interface between the first layer and the second layer, and a second grain boundary at an interface between the second layer and the third layer. At least parts of first and second sidewalls in the first horizontal direction of the third layer may be in contact with the etch stopper layer.

According to some embodiments of the present disclosure, there is provided a semiconductor device, comprising a substrate, an active pattern extending in a first horizontal direction on the substrate, a first plurality of nanosheets stacked on the active pattern and spaced apart from one another in a vertical direction, a second plurality of nanosheets stacked on the active pattern and spaced apart from one another in the vertical direction, the second plurality of nanosheets spaced apart from the first plurality of nanosheets in the first horizontal direction, a first gate electrode extending in a second horizontal direction that is different from the first horizontal direction on the active pattern, the first gate electrode surrounding the first plurality of nanosheets, a second gate electrode extending in the second horizontal direction on the active pattern, the second gate electrode spaced apart from the first gate electrode in the first horizontal direction, the second gate electrode surrounding the second plurality of nanosheets, a first gate spacer on first and second sidewalls in the first horizontal direction of the first gate electrode, a second gate spacer disposed on first and second sidewalls in the first horizontal direction of the second gate electrode, an etch stopper layer in contact with sidewalls in the first horizontal direction of each of the first gate spacer and the second gate spacer, a source/drain region between the first gate electrode and the second gate electrode on the active pattern, and a source/drain contact connected to the source/drain region between the first gate electrode and the second gate electrode. The source/drain contact may include first, second, and third layers which may be sequentially stacked, each of the first, second, and third layers including tungsten (W), the first layer having a first crystal orientation, the second layer having a second crystal orientation different from the first crystal orientation, and the third layer having a third crystal orientation different from the second crystal orientation. A first grain boundary may be at an interface between the first layer and the second layer, and a second grain boundary may be at an interface between the second layer and the third layer. A sidewall in the first horizontal direction of each of the first to third layers may be in contact with the etch stopper layer, and each of the first grain boundary and the second grain boundary may be parallel to a top surface of the substrate.

It should be noted that the effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION

A semiconductor device according to some embodiments of the present disclosure will hereinafter be described as including a Multi-Bridge Channel Field Effect Transistor (MBCFET™) including nanosheets and a fin field-effect transistor (FinFET) including fin-type channel regions, but the present disclosure is not limited thereto. For example, a semiconductor device according to some embodiments of the present disclosure may include a tunneling field-effect transistor (FET), or a three-dimensional (3D) transistor. As another example, a semiconductor device according to some embodiments of the present disclosure may include a bipolar junction transistor or a lateral double-diffused metal-oxide-semiconductor field-effect transistor (LDMOS).

A semiconductor device according to some embodiments of the present disclosure will hereinafter be described with reference to FIGS. 1 through 4.

Figure 1:
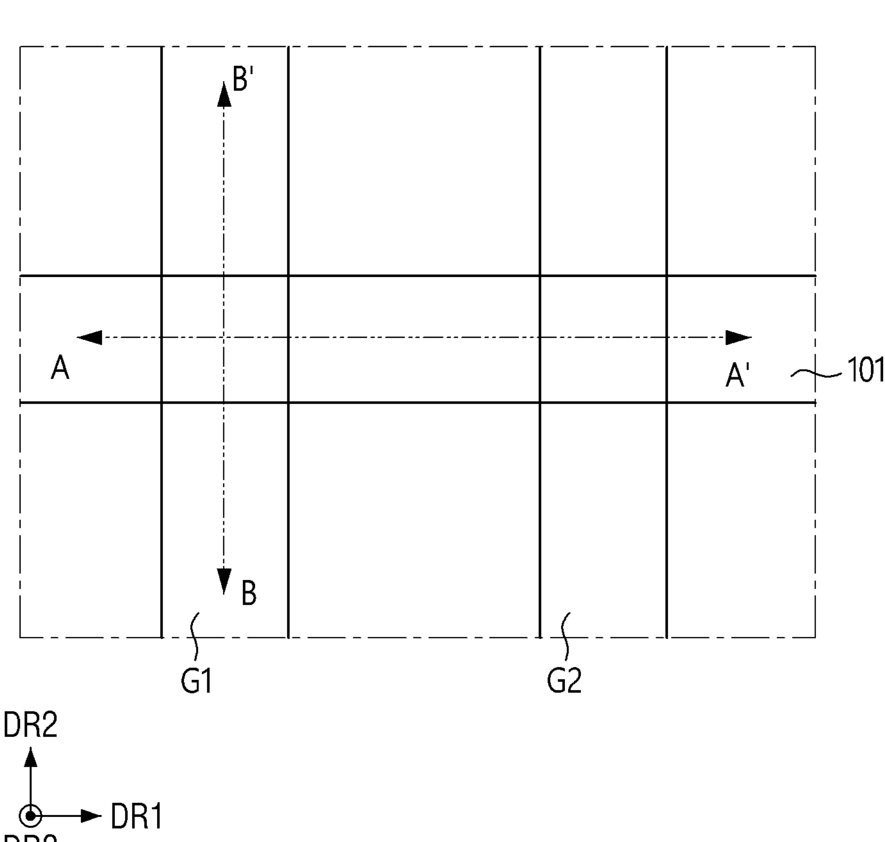
FIG. 1 is a layout view of a semiconductor device according to some embodiments of the present disclosure.
Figure 2:
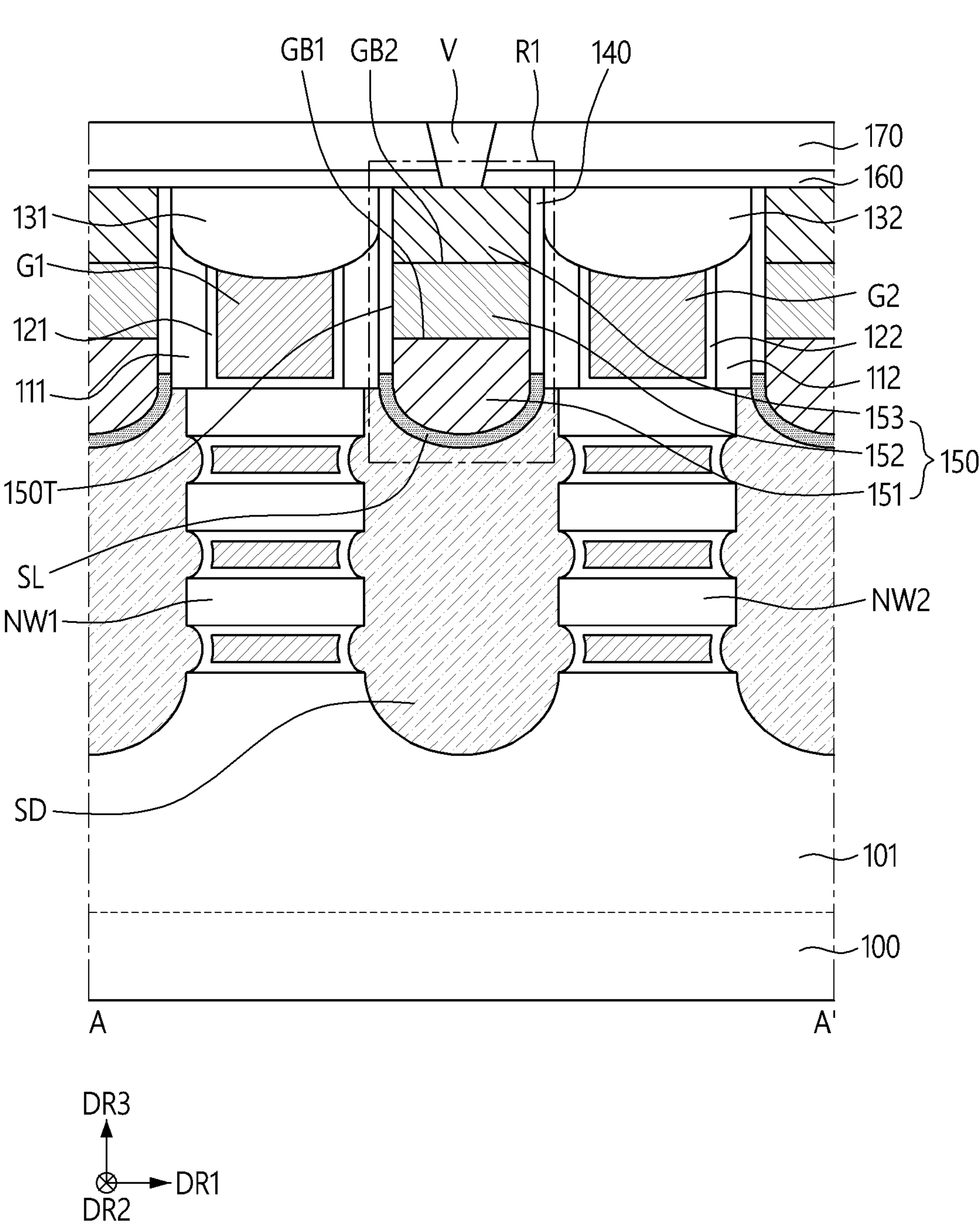
FIG. 2 is a cross-sectional view taken along line A-A' of FIG. 1.
Figure 3:
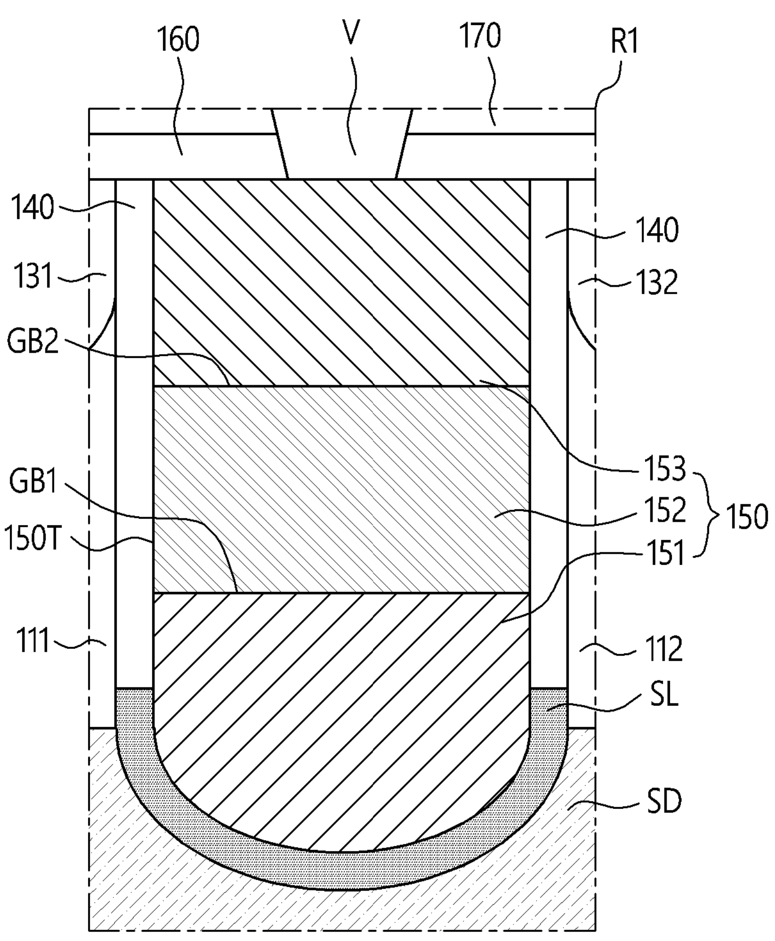
FIG. 3 is an enlarged cross-sectional view of a region R1 of FIG. 2.
Figure 3:
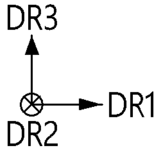
Figure 4:
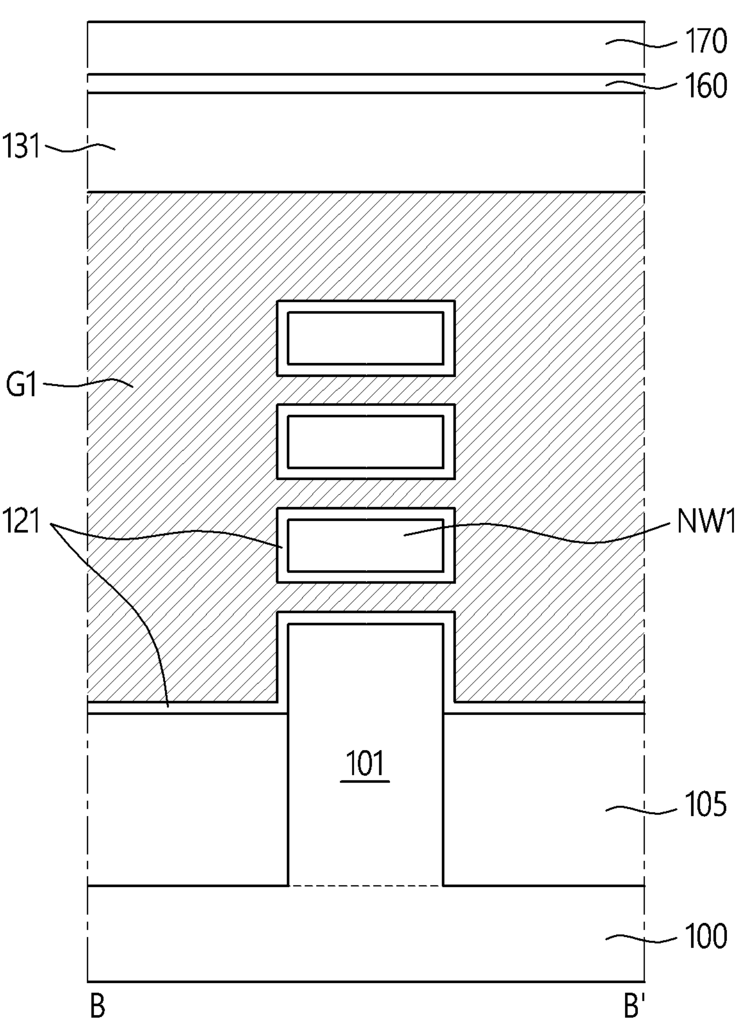
FIG. 4 is a cross-sectional view taken along line B-B' of FIG. 1.
Figure 4:
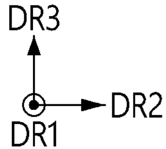

FIG. 1 is a layout view of a semiconductor device according to some embodiments of the present disclosure. FIG. 2 is a cross-sectional view taken along line A-A' of FIG. 1. FIG. 3 is an enlarged cross-sectional view of a region R1 of FIG. 2. FIG. 4 is a cross-sectional view taken along line B-B' of FIG. 1.

Referring to FIGS. 1 through 4, the semiconductor device according to some embodiments of the present disclosure includes a substrate 100, an active pattern 101, a field insulating layer 105, a first plurality of nanosheets NW1, a second plurality of nanosheets NW2, first and second gate electrodes G1 and G2, first gate spacers 111, second gate spacers 112, first and second gate insulating layers 121 and 122, first and second capping patterns 131 and 132, a source/drain region SD, a first etch stopper layer 140, a source/drain contact 150, a silicide layer SL, a second etch stopper layer 160, a second interlayer insulating layer 170, and a via V.

The substrate 100 may be a silicon (Si) substrate or a silicon-on-insulator (SOI) substrate. Alternatively, the substrate 100 may include silicon-germanium (SiGe), silicon-germanium-on insulator (SGOI), indium antimonide, a lead tellurium compound, indium arsenide, indium phosphide, gallium arsenide, or gallium antimonide, but the present disclosure is not limited thereto.

First and second horizontal directions DR1 and DR2 may be defined as directions parallel to the top surface of the substrate 100. The second horizontal direction DR2 may be defined as a direction that is different from the first horizontal direction DR1. A vertical direction DR3 may be defined as a direction perpendicular to the first and second horizontal directions DR1 and DR2. That is, the vertical direction DR3 may be defined as being perpendicular to the top surface of the substrate 100.

The active pattern 101 may extend in the first horizontal direction DR1 on the substrate 100. The active pattern 101 may protrude in the vertical direction DR3 from the top surface of the substrate 100. For example, the active pattern 101 may be a part of the substrate 100 and may include an epitaxial layer grown from the substrate 100.

The field insulating layer 105 may be on the top surface of the substrate 100. The field insulating layer 105 may surround the sidewalls of the active pattern 101. In some embodiments, the top surface of the active pattern 101 may protrude in the vertical direction DR3 above or beyond the top surface of the field insulating layer 105, but the present disclosure is not limited thereto. Alternatively, in some embodiments, the top surface of the active pattern 101 may be formed coplanar with the top surface of the field insulating layer 105. The field insulating layer 105 may include, for example, an oxide film, a nitride film, an oxynitride film, or a combination thereof.

The first plurality of nanosheets NW1 and the second plurality of nanosheets NW2 may be on the active pattern 101. The second plurality of nanosheets NW2 may be spaced apart in the first horizontal direction DR1 from the first plurality of nanosheets NW1. The first plurality of nanosheets NW1 may include a plurality of nanosheets that are stacked on the active pattern 101 and spaced apart in the vertical direction DR3 from one another, and the second plurality of nanosheets NW2 may also include a plurality of nanosheets that are stacked on the active pattern 101 and spaced apart in the vertical direction DR3 from one another.

FIGS. 2 and 4 illustrate that each of the first plurality of nanosheets NW1 and the second plurality of nanosheets NW2 includes three nanosheets stacked in the vertical direction DR3 to be spaced apart from one another, but the present disclosure is not limited thereto. For example, in some embodiments, each of the first plurality of nanosheets NW1 and the second plurality of nanosheets NW2 may include four or more nanosheets stacked in the vertical direction DR3 and spaced apart from one another. The first plurality of nanosheets NW1 and the second plurality of nanosheets NW2 may include Si, but the present disclosure is not limited thereto. In some embodiments, the first plurality of nanosheets NW1 and the second plurality of nanosheets NW2 may include SiGe.

The first gate electrode G1 may extend in the second horizontal direction DR2 on the active pattern 101 and the field insulating layer 105. The first gate electrode G1 may surround the first plurality of nanosheets NW1. The second gate electrode G2 may extend in the second horizontal direction DR2 on the active pattern 101 and the field insulating layer 105. The second gate electrode G2 may be spaced apart from the first gate electrode G1 in the first horizontal direction DR1. The second gate electrode G2 may surround the second plurality of nanosheets NW2.

The first and second gate electrodes G1 and G2 may include at least one of, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC-N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel-platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), or vanadium (V), or a combination of two or more thereof, but the present disclosure is not limited thereto. The first and second gate electrodes G1 and G2 may include a conductive metal oxide or a conductive metal oxynitride and may include oxidized forms of the aforementioned materials.

The first gate spacers 111 may be on the top surface of an uppermost nanosheet of the first plurality of nanosheet NW1 and the field insulating layer 105. The first gate spacers 111 may extend in the second horizontal direction DR2 on both sidewalls, in the first horizontal direction DR1, of the first gate electrode G1. The second gate spacers 112 may be on the top surface of an uppermost nanosheet of the second plurality of nanosheet NW2 and the field insulating layer 105. The second gate spacers 112 may extend in the second horizontal direction DR2 on both sidewalls, in the first horizontal direction DR1, of the second gate electrode G2.

The first gate spacers 111 and the second gate spacers 112 may include at least one of, for example, silicon nitride (SiN), silicon oxynitride (SiON), silicon oxide (SiO2), silicon oxycarbonitride (SiOCN), silicon boron nitride (SiBN), silicon oxyboronitride (SiOBN), or silicon oxycarbide (SiOC), or a combination of two or more thereof, but the present disclosure is not limited thereto.

The source/drain region SD may be on at least one side of each of the first and second gate electrodes G1 and G2, on the active pattern 101. For example, the source/drain region SD may be between the first and second gate electrodes G1 and G2, on the active pattern 101. For example, the source/drain region SD may be in contact with the sidewalls, in the first horizontal direction DR1, of each of the first plurality of nanosheets NW1 and the second plurality of nanosheets NW2.

The first gate insulating layer 121 may be between the first gate electrode G1 and the first gate spacers 111. The first gate insulating layer 121 may be between the first gate electrode G1 and the source/drain region SD. The first gate insulating layer 121 may be between the first gate electrode G1 and the active pattern 101. The first gate insulating layer 121 may be between the first gate electrode G1 and the field insulating layer 105. The first gate insulating layer 121 may be between the first gate electrode G1 and the first plurality of nanosheets NW1.

The second gate insulating layer 122 may be between the second gate electrode G2 and the second gate spacers 112. The second gate insulating layer 122 may be between the second gate electrode G2 and the source/drain region SD. The second gate insulating layer 122 may be between the second gate electrode G2 and the active pattern 101. The second gate insulating layer 122 may be between the second gate electrode G2 and the field insulating layer 105. The second gate insulating layer 122 may be between the second gate electrode G2 and the second plurality of nanosheets NW2.

The first and second gate insulating layers 121 and 122 may be in contact with the source/drain region SD, but the present disclosure is not limited thereto. In some embodiments, inner spacers may be between the source/drain region SD and the first and second gate insulating layers 121 and 122. In this case, the inner spacers may include at least one of, for example, SiN, SiON, SiO2, SiOCN, SiBN, SiOBN, SiOC, and a combination thereof, but the present disclosure is not limited thereto.

The first and second gate insulating layers 121 and 122 may include silicon oxide, silicon oxynitride, silicon nitride, or a high-k material having a greater dielectric constant than silicon oxide. The high-k material may include at least one of, for example, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate, or a combination of two or more thereof.

The semiconductor device according to some embodiments of the present disclosure may include a negative capacitance (NC) FET using a negative capacitor. For example, each of the first and second gate insulating layers 121 and 122 may include a ferroelectric material film having ferroelectric properties and a paraelectric material film having paraelectric properties.

The ferroelectric material film may have a negative capacitance, and the paraelectric material film may have a positive capacitance. For example, if two or more capacitors are connected in series and each has a positive capacitance, the total capacitance of the two or more capacitors may be lower than the capacitance of each of the two or more capacitors. On the contrary, if at least one of the two or more capacitors has negative capacitance, the total capacitance of the two or more capacitors may have a positive value and may be greater than the absolute value of the capacitance of each of the two or more capacitors.

If the ferroelectric material film having a negative capacitance and the paraelectric material film having a positive capacitance are connected in series, the total capacitance of the ferroelectric material film and the paraelectric material film may increase. Accordingly, a transistor having the ferroelectric material film can have a sub-threshold swing (SS) of less than 60 mV/decade at room temperature.

The ferroelectric material film may have ferroelectric properties. The ferroelectric material film may include at least one of, for example, hafnium oxide, hafnium zirconium oxide, barium strontium titanium oxide, barium titanium oxide, or lead zirconium titanium oxide, or a combination of two or more thereof. For example, the hafnium zirconium oxide may be a material obtained by doping hafnium oxide with zirconium (Zr). In another example, the hafnium zirconium oxide may be a compound of hafnium (Hf), Zr, and oxygen (O).

The ferroelectric material film may further include a dopant. For example, the dopant may include at least one of Al, Ti, Nb, lanthanum (La), yttrium (Y), magnesium (Mg), silicon, calcium (Ca), cerium (Ce), dysprosium (Dy), erbium (Er), gadolinium (Gd), germanium, scandium (Sc), strontium (Sr), or tin (Sn), or a combination of two or more thereof. The type of dopant may vary depending on the type of material of the ferroelectric material film.

If the ferroelectric material film includes hafnium oxide, the dopant of the ferroelectric material film may include at least one of, for example, Gd, Si, Zr, Al, or Y.

If the dopant of the ferroelectric material film is Al, the ferroelectric material film may include 3 atomic % (at %) to 8 at % of Al. Here, the ratio of the dopant in the ferroelectric material film may refer to the ratio of the sum of the amounts of Hf and Al to the amount of Al in the ferroelectric material film.

If the dopant of the ferroelectric material film is Si, the ferroelectric material film may include 2 at % to 10 at % of Si. If the dopant of the ferroelectric material film is Y, the ferroelectric material film may include 2 at % to 10 at % of Y. If the dopant of the ferroelectric material film is Gd, the ferroelectric material film may include 1 at % to 7 at % of Gd. If the dopant of the ferroelectric material film is Zr, the ferroelectric material film may include 50 at % to 80 at % of Zr.

The paraelectric material film may include paraelectric properties. The paraelectric material film may include at least one of, for example, silicon oxide and a high-k metal oxide. The high-k metal oxide may include at least one of, for example, hafnium oxide, zirconium oxide, or aluminum oxide, but the present disclosure is not limited thereto.

The ferroelectric material film and the paraelectric material film may include the same material. The ferroelectric material film may have ferroelectric properties, but the paraelectric material film may not have ferroelectric properties. For example, if the ferroelectric material film and the paraelectric material film include hafnium oxide, the hafnium oxide included in the ferroelectric material film may have a different crystalline structure from the hafnium oxide included in the paraelectric material film.

The ferroelectric material film may be thick enough to exhibit ferroelectric properties. The ferroelectric material film may have a thickness of, for example, 0.5 nm to 10 nm, but the present disclosure is not limited thereto. A critical thickness that can exhibit ferroelectric properties may vary depending on the type of ferroelectric material, and thus, the thickness of the ferroelectric material film may vary depending on the type of ferroelectric material included in the ferroelectric material film.

For example, each of the first and second gate insulating layers 121 and 122 may include one ferroelectric material film. In another example, each of the first and second gate insulating layers 121 and 122 may include a plurality of ferroelectric material films that are spaced apart from one another. Each of the first and second gate insulating layers 121 and 122 may have a structure in which a plurality of ferroelectric material films and a plurality of paraelectric material films are stacked alternately.

The first capping pattern 131 may extend in the second horizontal direction DR2 on the top surface of the first gate electrode G1, the uppermost surface of the first gate insulating layer 121, and the top surface of the first gate spacers 111. The second capping pattern 132 may extend in the second horizontal direction DR2 on the top surface of the second gate electrode G2, the uppermost surface of the second gate insulating layer 122, and the top surfaces of the second gate spacers 112.

For example, the first capping pattern 131 may be in contact with the uppermost surfaces of the first gate spacers 111, and the second capping pattern 132 may be in contact with the uppermost surfaces of the second gate spacers 112. However, the present disclosure is not limited to this example. In some embodiments, the first capping pattern 131 may be between the first gate spacers 111, and the second capping pattern 132 may be between the second gate spacers 112. The first and second capping patterns 131 and 132 may include at least one of, for example, SiN, SiON, SiO2, silicon carbonitride (SiCN), SiOCN, or a combination of two or more thereof, but the present disclosure is not limited thereto.

The first etch stopper layer 140 may be on the sidewalls of each of the first gate spacers 111, the second gate spacers 112, the first capping pattern 131, and the second capping pattern 132. Although not specifically depicted, the first etch stopper layer 140 may be on the sidewalls, in the second horizontal direction DR2, of the source/drain region SD and on the field insulating layer 105. For example, the first etch stopper layer 140 may be formed so as to conform to a surface upon which the first etch stopper layer 140 is arranged. For example, the uppermost surface of the first etch stopper layer 140 may be formed to be coplanar with the top surfaces of the first and second capping patterns 131 and 132, but the present disclosure is not limited thereto. The first etch stopper layer 140 may include at least one of, for example, aluminum oxide, aluminum nitride, hafnium oxide, zirconium oxide, silicon oxide, silicon nitride, silicon oxynitride, or a low-k material, or a combination of two or more thereof.

Although not specifically depicted in FIGS. 2 and 4, a first interlayer insulating layer (reference numeral "30" of FIG. 13) may be on the first etch stopper layer 140. For example, the first interlayer insulating layer 30 may cover the source/drain regions, on the first etch stopper layer 140. That is, the first etch stopper layer 140 may be between the first interlayer insulating layer 30 and the source/drain region SD. For example, the top surface of the first interlayer insulating layer 30 may be formed to be coplanar with the top surfaces of the first and second capping patterns 131 and 132, but the present disclosure is not limited thereto. In some embodiments, the first interlayer insulating layer 30 may cover the top surfaces of the first and second capping patterns 131 and 132.

The first interlayer insulating layer 30 may include at least one of, for example, silicon oxide, silicon nitride, silicon oxynitride, and a low-k material. The low-k material may include, for example, fluorinated tetraethyl orthosilicate (FTEOS), hydrogen silsesquioxane (HSQ), bis-benzocyclobutene (BCB), tetramethyl orthosilicate (TMOS), octamethylcyclotetrasiloxane (OMCTS), hexamethyldisiloxane (HMDS), trimethylsilyl borate (TMSB), diacetoxyditertiarybutosiloxane (DADBS), trimethylsilyl phosphate (TMSP), polytetrafluoroethylene (PTFE), TOSZ, fluoride silicate glass (FSG), polyimide nanofoam (such as polypropylene oxide), carbon doped silicon oxide (CDO), organo silicate glass (OSG), SILK, amorphous fluorinated carbon, silica aerogel, silica xerogel, mesoporous silica, or a combination of two or more thereof, but the present disclosure is not limited thereto.

A contact trench 150T may be formed between the first and second gate electrodes G1 and G2. For example, the contact trench 150T may be formed between the first gate spacers 111 and the second gate spacers 112. For example, the contact trench 150T may extend into the source/drain region SD. For example, the sidewalls of the contact trench 150T may be defined by the sidewalls of the first gate spacers 111 and the sidewalls of the second gate spacers 112.

The source/drain contact 150 may be in the contact trench 150T. That is, the source/drain contact 150 may be formed between the first and second gate electrodes G1 and G2. For example, the source/drain contact 150 may be in contact with the first gate spacers 111 and the second gate spacers 112. The source/drain contact 150 may be connected to the source/drain region SD.

For example, the source/drain contact 150 may include first, second, and third layers 151, 152, and 153, which may be sequentially stacked in the vertical direction DR3. For example, the first layer 151 may be defined as the lowermost or bottommost layer of the source/drain contact 150. The second layer 152 may be on the top surface of the first layer 151. The second layer 152 may be in contact with the top surface of the first layer 151. The third layer 153 may be on the top surface of the second layer 152. The third layer 153 may be in contact with the top surface of the second layer 152. For example, the third layer 153 may be defined as the uppermost or topmost layer of the source/drain contact 150.

For example, the sidewalls in the first horizontal direction DR1 of each of the first, second, and third layers 151, 152, and 153 may be in contact with the first etch stopper layer 140. For example, first and second sidewalls opposing each other in the first horizontal direction DR1 of each of the first, second, and third layers 151, 152, and 153 may be in contact with the first etch stopper layer 140. For example, the sidewalls, in the first horizontal direction DR1, of each of the first, second, and third layers 151, 152, and 153 may have a continuous inclined profile. For example, the top surface of the third layer 153 may be formed on the same plane as the top surfaces of the first and second capping patterns 131 and 132, but the present disclosure is not limited thereto. In some embodiments, the top surface of the third layer 153 may be formed on the same plane as the uppermost surface of the first etch stopper layer 140.

In some embodiments, the first, second, and third layers 151, 152, and 153 may include the same metal. For example, the first, second, and third layers 151, 152, and 153 may include one of W, Mo, and Ru. That is, in some embodiments, the first, second, and third layers 151, 152, and 153 may include W. In other embodiments, the first, second, and third layers 151, 152, and 153 may include Mo. In still other embodiments, the first, second, and third layers 151, 152, and 153 may include Ru. Each of the first, second, and third layers 151, 152, and 153 may include one of W, Mo, and Ru alone. In other words, each of the first, second, and third layers 151, 152, and 153 may include either W, Mo, or Ru without any other impurities.

The first layer 151 may have a first crystal orientation, the second layer 152 may include a second crystal orientation, which may be different from the first crystal orientation, and the third layer 153 may have a third crystal orientation, which may be different from the second crystal orientation. For example, the first, second, and third crystal orientations may all differ from one another, but the present disclosure is not limited thereto. Alternatively, in some embodiments, the first and third crystal orientations may be the same.

For example, the source/drain contact 150 may have a first grain boundary GB1, which may be formed at the interface between the first and second layers 151 and 152. As the first and second layers 151 and 152 are formed to have different crystal orientations, the first grain boundary GB1 may be formed at the interface between the first and second layers 151 and 152. For example, the first grain boundary GB1 may be formed to be parallel to the top surface of the substrate 100, but the present disclosure is not limited thereto. The first grain boundary GB1 may be formed to be higher than the top surfaces of the uppermost nanosheets of the first and second plurality of nanosheets NW1 and NW2.

For example, the source/drain contact 150 may further include a second grain boundary GB2, which may be formed at the interface between the second and third layers 152 and 153. As the second and third layers 152 and 153 are formed to have different crystal orientations, the second grain boundary GB2 may be formed at the interface between the second and third layers 152 and 153. For example, the second grain boundary GB2 may be formed to be parallel to the top surface of the substrate 100, but the present disclosure is not limited thereto.

FIGS. 2 and 3 illustrate that the source/drain contact 150 includes three layers that are sequentially stacked in the vertical direction DR3, but the present disclosure is not limited thereto. For example, in some embodiments, the source/drain contact 150 may include four layers that are sequentially stacked in the vertical direction DR3.

The silicide layer SL may be between the source/drain contact 150 and the source/drain region SD. For example, the silicide layer SL may be between the first layer 151 and the source/drain region SD. The silicide layer SL may be arranged along the interface between the first layer 151 and the source/drain region SD. For example, at least part of the silicide layer SL may be between the first layer 151 and each of the first gate spacers 111 and the second gate spacers 112. The silicide layer SL may include, for example, a metal silicide material.

The second etch stopper layer 160 may be on the top surfaces of the first and second capping patterns 131 and 132, the top surface of the source/drain contact 150, and the uppermost surface of the first etch stopper layer 140. FIGS. 2 and 4 illustrate that the second etch stopper layer 160 is formed as a single film, but the present disclosure is not limited thereto. In some embodiments, the second etch stopper layer 160 may be formed as a multifilm. The second etch stopper layer 160 may include at least one of, for example, aluminum oxide, aluminum nitride, hafnium oxide, zirconium oxide, silicon oxide, silicon nitride, silicon oxynitride, or a low-k material, or a combination of two or more thereof.

The second interlayer insulating layer 170 may be on the second etch stopper layer 160. The second interlayer insulating layer 170 may include at least one of, for example, silicon oxide, silicon nitride, silicon oxynitride, or a low-k material, or a combination of two or more thereof. The via V may penetrate or extend through the second interlayer insulating layer 170 and the second etch stopper layer 160 in the vertical direction DR3 and may thereby be connected to the source/drain contact 150. FIG. 2 illustrates that the via V is formed as a single film, but the present disclosure is not limited thereto. In some embodiments, the via V may be formed as a multifilm. The via V may include a conductive material.

A method of fabricating a semiconductor device according to some embodiments of the present disclosure will hereinafter be described with reference to FIGS. 2 through 26.

FIGS. 5 through 26 are cross-sectional views illustrating intermediate steps of a method of fabricating a semiconductor device according to some embodiments of the present disclosure.

Figure 5:
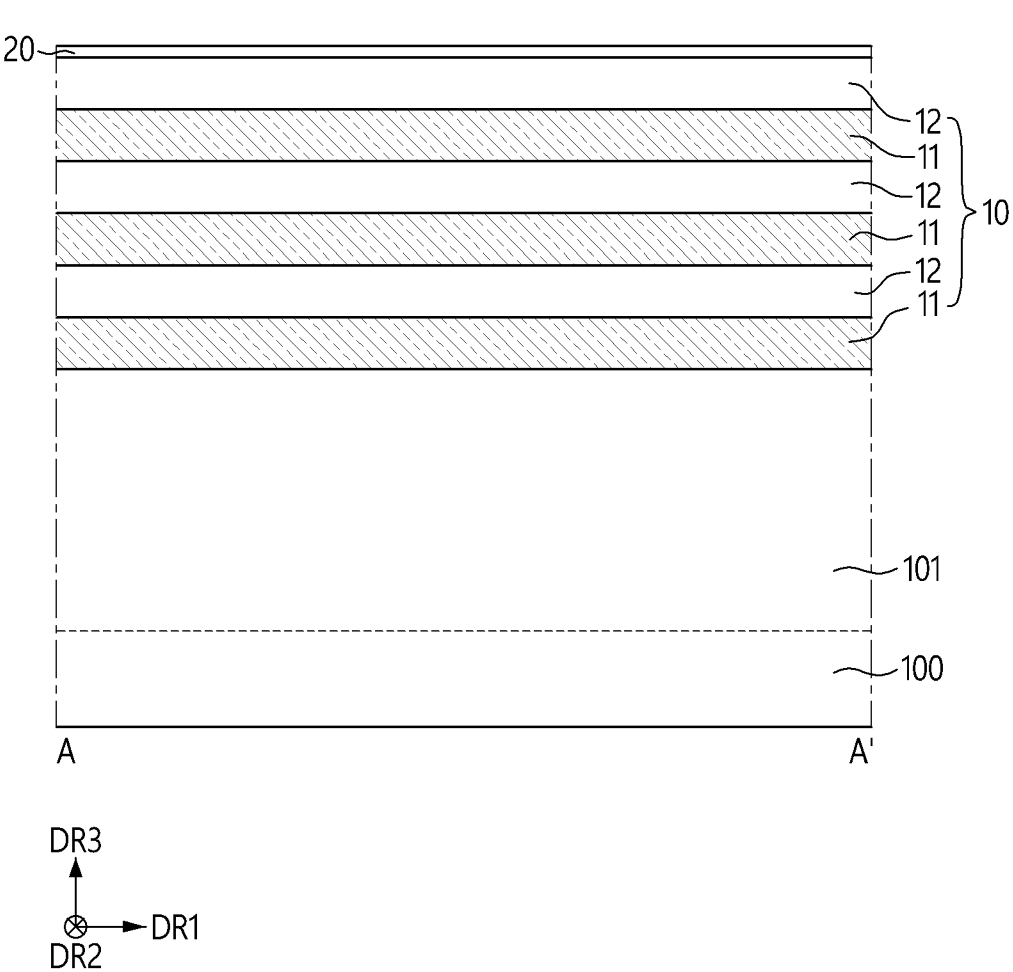
FIGS. 5 through 26 are cross-sectional views illustrating intermediate steps of a method of fabricating a semiconductor device according to some embodiments of the present disclosure.
Figure 6:
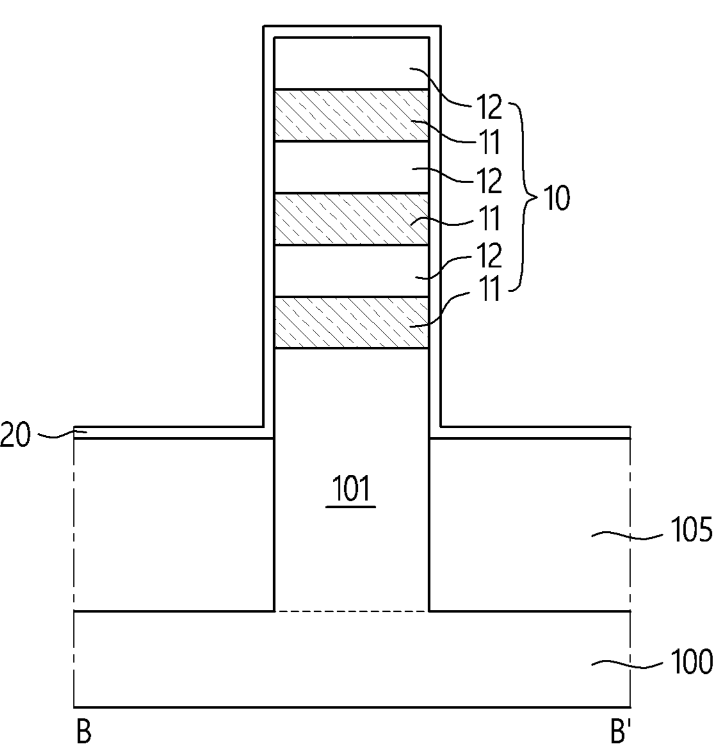
Figure 6:
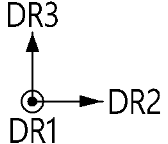

Referring to FIGS. 5 and 6, a stack structure 10 may include first semiconductor layers 11 and second semiconductor layers 12, which may be alternately stacked on the substrate 100. For example, a first semiconductor layer 11 may be formed as the lowermost layer of the stack structure 10, and a second semiconductor layer 12 may be formed as the uppermost layer of the stack structure 10. However, the present disclosure is not limited to this example. In some embodiments, a first semiconductor layer 11 may also be formed as the uppermost layer of the stack structure 10. The first semiconductor layers 11 may include, for example, SiGe. The second semiconductor layers 12 may include, for example, Si.

Thereafter, part of the stack structure 10 may be etched. When the stack structure 10 is being etched, part of the substrate 100 may also be etched. As a result, an active pattern 101 may be defined below the stack structure 10, on the top surface of the substrate 100. The active pattern 101 may extend in a first horizontal direction DR1. Thereafter, a field insulating layer 105 may be formed on the top surface of the substrate 100. The field insulating layer 105 may surround the sidewalls of the active pattern 101. For example, the top surface of the active pattern 101 may be formed to be higher than the top surface of the field insulating layer 105.

Thereafter, a pad oxide layer 20 may be formed to cover the top surface of the field insulating layer 105, the exposed sidewalls of the active pattern 101, and the sidewalls and top surface of the stack structure 10. For example, the pad oxide layer 20 may be formed to conform to the surfaces thereunder. The pad oxide layer 20 may include, for example, SiO2.

Figure 7:
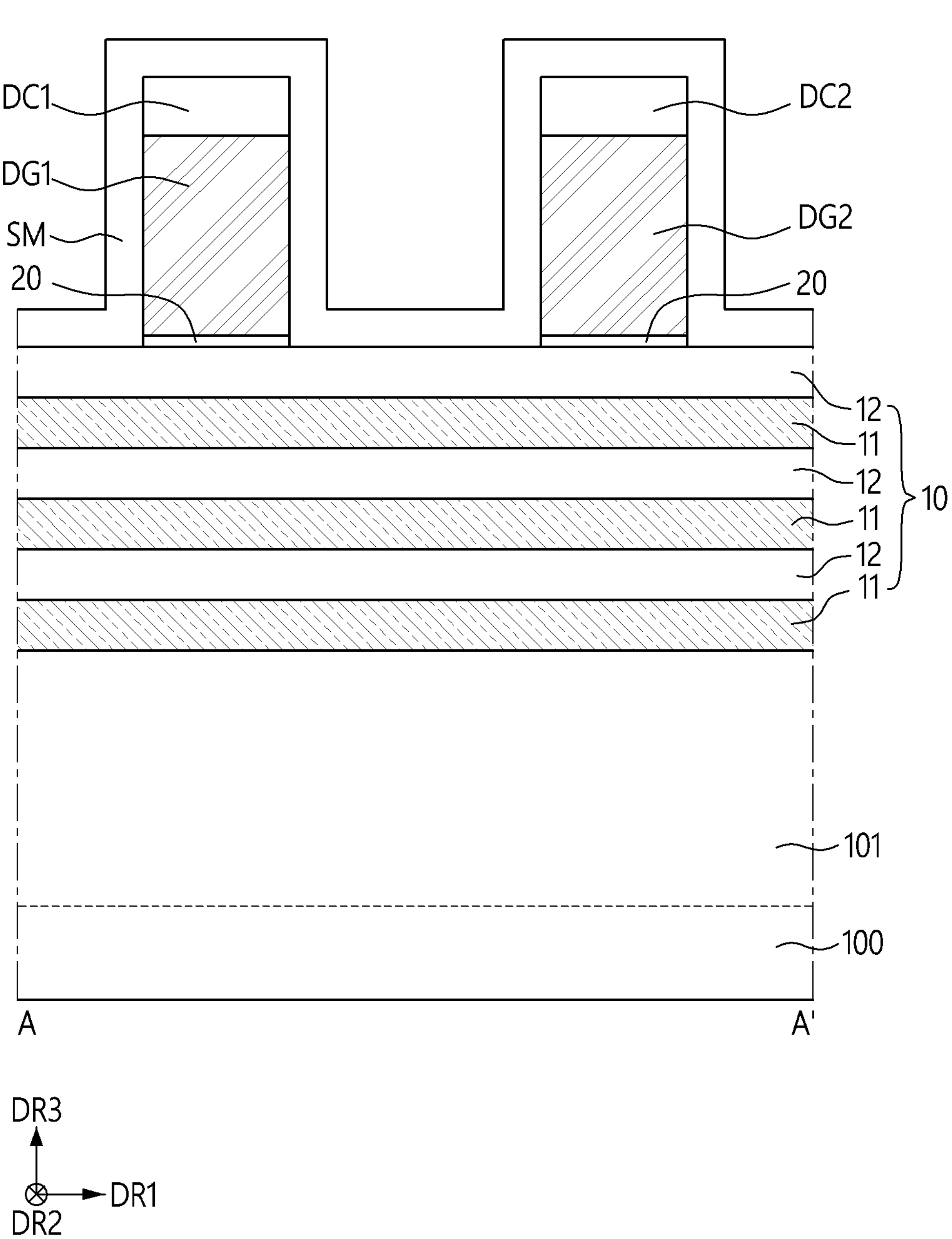
Figure 8:
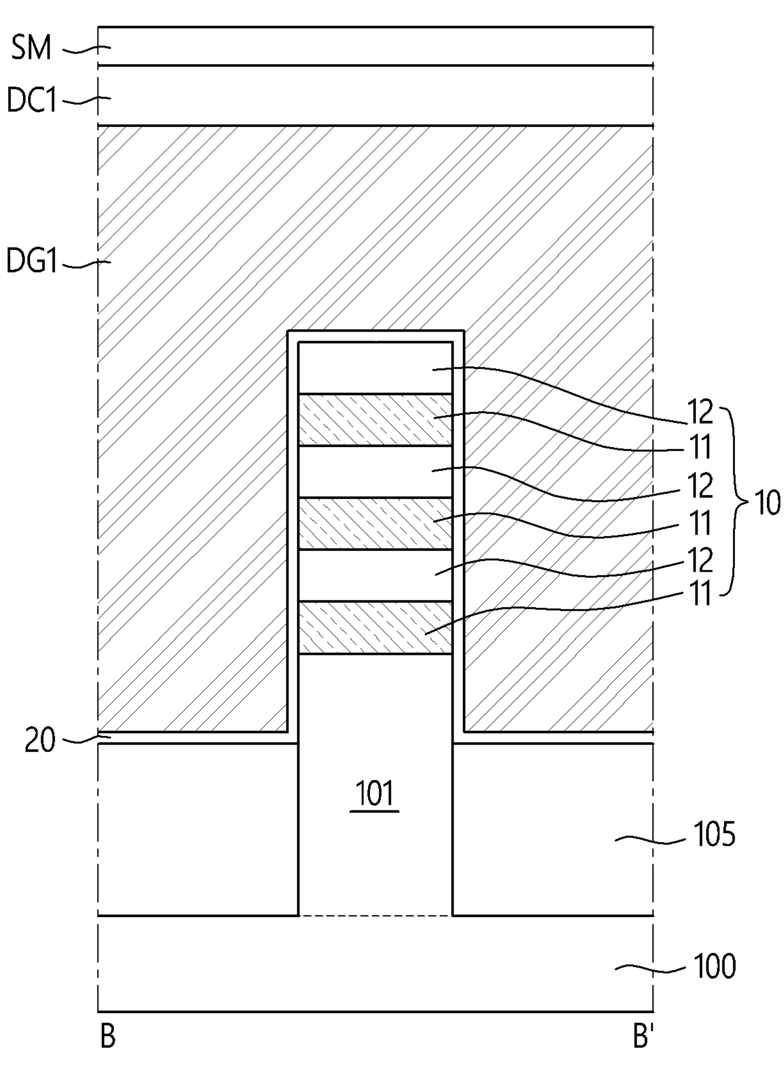
Figure 8:
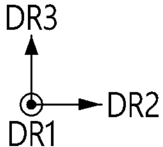

Referring to FIGS. 7 and 8, first and second dummy gates DG1 and DG2, which may extend in a second horizontal direction DR2 on the pad oxide layer 20, and first and second dummy capping patterns DC1 and DC2 may be formed on the stack structure 10 and the field insulating layer 105. The first dummy capping pattern DC1 may be formed on the first dummy gate DG1. The second dummy capping pattern DC2 may be formed on the second dummy gate DG2. The second dummy gate DG2 and the second dummy capping pattern DC2 may be spaced apart in the first horizontal direction DR1 from the first dummy gate DG1 and the first dummy capping pattern DC1.

During the formation of the first and second dummy gates DG1 and DG2 and the first and second dummy capping patterns DC1 and DC2, the entire pad oxide layer 20 except for parts that overlap with or are overlapped by the first and second dummy gates DG1 and DG2 in a vertical direction DR3 on the substrate 100 may be removed.

Thereafter, a spacer material layer SM may be formed to cover the sidewalls of each of the first and second dummy gates DG1 and DG2, the sidewalls and top surface of each of the first and second dummy capping patterns DC1 and DC2, and the exposed sidewalls and the top surface of the stack structure 10, and the top surface of the field insulating layer 105. For example, the spacer material layer SM may be conformally formed. The spacer material layer SM may include at least one of, for example, SiN, SiOCN, SiBCN, SiCN, SiON, or a combination of two or more thereof.

Figure 9:
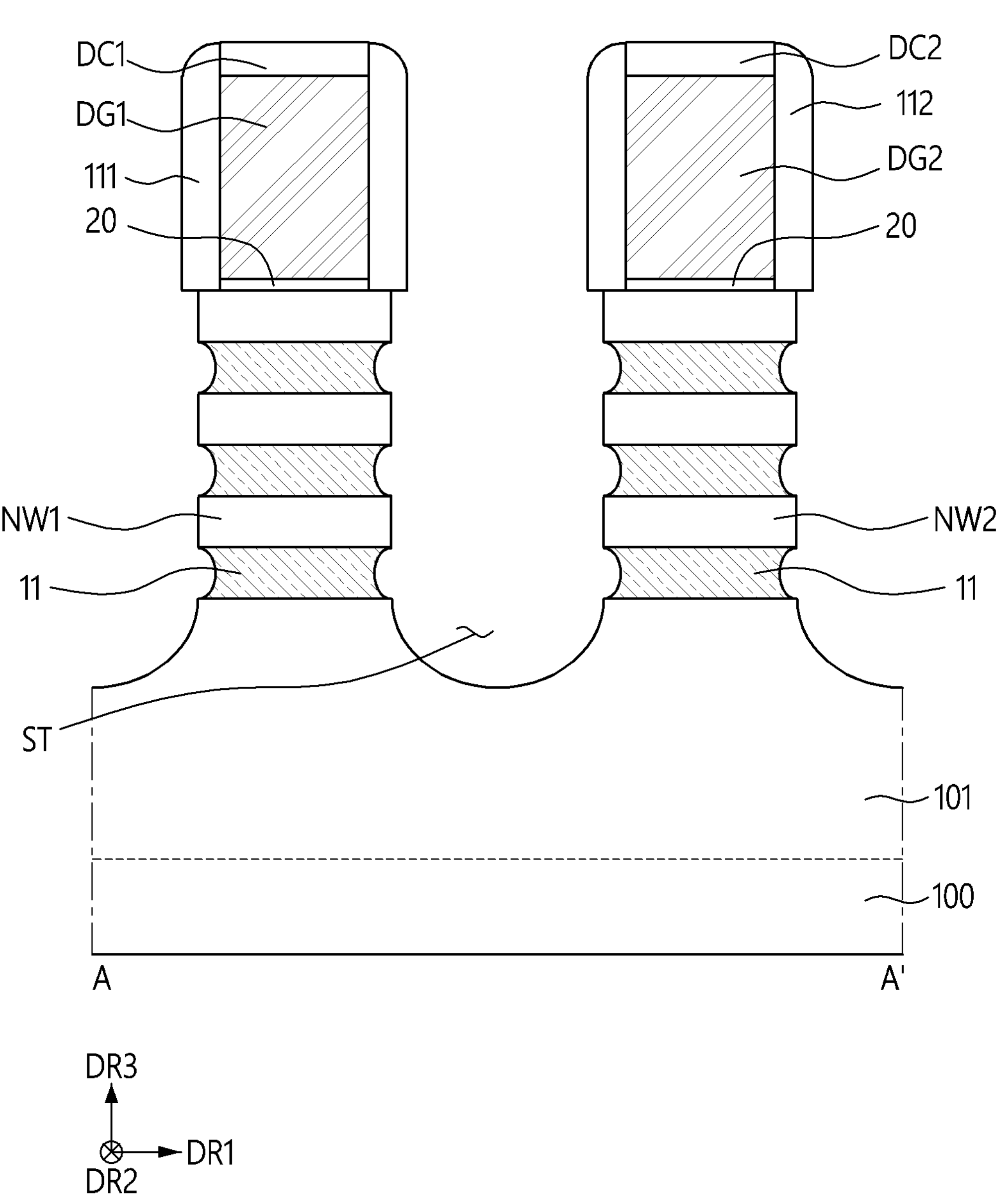

Referring to FIG. 9, a source/drain trench ST may be formed by etching the stack structure 10 using the first and second dummy capping patterns DC1 and DC2 and the first and second dummy gates DG1 and DG2 as a mask. For example, the source/drain trench ST may extend into the active pattern 101.

During the formation of the source/drain trench ST, parts of the first and second dummy capping patterns DC1 and DC2 and parts of the spacer material layer SM on the top surfaces of the first and second dummy capping patterns DC1 and DC2 may be removed. Parts of the spacer material layer SM that remain on the first dummy capping pattern DC1 and the sidewalls of the first dummy gate DG1 may be defined as first gate spacers 111. Also, parts of the spacer material layer SM that remain on the second dummy capping pattern DC2 and the sidewalls of the second dummy gate DG2 may be defined as second gate spacers 112.

After the formation of the source/drain trench ST, the second semiconductor layers 12 that remain below the first dummy gate DG1 may be defined as a first plurality of nanosheets NW1, and the second semiconductor layers 12 that remain below the second dummy gate DG2 may be defined as a second plurality of nanosheets NW2. For example, during the formation of the source/drain trench ST, the first semiconductor layers 11 may be etched to a larger extent than the second semiconductor layers 12. As a result, the sidewalls of each of the first semiconductor layers 11 may become recessed into the sidewalls of each of the first plurality of nanosheets NW1 and the second plurality of nanosheets NW2.

Figure 10:
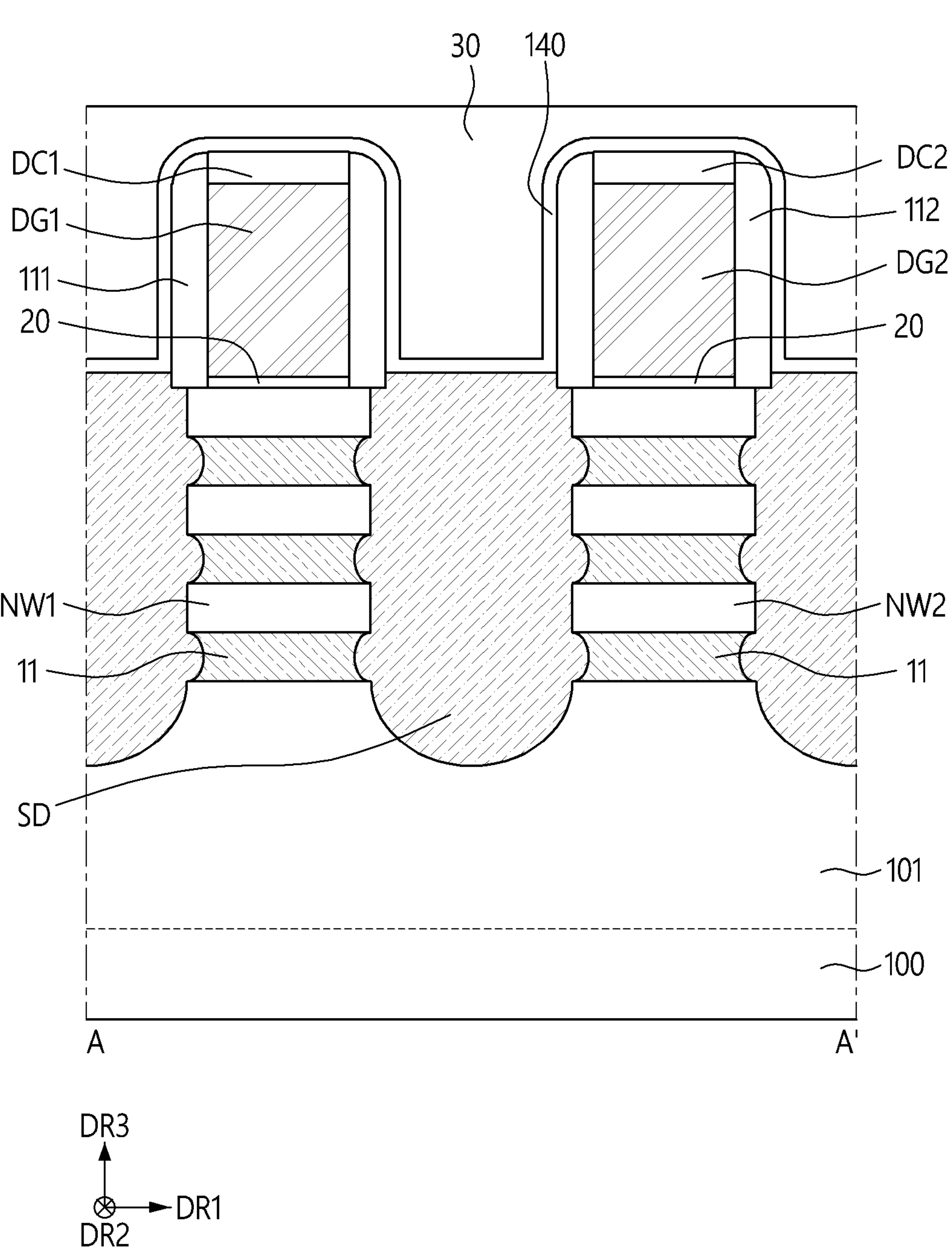

Referring to FIG. 10, a source/drain region SD may be formed in the source/drain trench ST. For example, the top surface of the source/drain region SD may be formed to be higher than the top surfaces of the uppermost nanosheets of the first and second plurality of nanosheets NW1 and NW2.

Thereafter, a first etch stopper layer 140 may be formed on the exposed surface of the source/drain region SD, the exposed surfaces of the first gate spacers 111 and the second gate spacers 112, and the top surfaces of the first and second capping patterns 131 and 132. Although not specifically depicted, the first etch stopper layer 140 may be formed on the top surface of the field insulating layer 105. For example, the first etch stopper layer 140 may be conformally formed. Thereafter, a first interlayer insulating layer 30 may be formed on the first etch stopper layer 140.

Figure 11:
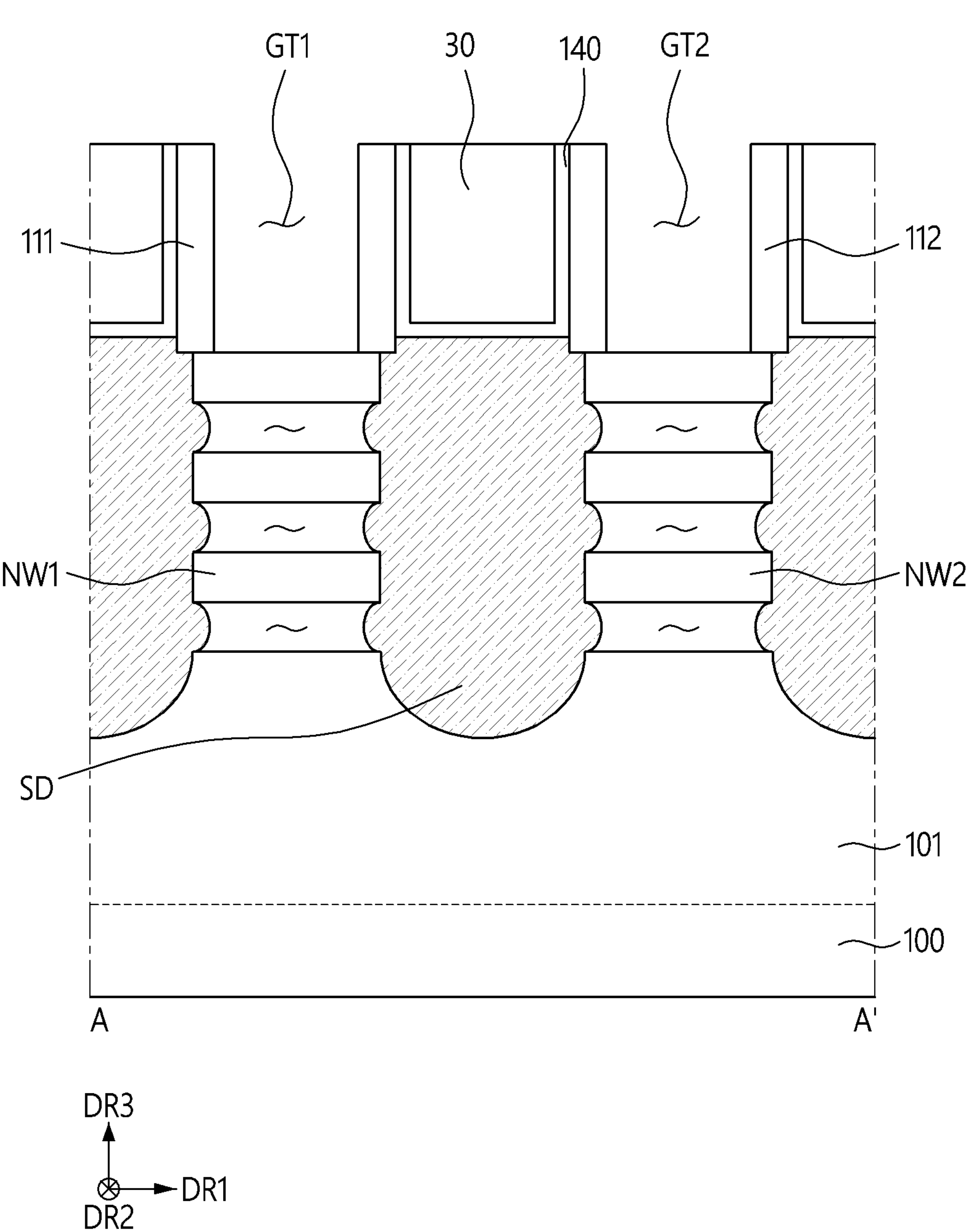
Figure 12:
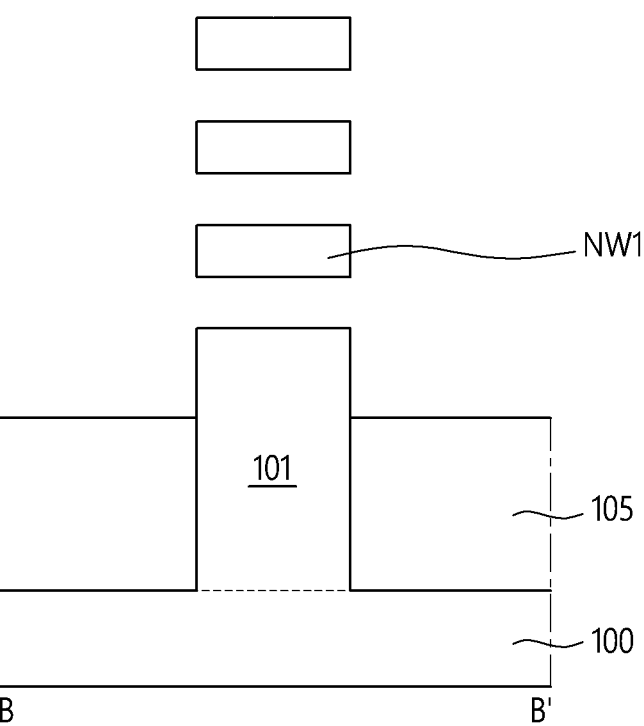
Figure 12:
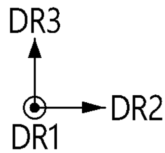

Referring to FIGS. 11 and 12 the top surfaces of the first and second dummy gates DG1 and DG2 may be exposed by a planarization process. Thereafter, the first and second dummy gates DG1 and DG2, the pad oxide layer 20, and the first semiconductor layers 11 may be etched.

The region where the first dummy gate DG1 has been etched away may be defined as a first gate trench GT1, and the region where the second dummy gate DG2 has been etched away may be defined as a second gate trench GT2.

Figure 13:
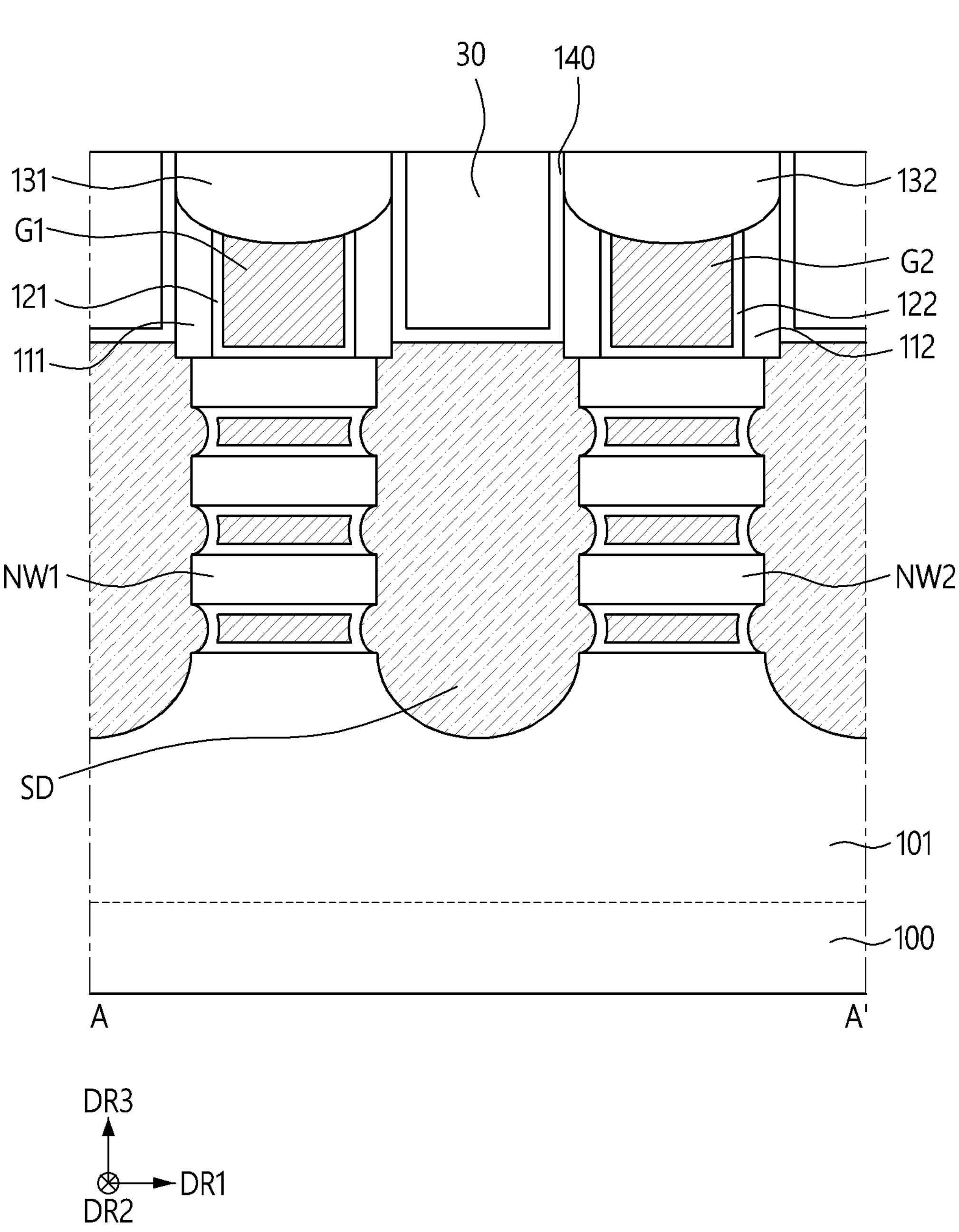
Figure 14:
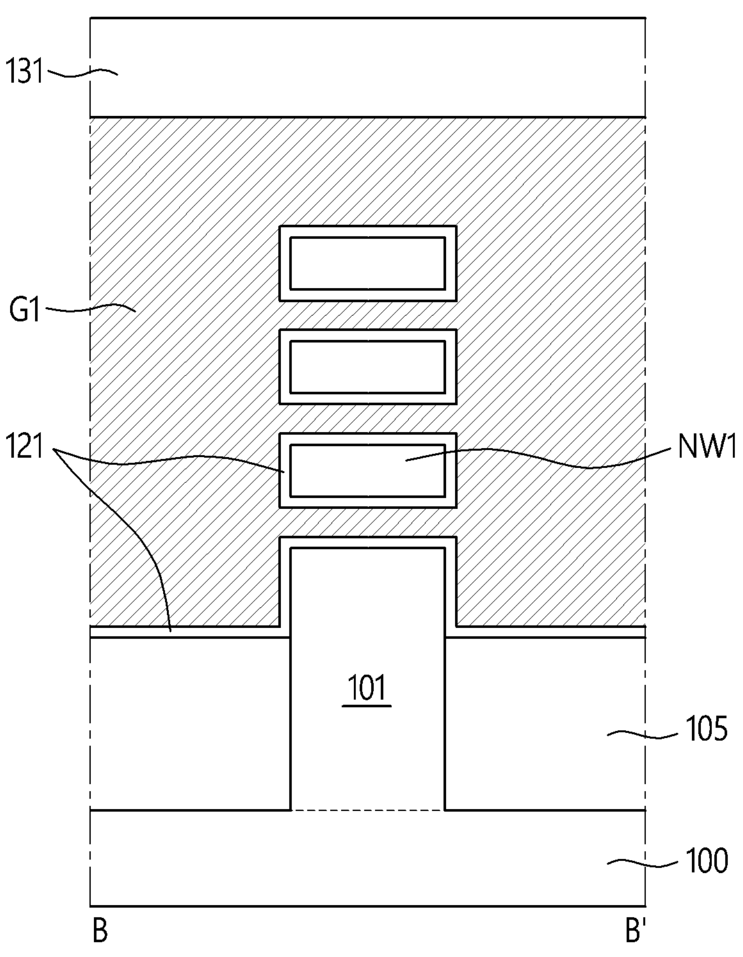
Figure 14:
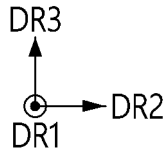

Referring to FIGS. 13 and 14, a first gate insulating layer 121, a first gate electrode G1, and a first capping pattern 131 may be sequentially formed in the regions where the first dummy gate DG1, the pad oxide layer 20, and the first semiconductor layers 11 have been etched away. Also, a second gate insulating layer 122, a second gate electrode G2, and a second capping pattern 132 may be sequentially formed in the regions where the second gate insulating layer 122, the second dummy gate DG2, the pad oxide layer 20, and the first semiconductor layers 11 have been etched away.

Figure 15:
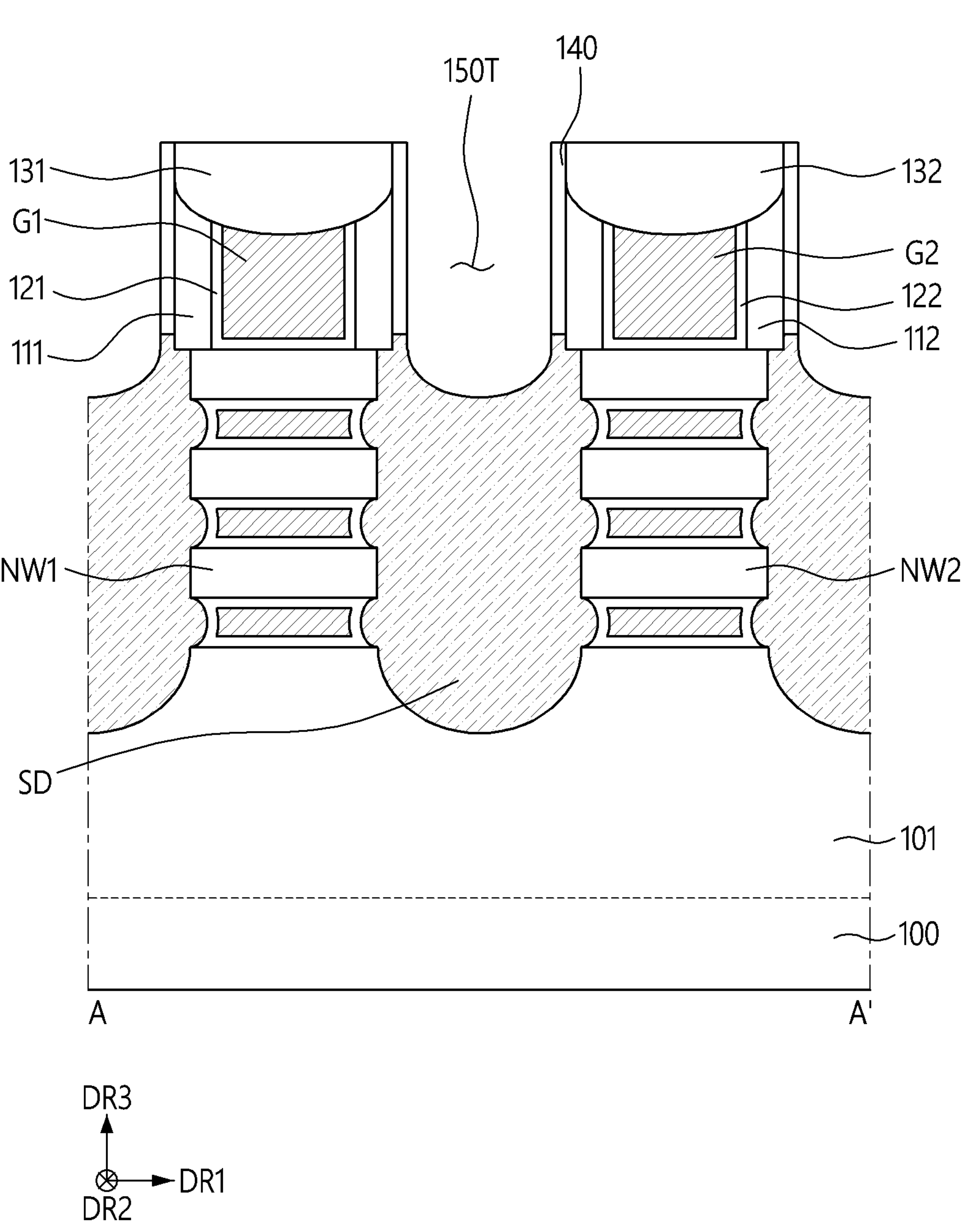

Referring to FIG. 15, a contact trench 150T, which may penetrate or extend at least into parts of the first etch stopper layer 140 and the first interlayer insulating layer 30 on the top surface of the source/drain region SD in the vertical direction DR3, may be formed between the first gate spacers 111 and the second gate spacers 112. The contact trench 150T may extend into the source/drain region SD. After the formation of the contact trench 150T, the first etch stopper layer 140 may be exposed on the sidewalls of each of the first gate spacers 111 and the second gate spacers 112. Also, after the formation of the contact trench 150T, an upper part of the source/drain region SD may be exposed.

Figure 16:
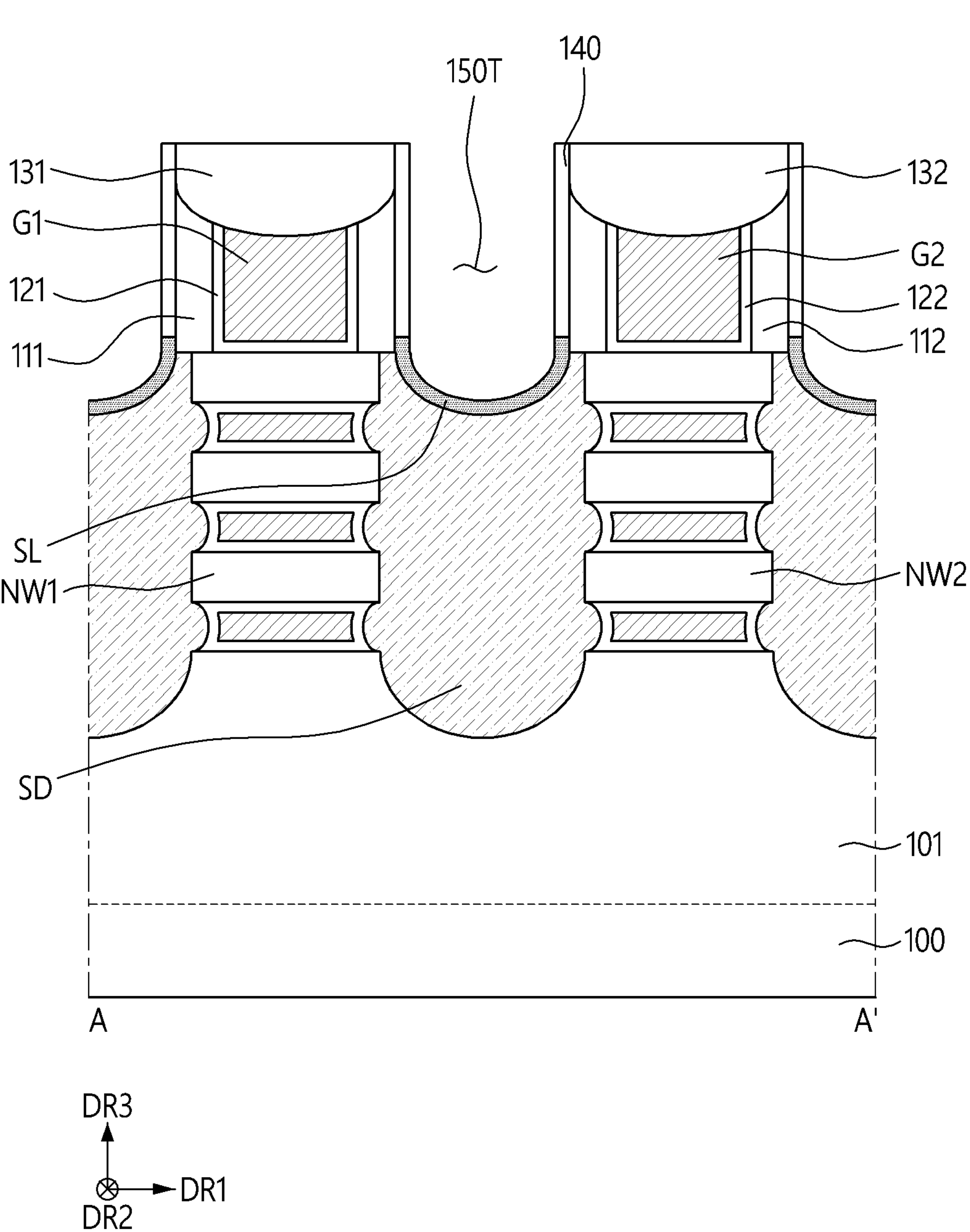

Referring to FIG. 16, the exposed upper part of the source/drain region SD may be partially transformed into a silicide, thereby forming a silicide layer SL.

Figure 17:
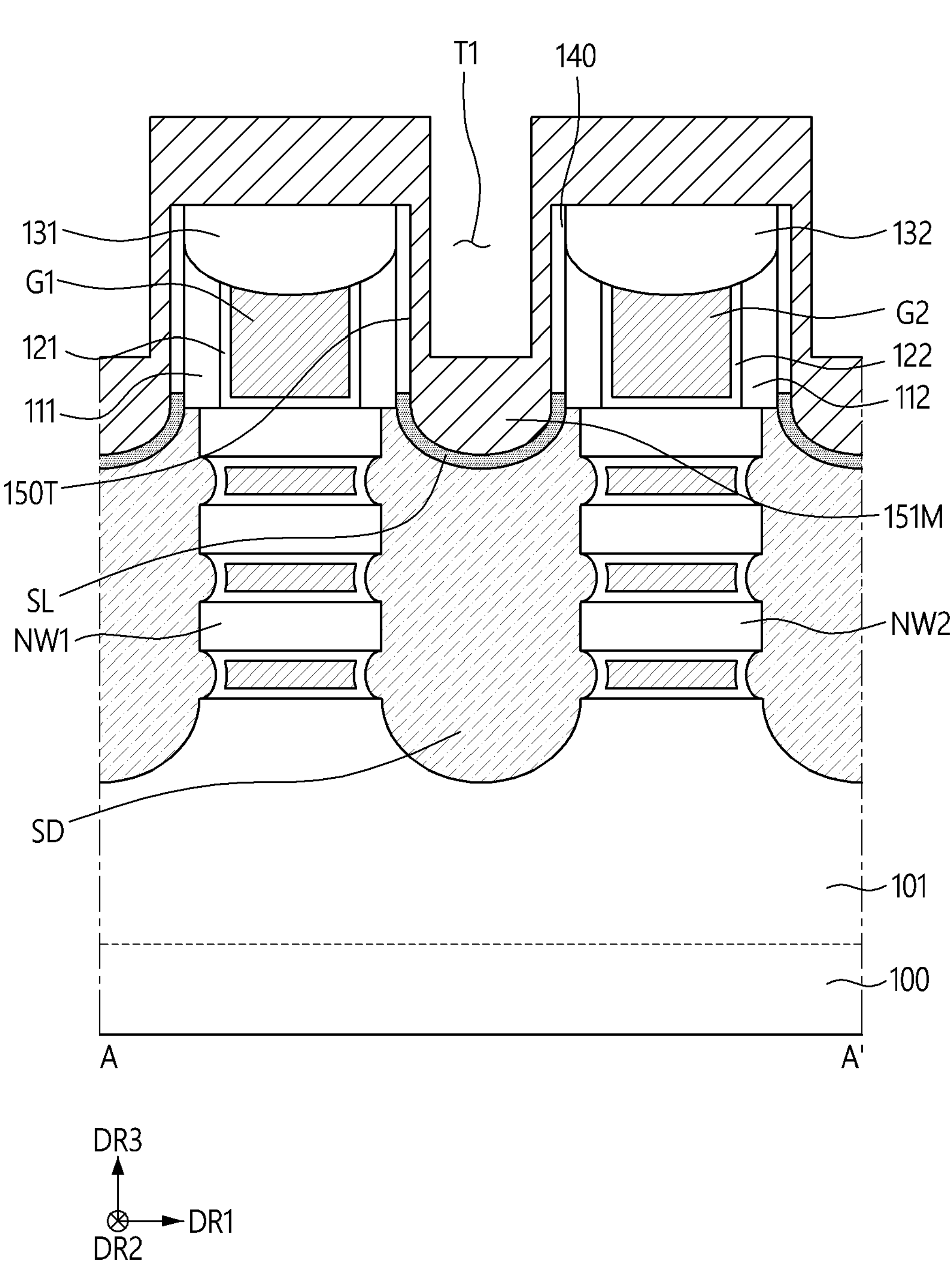

Referring to FIG. 17, a first contact material layer 151M may be formed on the sidewalls and bottom surface of the contact trench 150T. The first contact material layer 151M may also be formed on the top surfaces of the first and second capping patterns 131 and 132. For example, the first contact material layer 151M may be formed by a physical vapor deposition (PVD) process.

For example, the thickness of the first contact material layer 151M on the bottom surface of the contact trench 150T and the top surfaces of the first and second capping patterns 131 and 132, measured in the vertical direction DR3, may be greater than the thickness of the first contact material layer 151M on the sidewalls of the contact trench 150T, measured in the first horizontal direction DR1. For example, the first contact material layer 151M may include one of W, Mo, and Ru. After the formation of the first contact material layer 151M, a first trench T1 may be defined in the contact trench 150T by the first contact material layer 151M.

Figure 18:
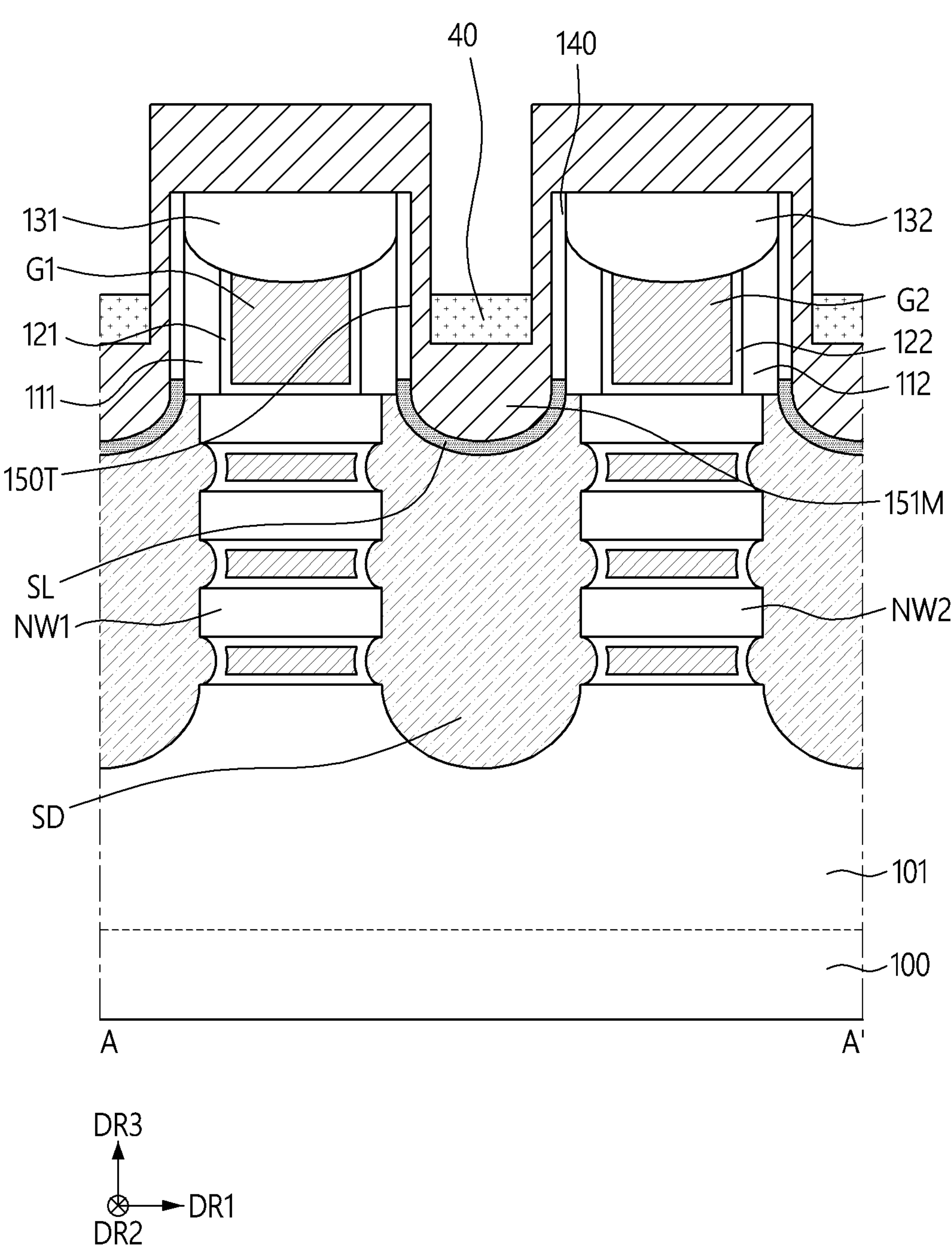

Referring to FIG. 18, a first sacrificial layer 40 may be formed in the first trench T1. For example, the first sacrificial layer 40 may be formed to partially fill the first trench T1. In another example, the first sacrificial layer 40 may be initially formed to completely fill the first trench T1 and then subsequently etched back to partially fill the first trench T1. For example, the first sacrificial layer 40 may include a carbon compound-based spin-on-hardmask (SOH) material.

Figure 19:
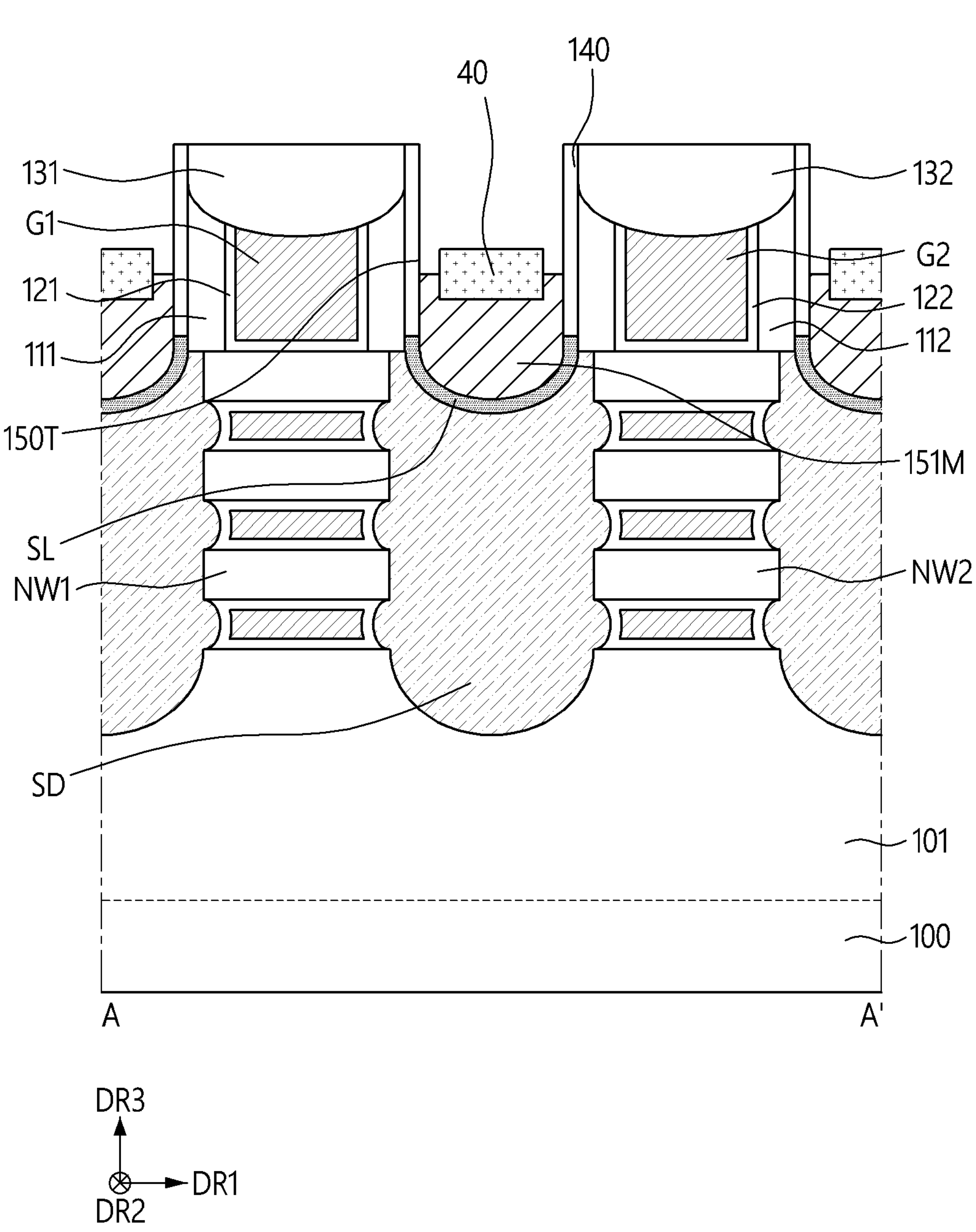

Referring to FIG. 19, the first contact material layer 151M may be partially etched. For example, the first contact material layer 151M may be partially etched so that the top surfaces of the first and second capping patterns 131 and 132 may be exposed. After the partial etching of the first contact material layer 151M, parts of the sidewalls of the first etch stopper layer 140 may be exposed. For example, after the partial etching of the first contact material layer 151M, at least some portions of the first contact material layer 151M may still remain on the sidewalls of the first sacrificial layer 40.

Figure 20:
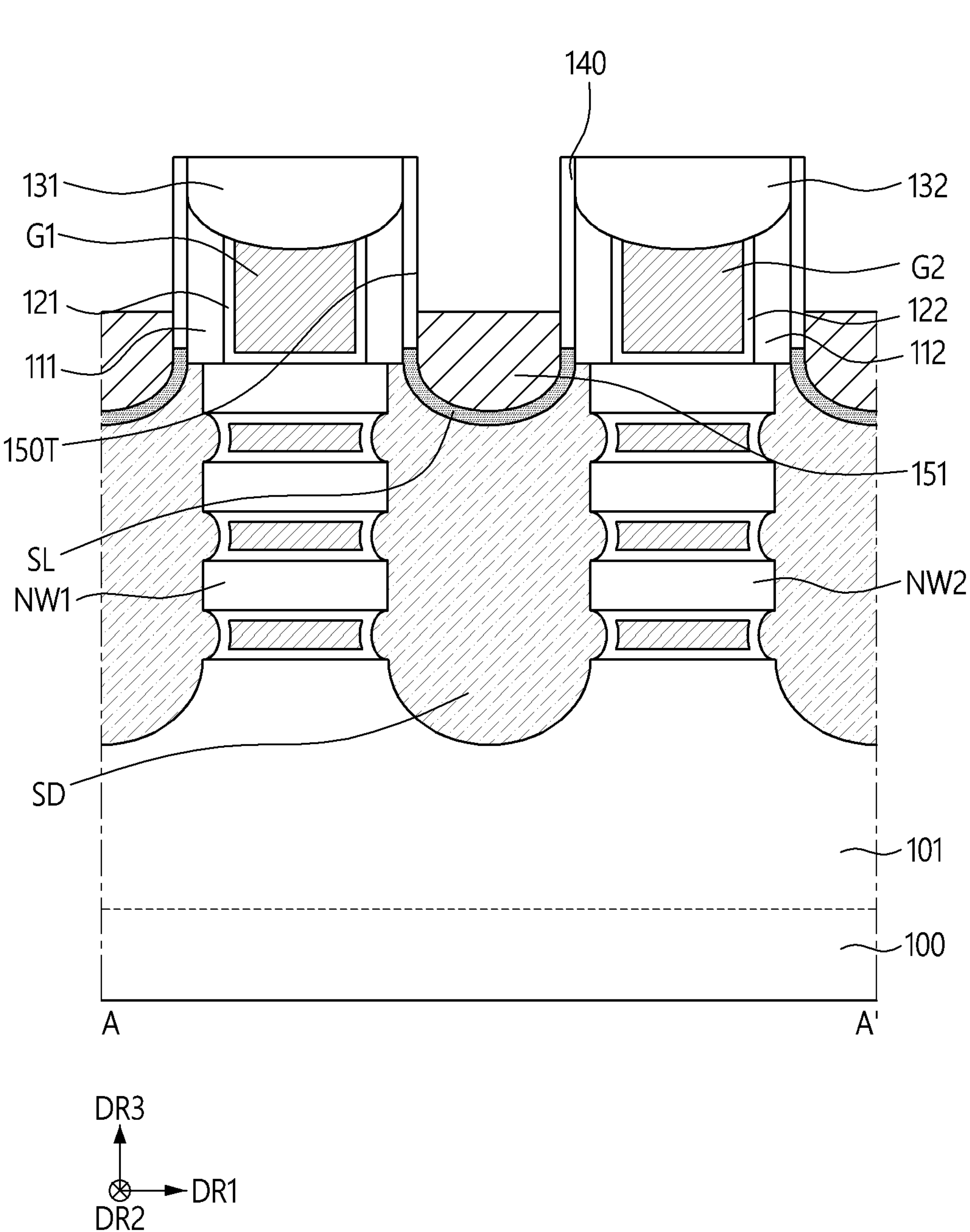

Referring to FIG. 20, the first sacrificial layer 40 may be removed. The portions of the first contact material layer 151M on the sidewalls of the first sacrificial layer 40 may also be etched away. As a result, the rest of the first contact material layer 151M may be defined as a first layer 151. For example, the top surface of the first layer 151 may be formed to be parallel to the top surface of the substrate 100.

Figure 21:
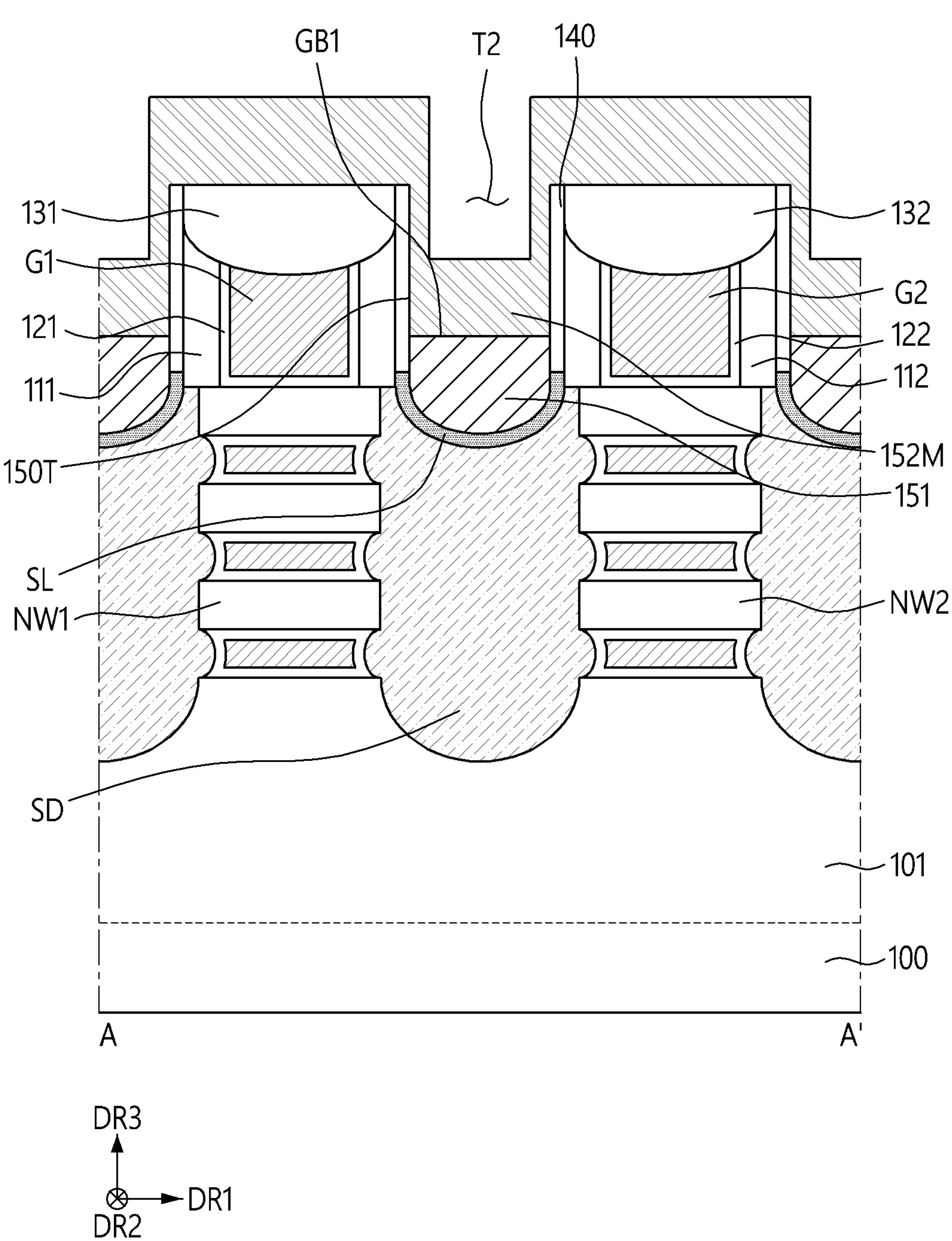

Referring to FIG. 21, a second contact material layer 152M may be formed on the sidewalls of the contact trench 150T and the top surface of the first layer 151, within the contact trench 150T. The second contact material layer 152M may also be formed on the top surfaces of the first and second capping patterns 131 and 132. For example, the second contact material layer 152M may be formed by a PVD process.

For example, the thickness of the second contact material layer 152M on the top surface of the first layer 151 an the top surfaces of the first and second capping patterns 131 and 132, measured in the vertical direction DR3, may be greater than the thickness of the second contact material layer 152M on the sidewalls of the contact trench 150T, measured in the first horizontal direction DR1. For example, the second contact material layer 152M may include the same material as the first layer 151. For example, the second contact material layer 152M may include one of W, Mo, and Ru. After the formation of the second contact material layer 152M, a second trench T2 may be defined by the second contact material layer 152M, within the contact trench 150T.

For example, the second contact material layer 152M may have a second crystal orientation, and the second crystal orientation may be different from a first crystal orientation of the first layer 151. As a result, a first grain boundary GB1 may be formed at the interface between the second contact material layer 152M and the first layer 151. For example, the first grain boundary GB1 may be formed to be parallel to the top surface of the substrate 100.

Figure 22:
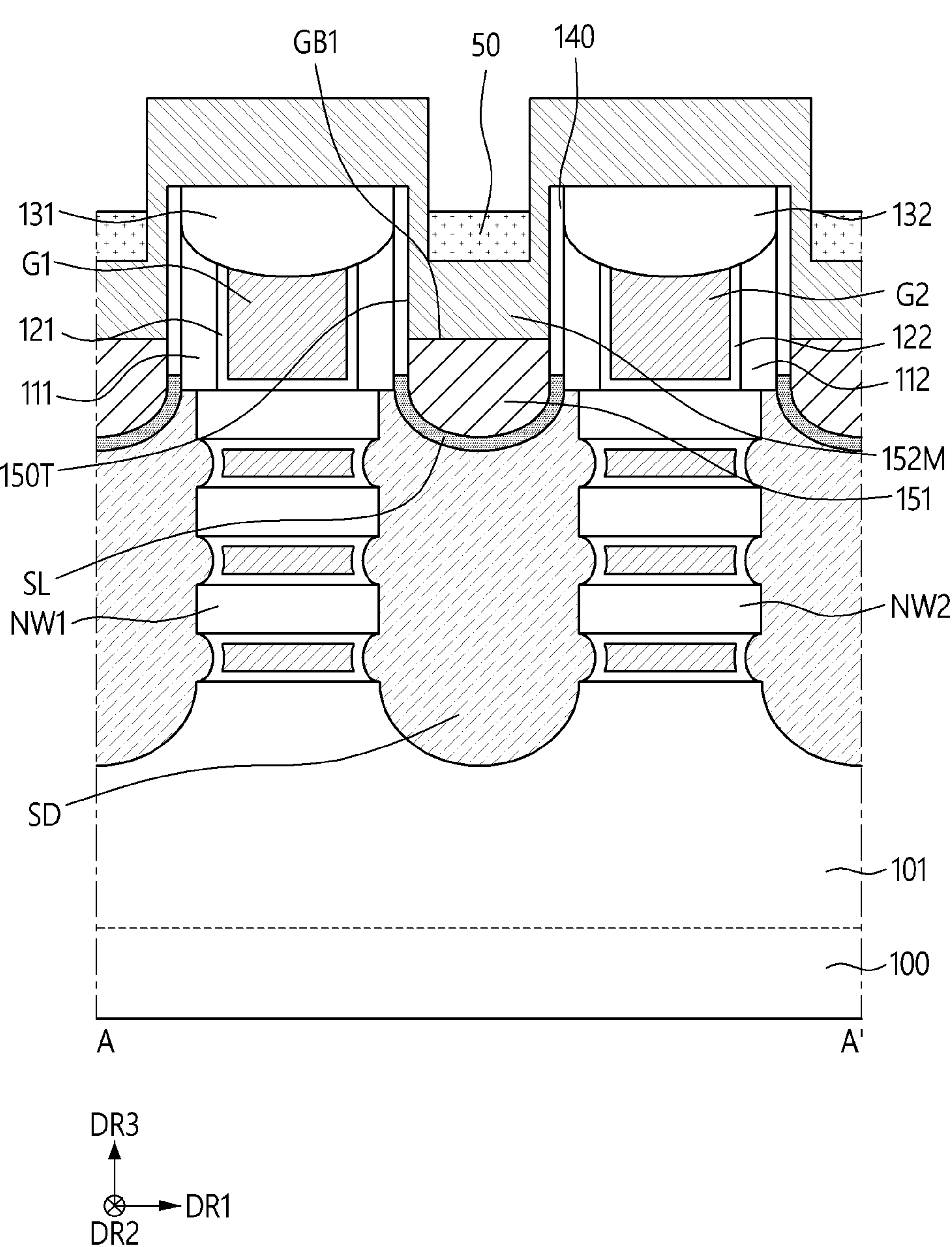

Referring to FIG. 22, a second sacrificial layer 50 may be formed in the second trench T2. For example, the second sacrificial layer 50 may be formed to partially fill the second trench T2. In another example, the second sacrificial layer 50 may be initially formed to completely fill the second trench T2 and then subsequently etched back to partially fill the second trench T2. For example, the second sacrificial layer 50 may include a carbon compound-based SOH material.

Figure 23:
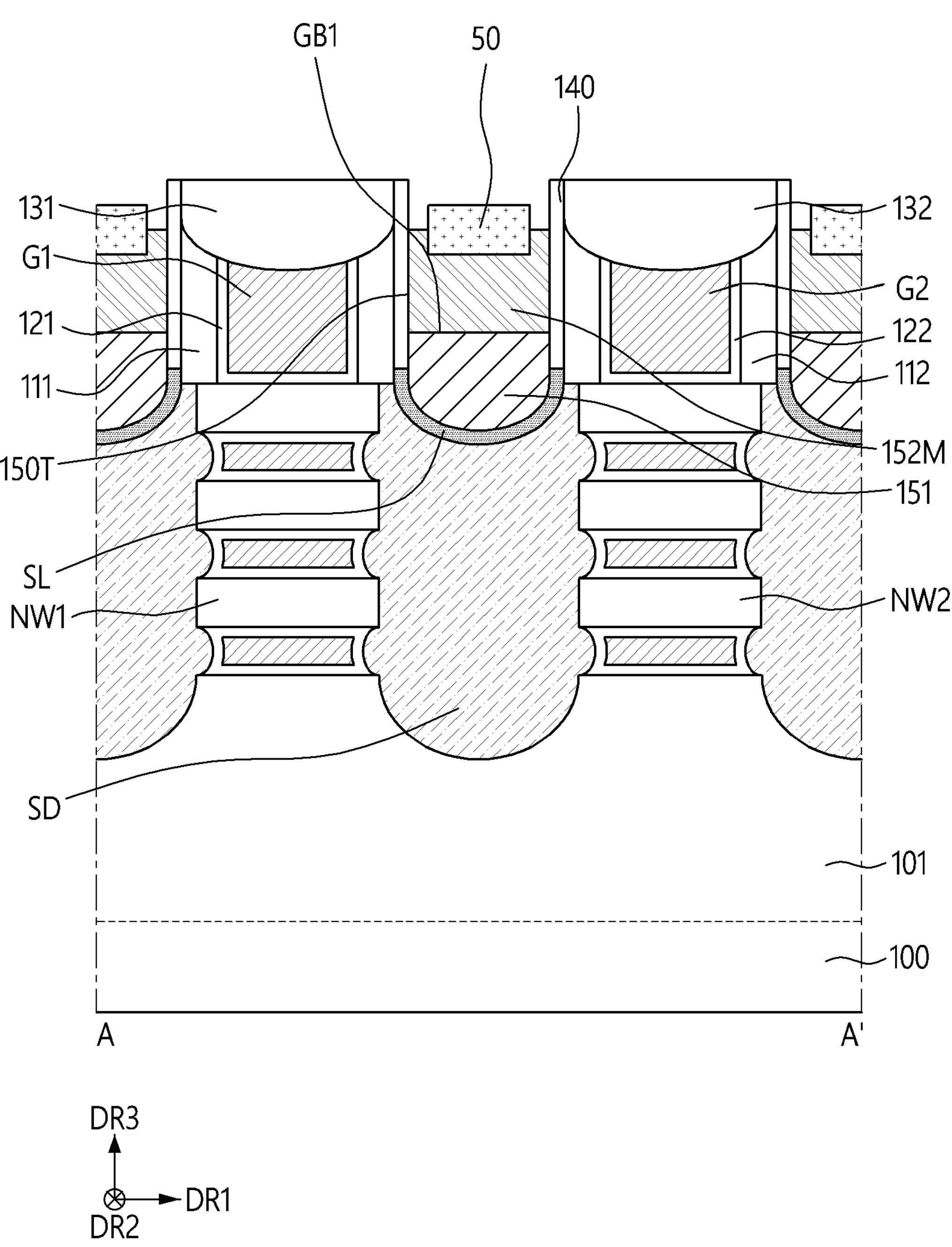

Referring to FIG. 23, the second contact material layer 152M may be partially etched. For example, the second contact material layer 152M may be partially etched so that the top surfaces of the first and second capping patterns 131 and 132 may be exposed. After the partial etching of the second contact material layer 152M, parts of the sidewalls of the first etch stopper layer 140 may be exposed. For example, after the partial etching of the second contact material layer 152M, at least some portions of the second contact material layer 152M may still remain on the side-walls of the second sacrificial layer 50.

Figure 24:
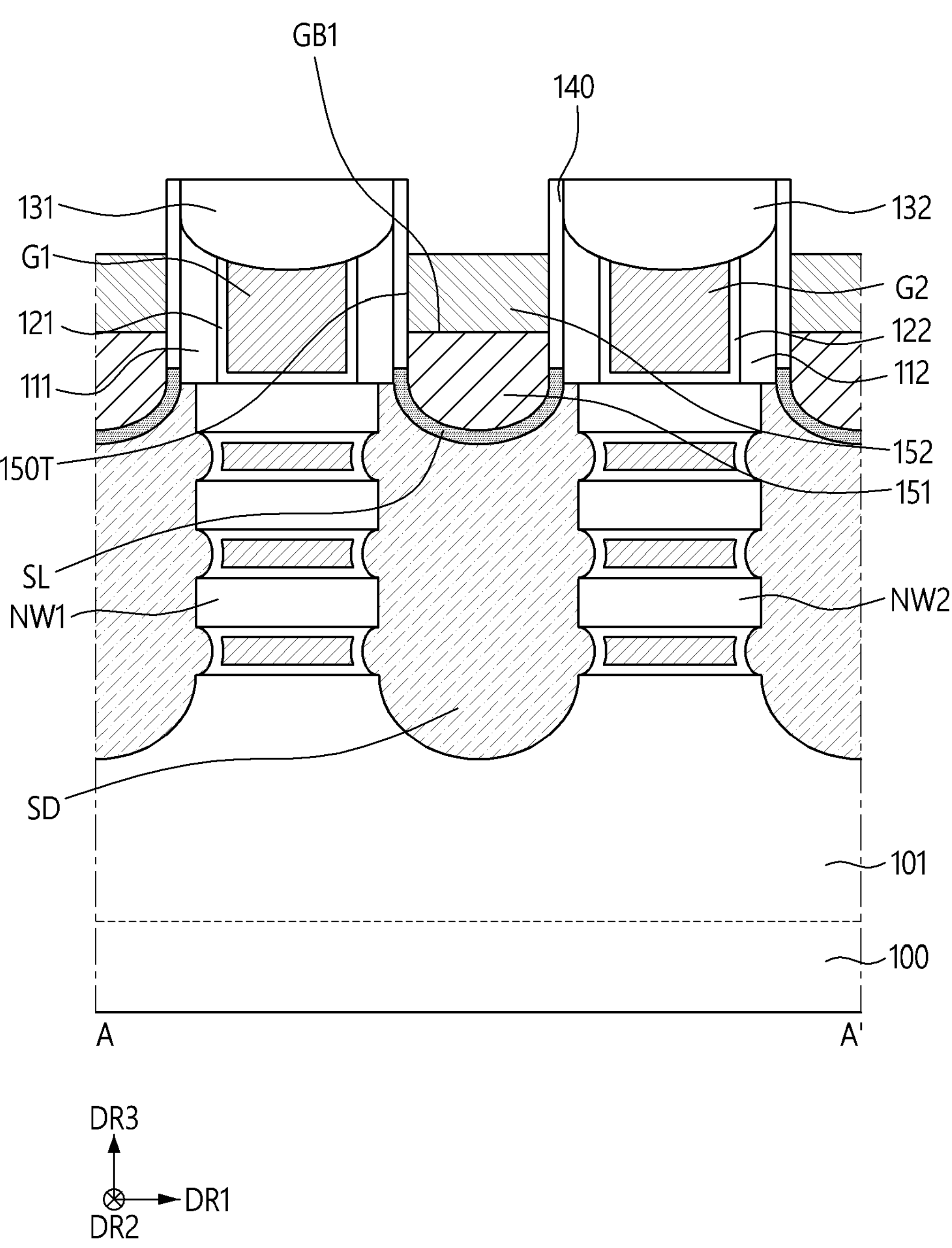

Referring to FIG. 24, the second sacrificial layer 50 may be removed. The portions of the second contact material layer 152M on the sidewalls of the second sacrificial layer 50 may also be etched away. As a result, the rest of the second contact material layer 152M may be defined as a second layer 152. For example, the top surface of the second layer 152 may be formed to be parallel to the top surface of the substrate 100.

Figure 25:
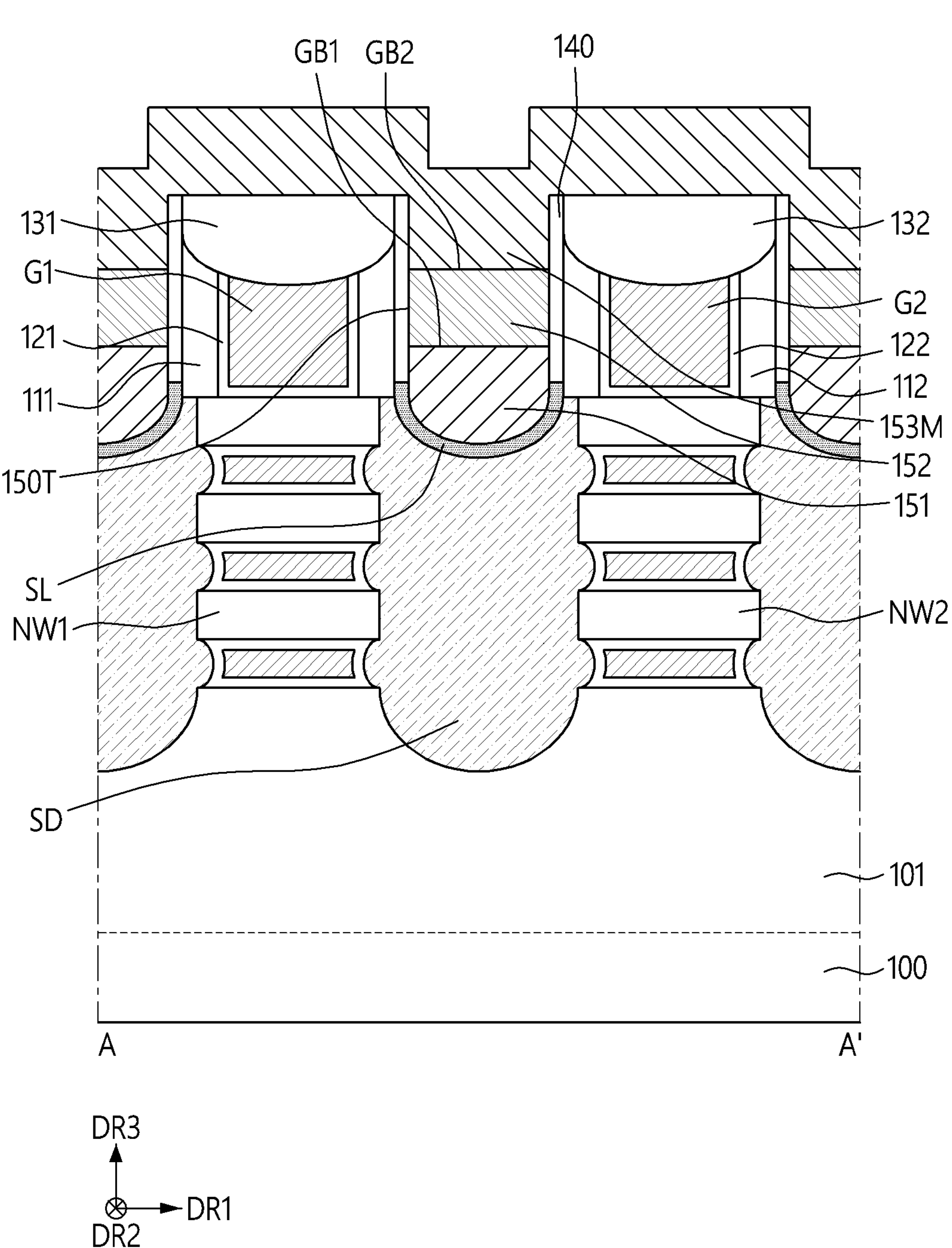

Referring to FIG. 25, a third contact material layer 153M may be formed to fill the rest of the contact trench 150T. The third contact material layer 153M may also be formed on the top surfaces of the first and second capping patterns 131 and 132. For example, the third contact material layer 153M may be formed by a PVD process. For example, the third contact material layer 153M may include the same material as the first and second layers 151 and 152. For example, the third contact material layer 153M may include one of W, Mo, and Ru.

For example, a third crystal orientation of the third contact material layer 153M may be different from the second crystal orientation of the second layer 152. As a result, a second grain boundary GB2 may be formed at the interface between the third contact material layer 153M and the second layer 152. For example, the second grain boundary GB2 may be formed to be parallel to the top surface of the substrate 100.

Figure 26:
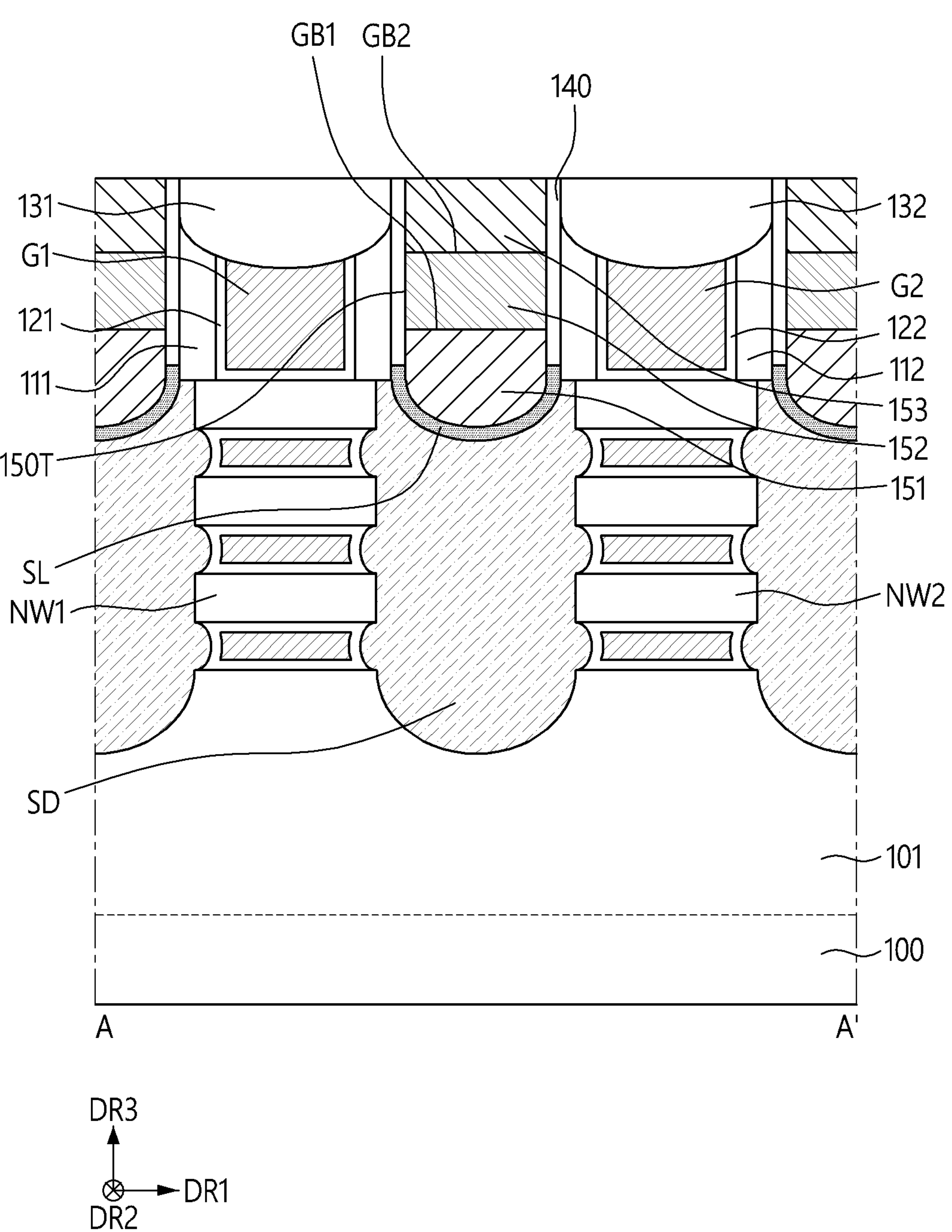

Referring to FIG. 26, the top surfaces of the first and second capping patterns 131 and 132 may be exposed by a planarization process. Part of the third contact material layer 153M that still remains after the planarization process may be defined as a third layer 153. For example, the top surface of the third layer 153 may be formed on the same plane as the top surfaces of the first and second capping patterns 131 and 132.

Referring again to FIGS. 2 through 4, a second etch stopper layer 160 and a second interlayer insulating layer 170 may be sequentially formed on the top surfaces of the first and second capping patterns 131 and 132, the uppermost surface of the first etch stopper layer 140, and the top surface of the third layer 153. Thereafter, a via V, which may be connected to the third layer 153 by penetrating or extending through the second interlayer insulating layer 170 and the second etch stopper layer 160 in the vertical direction DR3, may be formed. In this manner, the semiconductor device of FIGS. 2 through 4 may be obtained.

According to the embodiments of FIGS. 2 through 26, the source/drain contact 150, which includes the first, second, and third layers 151, 152, and 153 that are obtained by performing multiple PVD processes, can be formed. Accordingly, the source/drain contact 150 can be efficiently formed in a relatively small space. Furthermore, as the source/drain contact 150 is formed by PVD processes, the resistance of the source/drain contact 150 can be reduced because no impurities are contained in the source/drain contact 150. Therefore, the reliability of the source/drain contact 150 can be improved.

As the first and third layers 151 and 153 may have a different crystal orientation from the second layer 152, the first grain boundary GB1 can be formed between the first and second layers 151 and 152, and the second grain boundary GB2 can be formed between the second and third layers 152 and 153.

A semiconductor device according to some embodiments of the present disclosure will hereinafter be described with reference to FIGS. 27 and 28, highlighting the differences with the semiconductor device of FIGS. 1 through 4.

Figure 27:
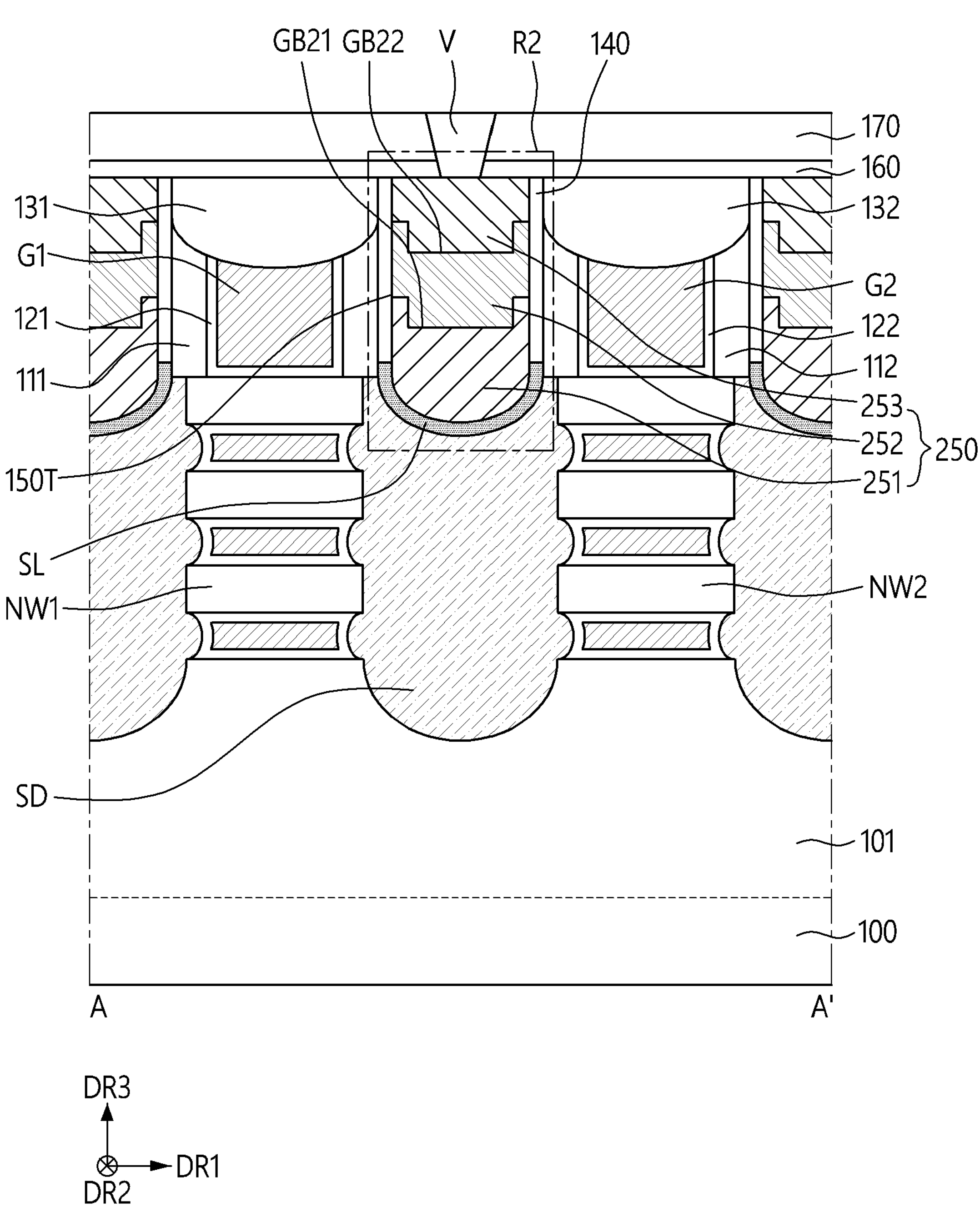
FIG. 27 is a cross-sectional view of a semiconductor device according to some embodiments of the present disclosure.

FIG. 27 is a cross-sectional view of a semiconductor device according to some embodiments of the present disclosure. FIG. 28 is an enlarged cross-sectional view of a region R2 of FIG. 27.

Figure 28:
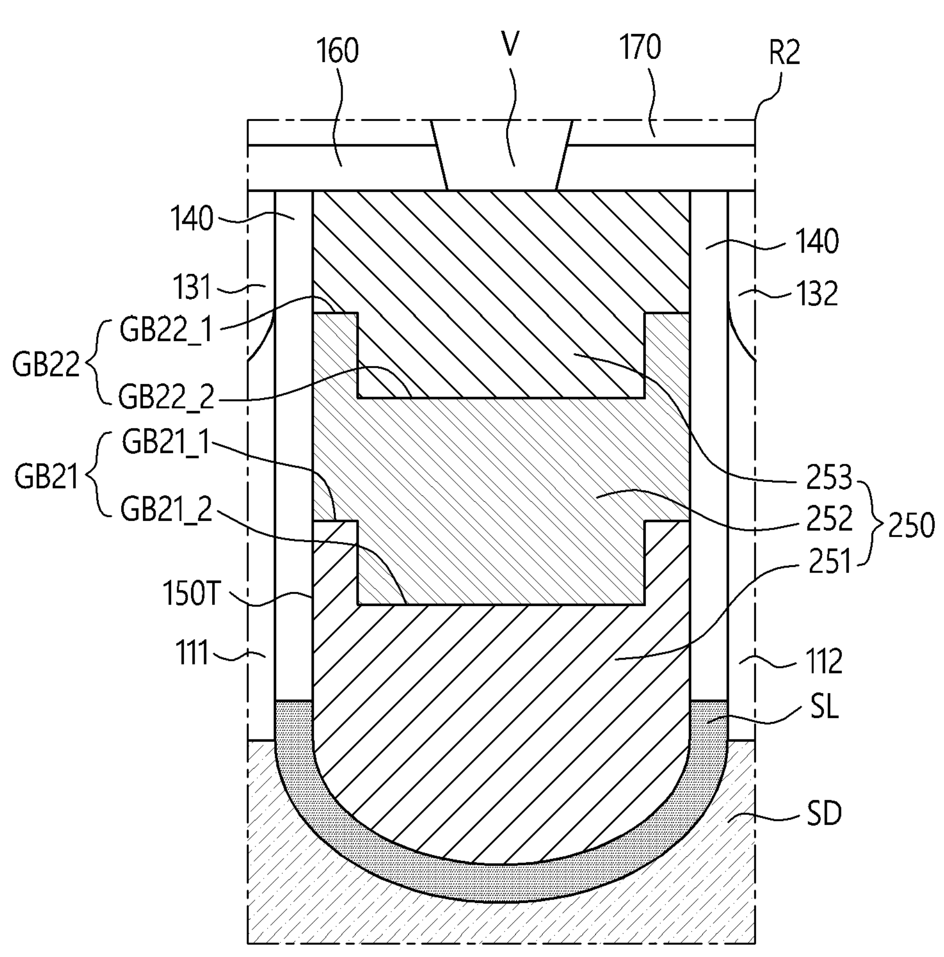
FIG. 28 is an enlarged cross-sectional view of a region R2 of FIG. 27.
Figure 28:
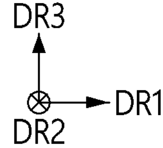

Referring to FIGS. 27 and 28, at least parts of the sidewalls of a second layer 252 may be in contact with a first layer 251, and at least parts of the sidewalls of a third layer 253 may be in contact with the second layer 252.

For example, a source/drain contact 250 may include the first, second, and third layers 251, 252, and 253. The top surfaces of portions of the first layer 251 that are in contact with a first etch stopper layer 140 may be formed to be higher than the top surface of a middle portion of the first layer 251. At least part of the second layer 252 may be between the portions of the first layer 251 that are in contact with the first etch stopper layer 140. The top surfaces of portions of the second layer 252 that are in contact with the first etch stopper layer 140 may be formed to be higher than the top surface of a middle portion of the second layer 252. At least part of the third layer 253 may be between the portions of the second layer 252 that are in contact with the first etch stopper layer 140.

For example, a first grain boundary GB21 may be formed at the interface between the first and second layers 251 and 252 and may include first boundaries GB21_1 and a second boundary GB21_2. The first boundaries GB21_1 may be formed at the interfaces between the portions of the first layer 251 that are in contact with the first etch stopper layer 140 and the portions of the second layer 252 that are in contact with the first etch stopper layer 140. The second boundary GB21_2 may be formed at the interface between the middle portions of the first and second layers 251 and 252. The first boundaries GB21_1 may be formed to be higher than the second boundary GB21_2.

For example, a second grain boundary GB21 may be formed at the interface between the second and third layers 252 and 253 and may include first boundaries GB22_1 and a second boundary GB22_2. The first boundaries GB22_1 may be formed at the interfaces between the portions of the second layer 252 that are in contact with the first etch stopper layer 140 and the third layer 253. The second boundary GB22_2 may be formed at the interface between the middle portion of the second layer 251 and the third layer 253. The first boundaries GB22_1 may be formed to be higher than the second boundary GB22_2.

A semiconductor device according to some embodiments of the present disclosure will hereinafter be described with reference to FIGS. 29 and 30, highlighting the differences with the semiconductor device of FIGS. 1 through 4.

Figure 29:
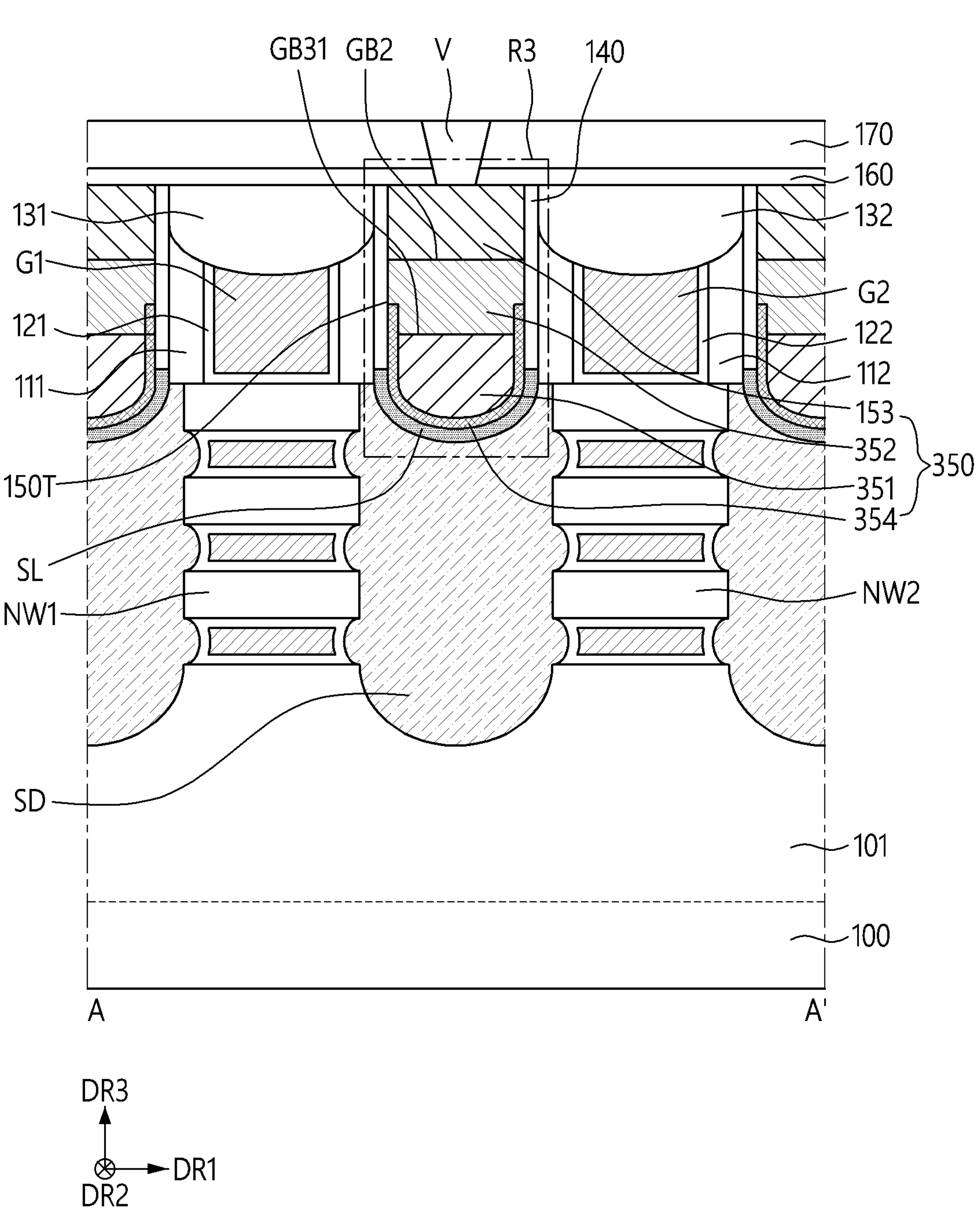
FIG. 29 is a cross-sectional view of a semiconductor device according to some embodiments of the present disclosure.

FIG. 29 is a cross-sectional view of a semiconductor device according to some embodiments of the present disclosure. FIG. 30 is an enlarged cross-sectional view of a region R3 of FIG. 29.

Figure 30:
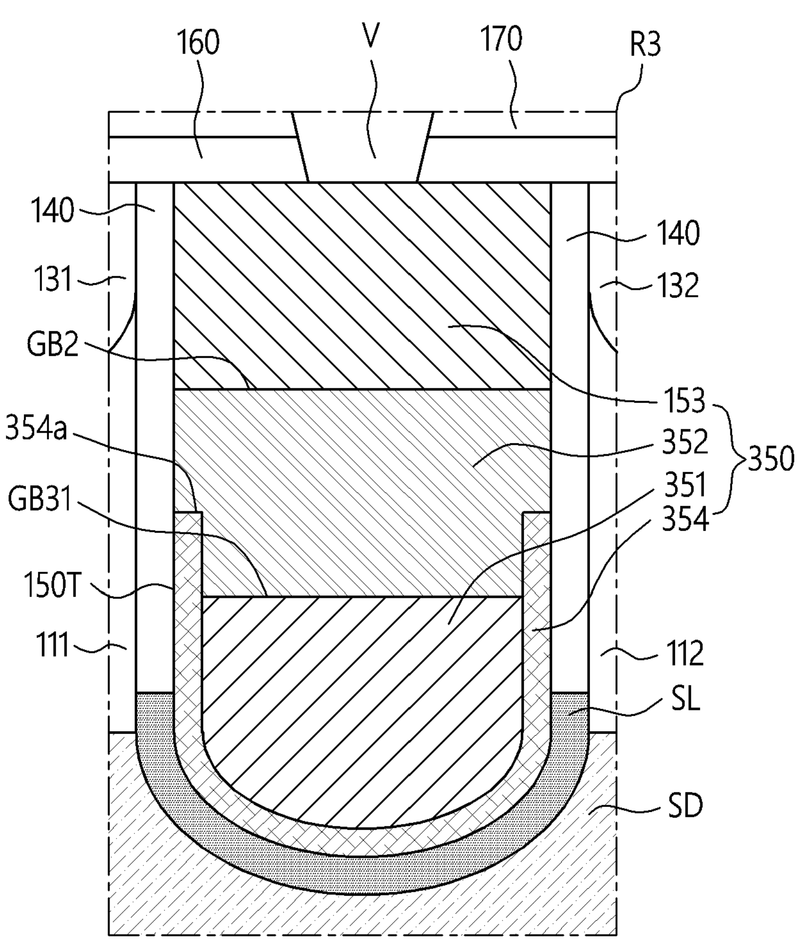
FIG. 30 is an enlarged cross-sectional view of a region R3 of FIG. 29.
Figure 30:
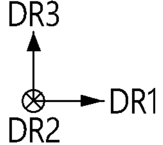

Referring to FIGS. 29 and 30, a contact barrier layer 354 may be on the sidewalls and bottom surface of a first layer 351 and on parts of the sidewalls of a second layer 352.

For example, a source/drain contact 350 may include the first layer 351, the second layer 352, a third layer 153, and the contact barrier layer 354. For example, the contact barrier layer 354 may be between a silicide layer SL and the sidewalls and bottom surface of the first layer 351. The contact barrier layer 354 may be between a first etch stopper layer 140 and the sidewalls of the first layer 351. The contact barrier layer 354 may also be between the first etch stopper layer 140 and parts of the sidewalls of the second layer 352. For example, an uppermost surface 354*a* of the contact barrier layer 354 may be formed between first and second grain boundaries GB31 and GB2. For example, the first grain boundary GB31 may be formed between the inner sidewalls of the contact barrier layer 354.

The contact barrier layer 354 may include at least one of, for example, Ta, TaN, Ti, TiN, Ru, Co, Ni, NiB, W, WN, WCN, Zr, ZrN, V, VN, Nb, NbN, Pt, Ir, or Rh, or combinations of two or more thereof.

A method of fabricating the semiconductor device of FIGS. 29 and 30 will hereinafter be described with reference to FIGS. 29 through 35, highlighting the differences with the method of FIGS. 5 through 26.

FIGS. 31 through 35 are cross-sectional views illustrating intermediate steps of a method of fabricating a semiconductor device according to some embodiments of the present disclosure.

Figure 31:
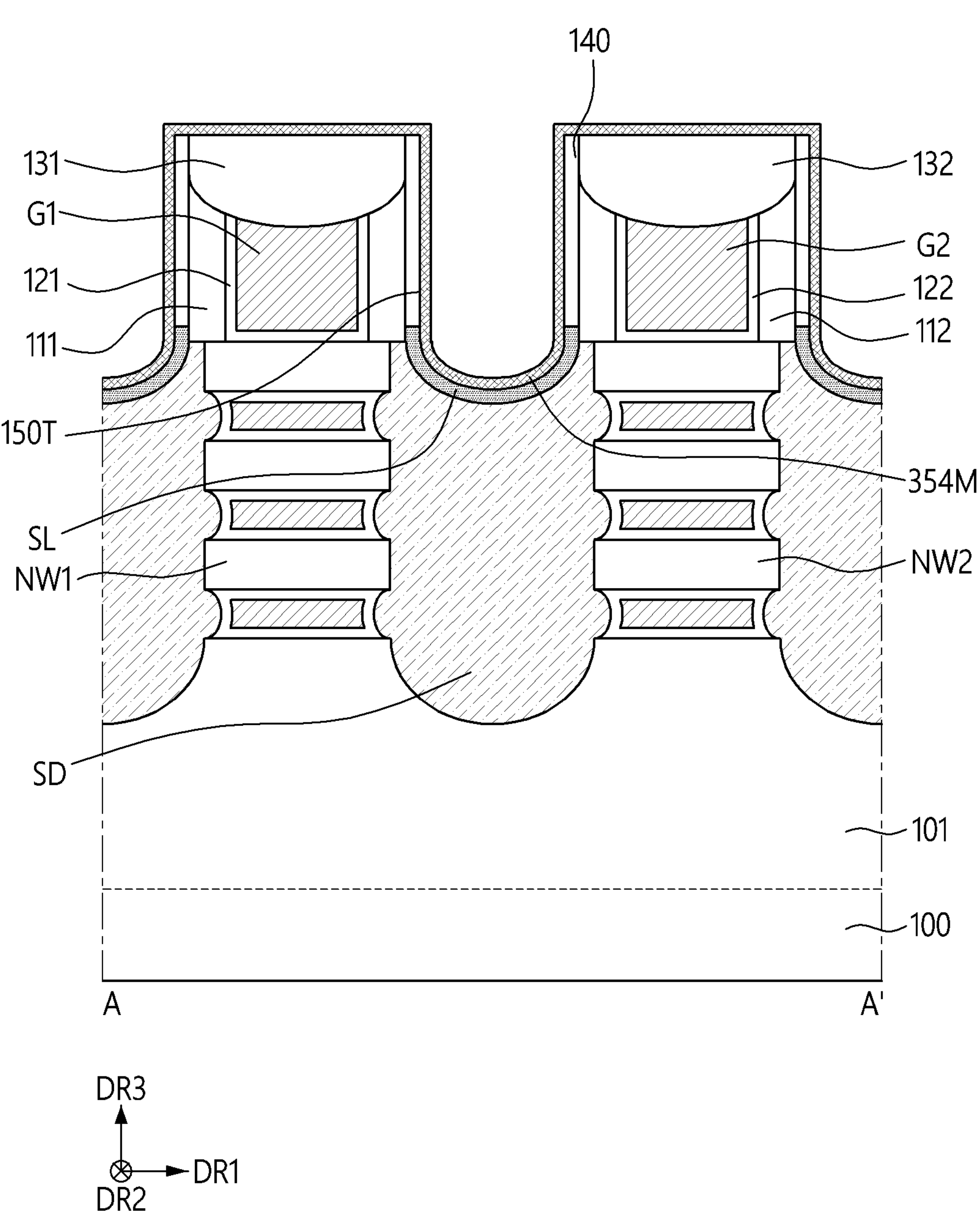
FIGS. 31 through 35 are cross-sectional views illustrating intermediate steps of a method of fabricating a semiconductor device according to some embodiments of the present disclosure.

Referring to FIG. 31, after the processes depicted in FIGS. 5 through 16, a contact barrier material layer 354M may be formed on the sidewalls and bottom surface of a contact trench 150T. The contact barrier material layer 354M may also be formed on the top surfaces of first and second capping patterns 131 and 132. For example, the contact barrier material layer 354M may be conformally formed.

The contact barrier material layer 354M may include at least one of, for example, Ta, TaN, Ti, TiN, Ru, Co, Ni, NiB, W, WN, WCN, Zr, ZrN, V, VN, Nb, NbN, Pt, Ir, or Rh, or combinations of two or more thereof.

Figure 32:
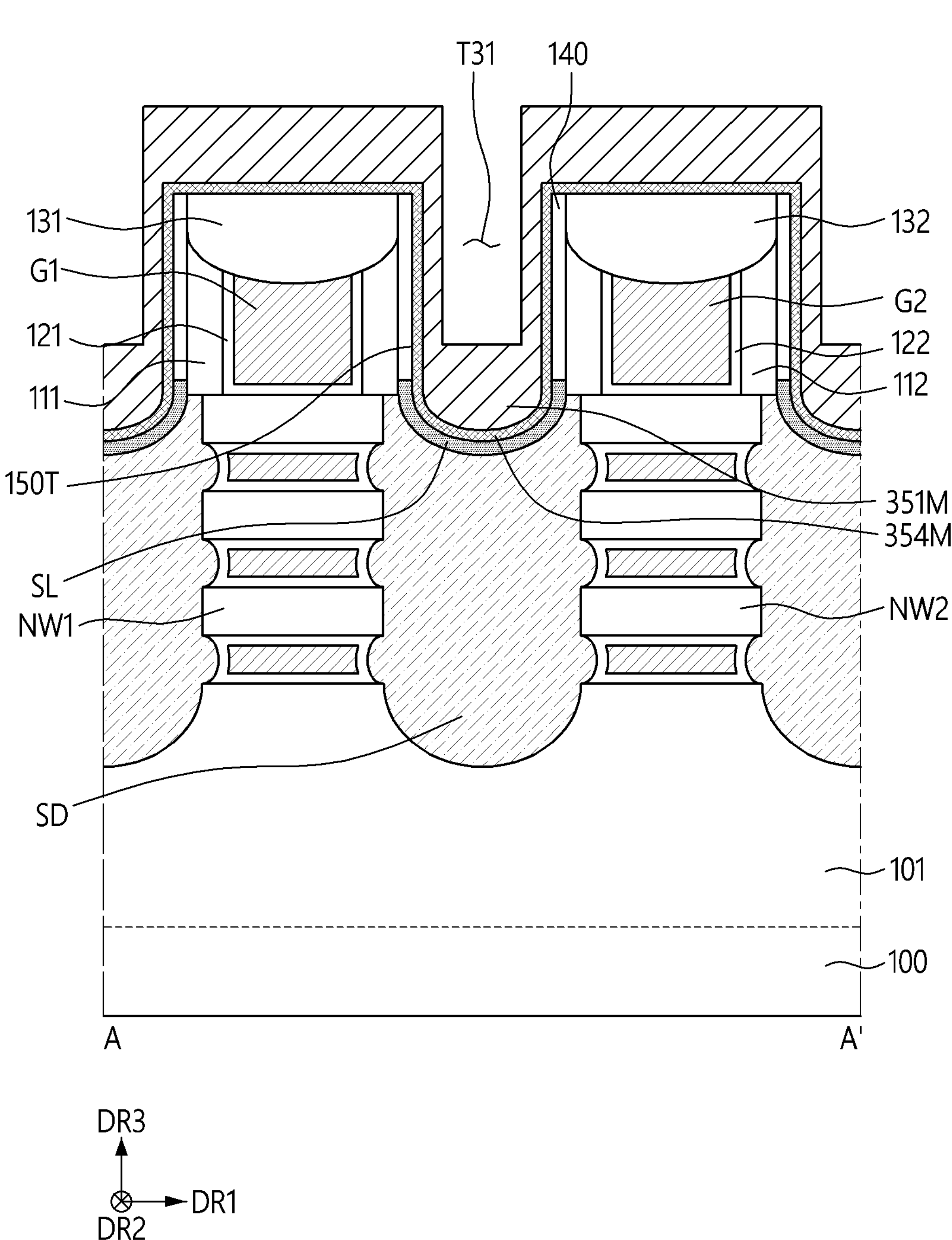

Referring to FIG. 32, a first contact material layer 351M may be formed on the contact barrier material layer 354M. For example, the first contact material layer 351M may be formed by a PVD process. After the formation of the first contact material layer 351M, a first trench T31 may be defined by the first contact material layer 351M, within the contact trench 150T.

Figure 33:
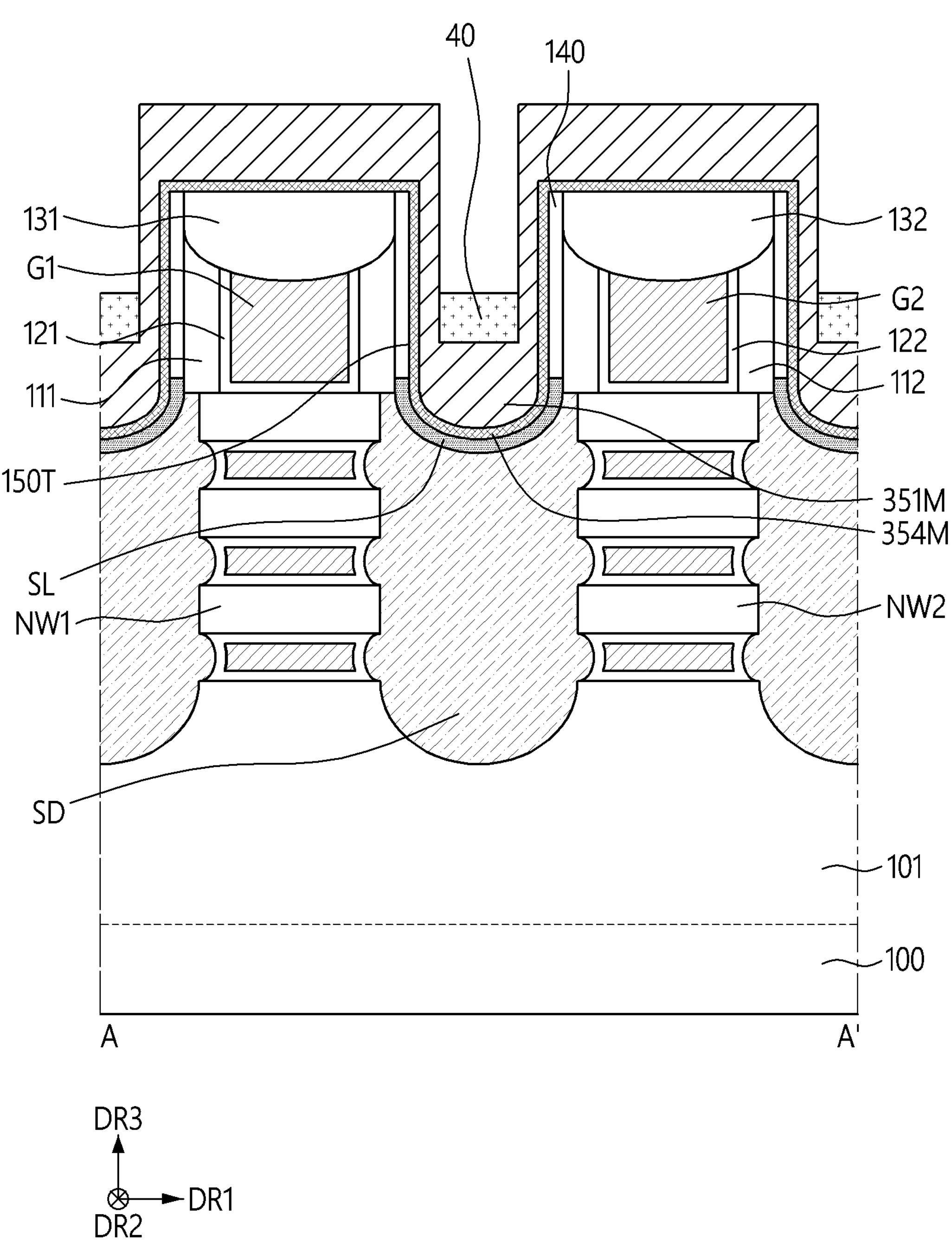

Referring to FIG. 33, a first sacrificial layer 40 may be formed in the first trench T31. For example, the first sacrificial layer 40 may partially fill the first trench T31.

Figure 34:
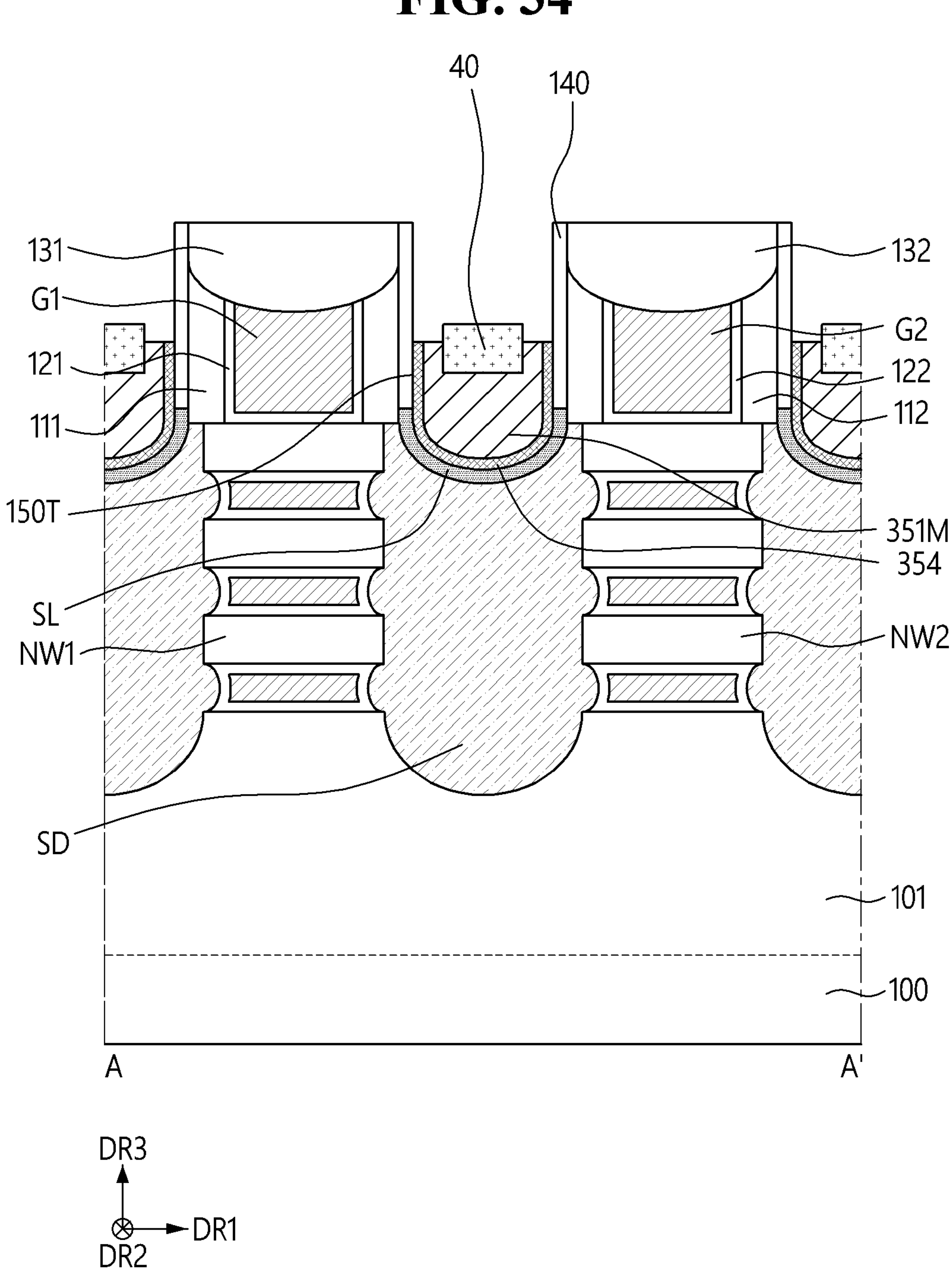

Referring to FIG. 34, the first contact material layer 351M and the contact barrier material layer 354M may be partially etched. For example, after the partial etching of the first contact material layer 351M and the contact barrier material layer 354M, the top surfaces of the first and second capping patterns 131 and 132 may be exposed. After the partial etching of the first contact material layer 351M and the contact barrier material layer 354M, parts of the sidewalls of a first etch stopper layer 140 may also be exposed.

For example, part of the contact barrier material layer 354M that still remains after the partial etching of the first contact material layer 351M and the contact barrier material layer 354M may be defined as a contact barrier layer 354. For example, at least parts of the first contact material layer 351M and the contact barrier layer 354 may remain on the sidewalls of the first sacrificial layer 40 after the partial etching of the first contact material layer 351M and the contact barrier material layer 354M. The uppermost surfaces of the remaining parts of the first contact material layer 351M and the contact barrier layer 354 may be formed on the same plane, but the present disclosure is not limited thereto.

Figure 35:
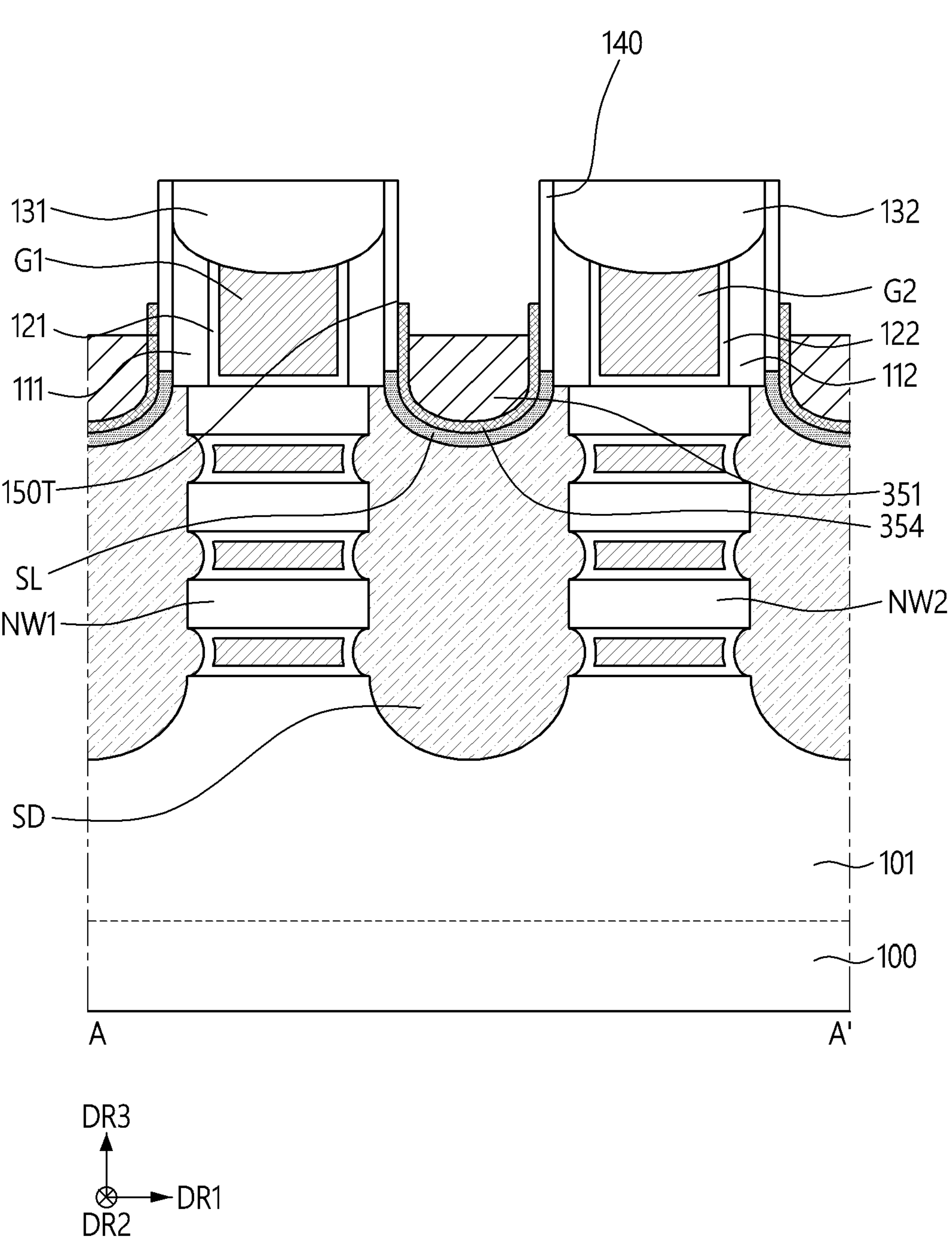

Referring to FIG. 35, the first sacrificial layer 40 may be removed. Also, the remaining part of the first contact material layer 351M on the sidewalls of the first sacrificial layer 40 may be partially etched. The remaining unetched portion of the first contact material layer 351M may be defined as a first layer 351. For example, the top surface of the first layer 351 may be formed to be lower than the uppermost surface of the contact barrier layer 354. For example, the top surface of the first layer 351 may be formed to be parallel to the top surface of a substrate 100.

Referring again to FIGS. 29 and 30, after the processes depicted in FIGS. 21 through 26, a second etch stopper layer 160 and a second interlayer insulating layer 170 may be sequentially formed on the top surfaces of the first and second capping patterns 131 and 132, the uppermost surface of the first etch stopper layer 140, and the top surface of a third layer 153. Thereafter, a via V, which may be connected to the third layer 153 by penetrating and extending through the second interlayer insulating layer 170 and the second etch stopper layer 160 in a vertical direction D3, may be formed. In this manner, the semiconductor device of FIGS. 29 and 30 can be obtained.

A semiconductor device according to some embodiments of the present disclosure will hereinafter be described with reference to FIGS. 36 and 37, highlighting the differences with the semiconductor device of FIGS. 1 through 4, 29, and 30.

Figure 36:
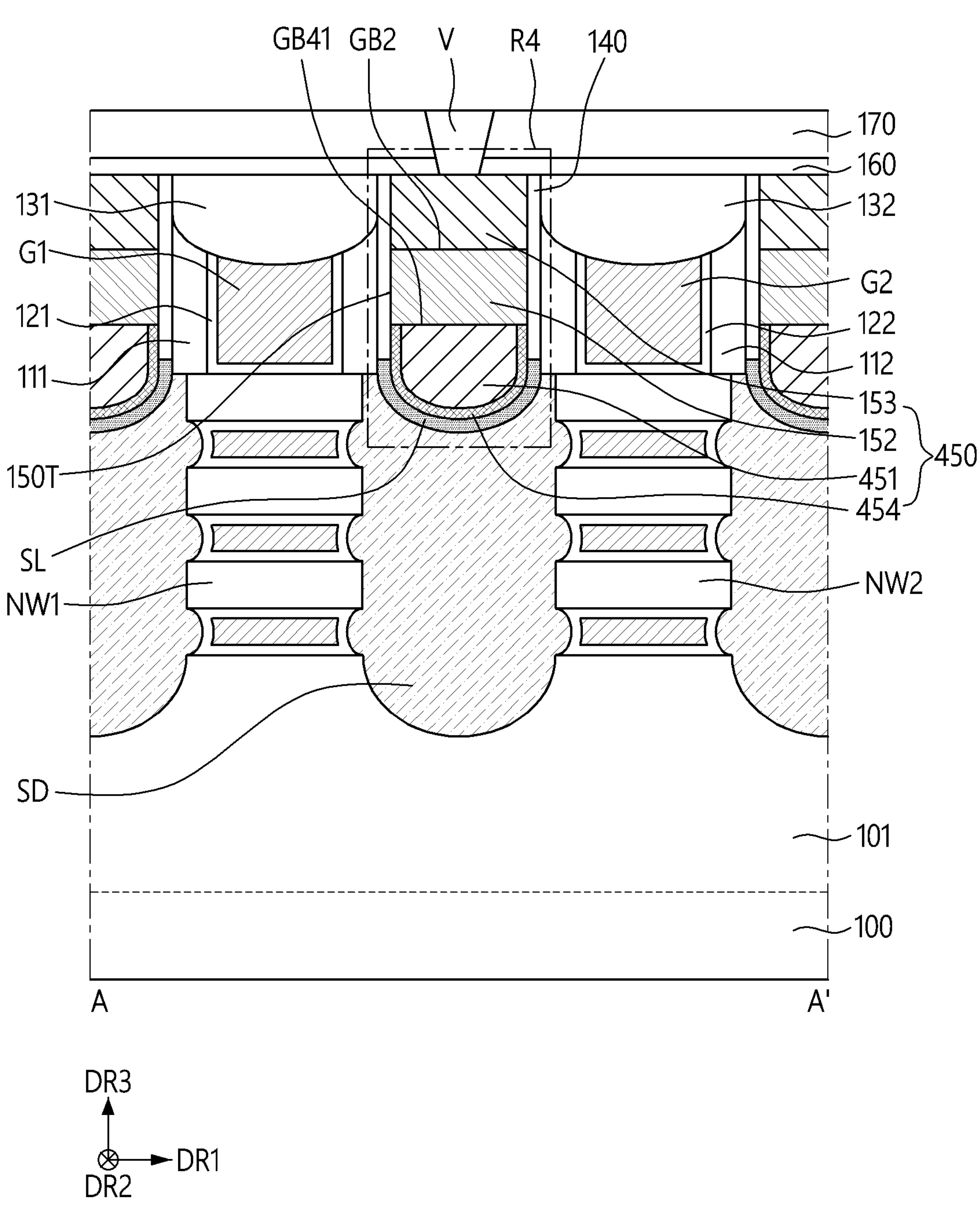
FIG. 36 is a cross-sectional view of a semiconductor device according to some embodiments of the present disclosure.

FIG. 36 is a cross-sectional view of a semiconductor device according to some embodiments of the present disclosure. FIG. 37 is an enlarged cross-sectional view of a region R4 of FIG. 36.

Figure 37:
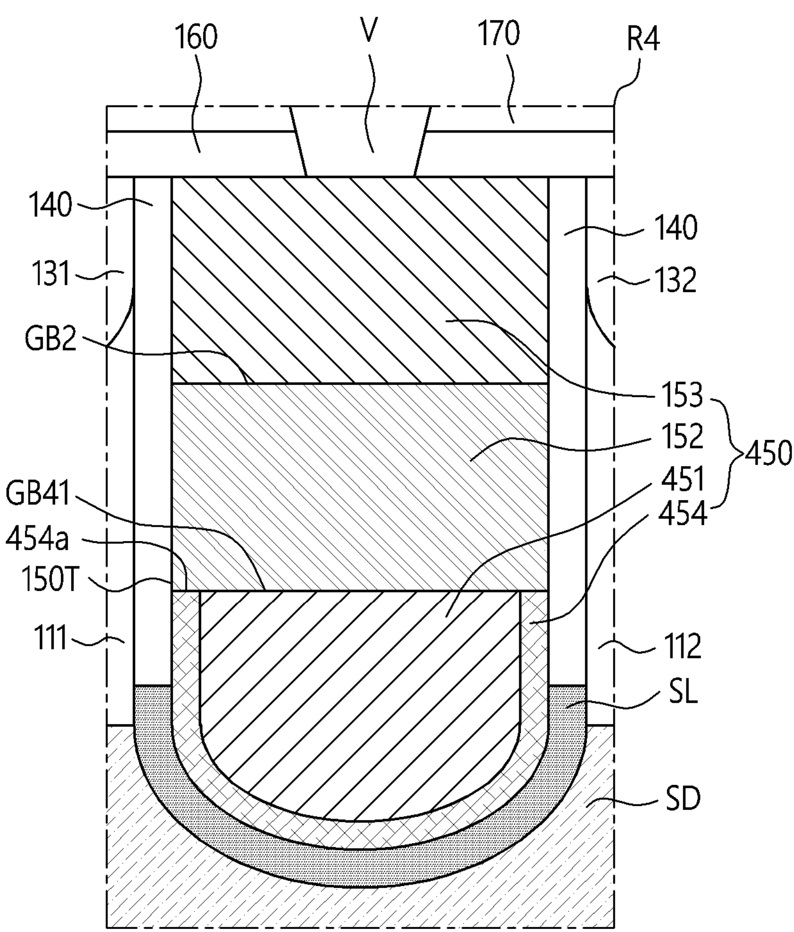
FIG. 37 is an enlarged cross-sectional view of a region R4 of FIG. 36.
Figure 37:
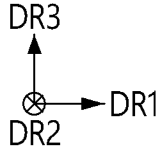

Referring to FIGS. 36 and 37, a contact barrier layer 454 may be on the sidewalls and bottom surface of a first layer 451.

For example, a source/drain contact 450 may include a first layer 451, a second layer 152, a third layer 153, and the contact barrier layer 454. For example, the contact barrier layer 454 may be between a silicide layer SL and the sidewalls and bottom surface of the first layer 451. The contact barrier layer 454 may be between a first etch stopper layer 140 and the sidewalls of the first layer 451. For example, an uppermost surface 454*a* of the contact barrier layer 454 may be formed on the same plane as a first grain boundary GB41.

A semiconductor device according to some embodiments of the present disclosure will hereinafter be described with reference to FIGS. 38 and 39, highlighting the differences with the semiconductor device of FIGS. 1 through 4, 29, and 30.

Figure 38:
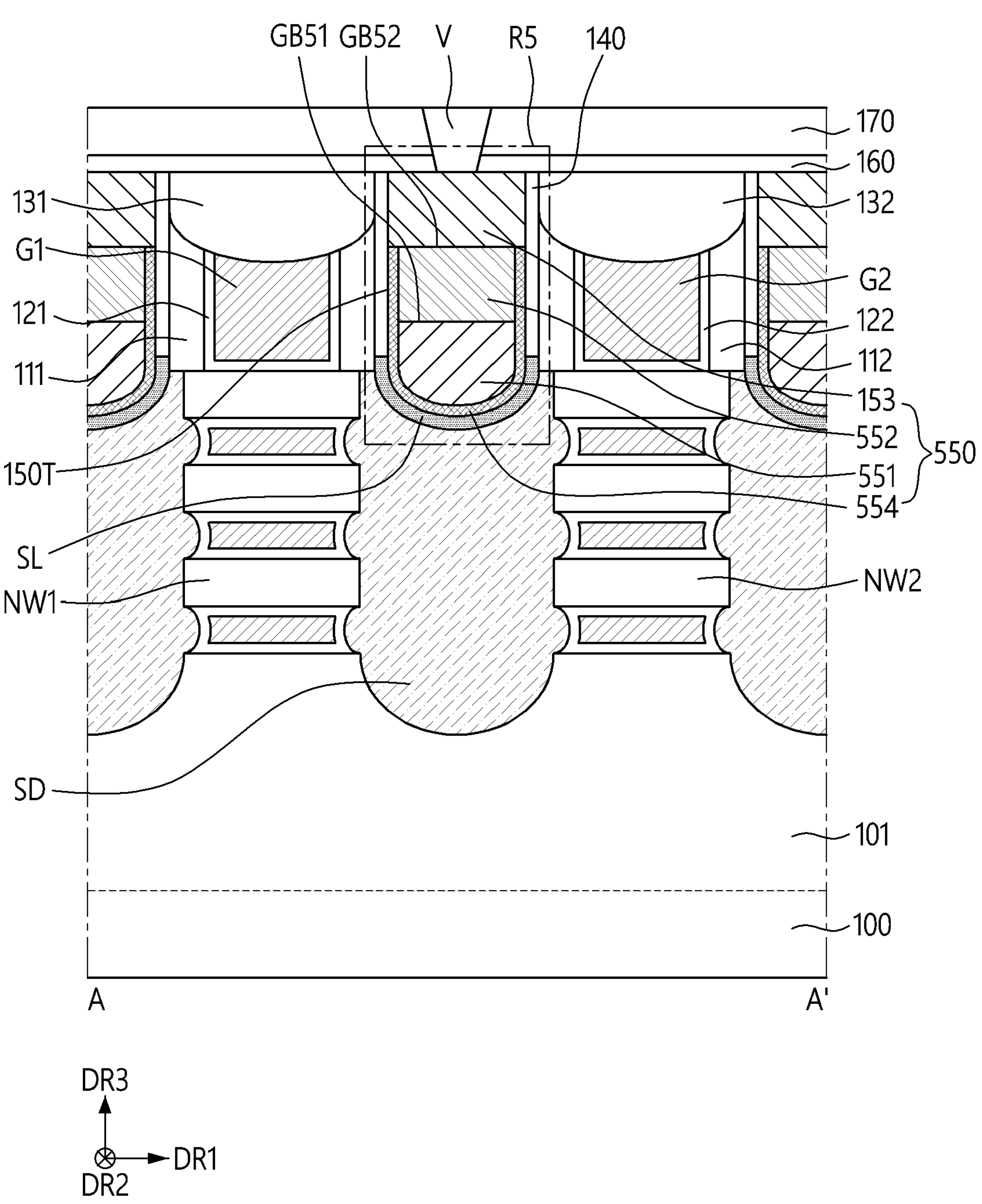
FIG. 38 is a cross-sectional view of a semiconductor device according to some embodiments of the present disclosure.

FIG. 38 is a cross-sectional view of a semiconductor device according to some embodiments of the present disclosure. FIG. 39 is an enlarged cross-sectional view of a region R5 of FIG. 38.

Figure 39:
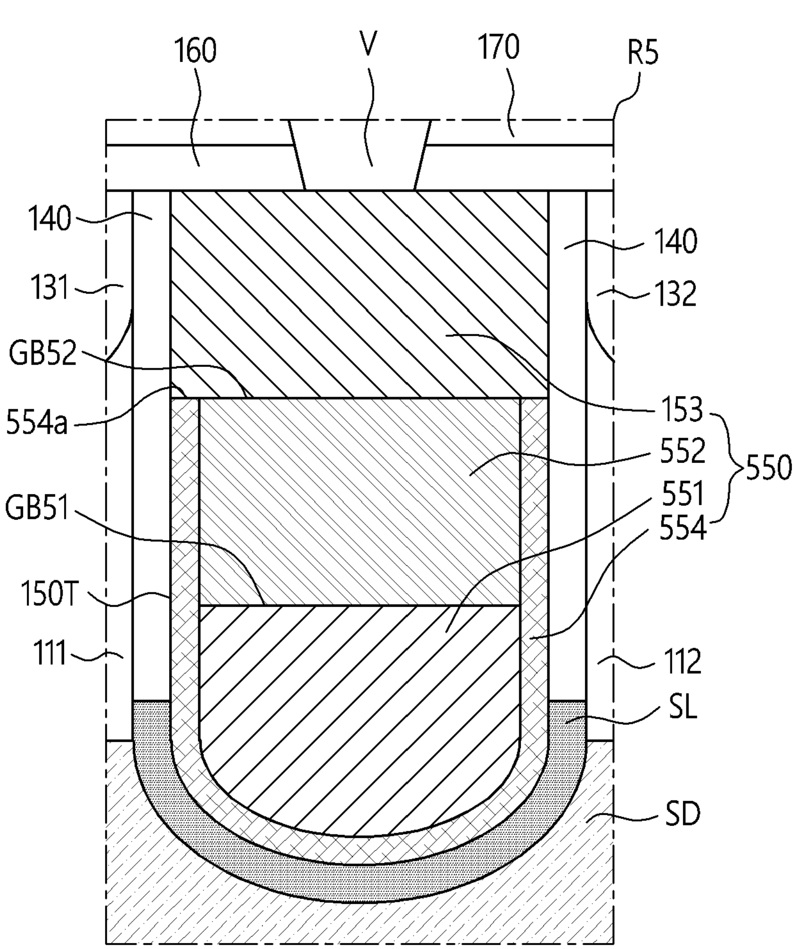
FIG. 39 is an enlarged cross-sectional view of a region R5 of FIG. 38.
Figure 39:
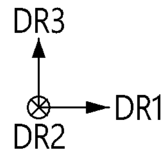

Referring to FIGS. 38 and 39, a contact barrier layer 554 may be on the sidewalls and bottom surface of a first layer 551 and on the sidewalls of a second layer 552.

For example, a source/drain contact 550 may include the first layer 551, the second layer 552, a third layer 153, and a contact barrier layer 554. For example, the contact barrier layer 554 may be between a silicide layer SL and the sidewalls and bottom surface of the first layer 551. The contact barrier layer 554 may be between a first etch stopper layer 140 and the sidewalls of the first layer 551. The contact barrier layer 554 may also be between the first etch stopper layer 140 and the sidewalls of the second layer 552. For example, an uppermost layer 554*a* of the contact barrier layer 554 may be formed on the same plane as a second grain boundary GB52. For example, a first grain boundary GB51 may be formed between the inner sidewalls of the contact barrier layer 554.

A semiconductor device according to some embodiments of the present disclosure will hereinafter be described with reference to FIGS. 40 and 41, highlighting the differences with the semiconductor device of FIGS. 1 through 4, 29, and 30.

Figure 40:
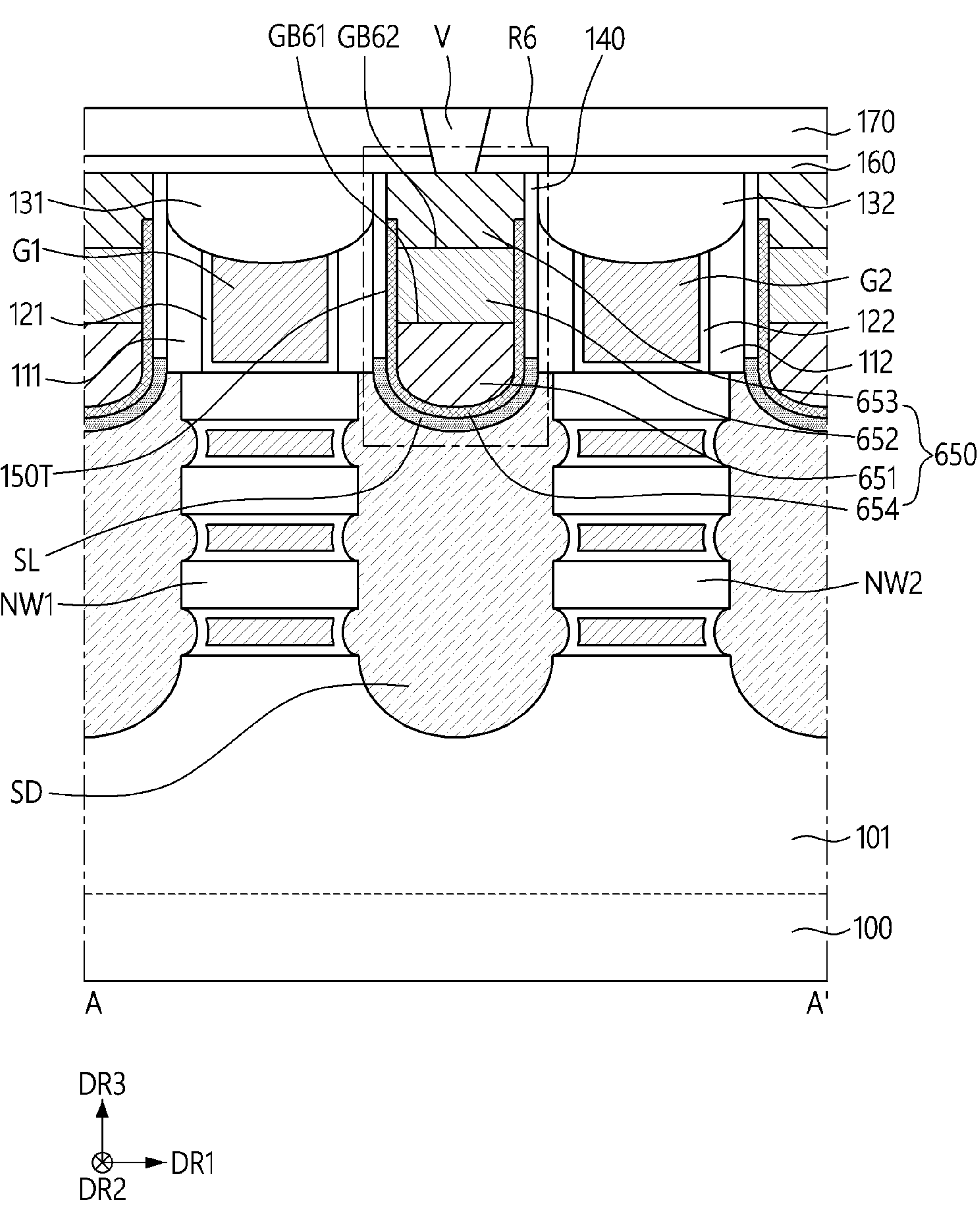
FIG. 40 is a cross-sectional view of a semiconductor device according to some embodiments of the present disclosure.

FIG. 40 is a cross-sectional view of a semiconductor device according to some embodiments of the present disclosure. FIG. 41 is an enlarged cross-sectional view of a region R6 of FIG. 40.

Figure 41:
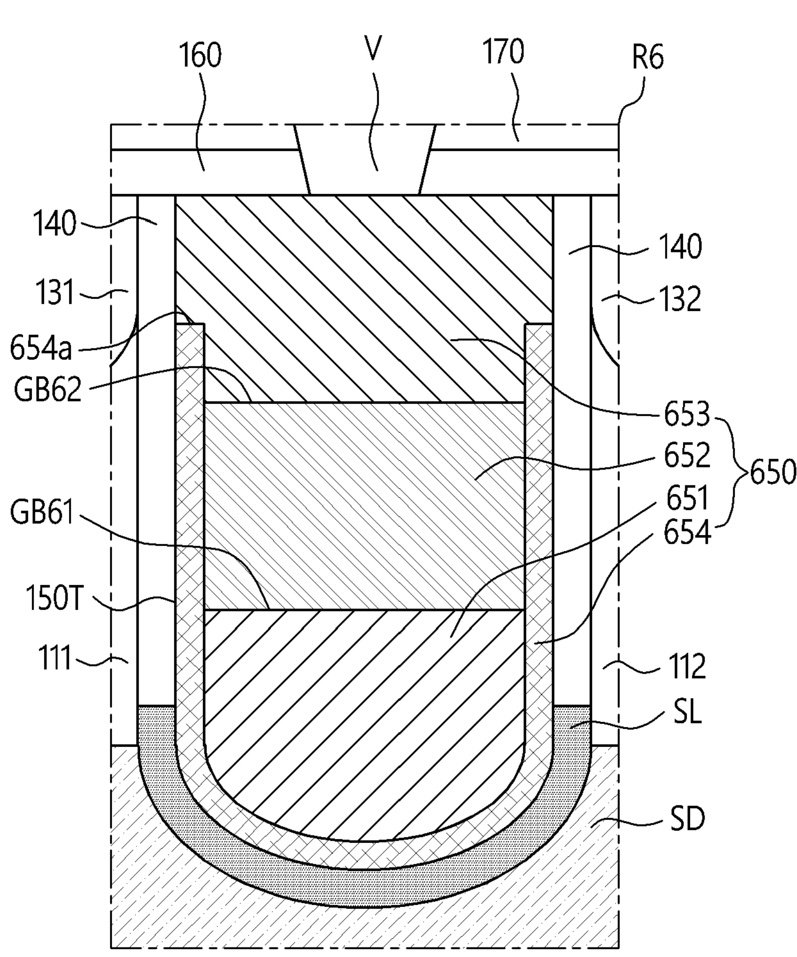
FIG. 41 is an enlarged cross-sectional view of a region R6 of FIG. 40.
Figure 41:
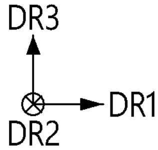

Referring to FIGS. 40 and 41, a contact barrier layer 654 may be on the sidewalls and bottom surface of a first layer 651, the sidewalls of a second layer 652, and parts of the sidewalls of a third layer 653.

For example, a source/drain contact 650 may include the first layer 651, the second layer 652, the third layer 653, and the contact barrier layer 654. For example, the contact barrier layer 654 may be between a silicide layer SL and the sidewalls and bottom surface of the first layer 651. The contact barrier layer 654 may be between a first etch stopper layer 140 and the sidewalls of the first layer 651. The contact barrier layer 654 may also be between the first etch stopper layer 140 and the sidewalls of the second layer 652. The contact barrier layer 654 may also be between the first etch stopper layer 140 and parts of the sidewalls of the third layer 653. For example, an uppermost surface 654*a* of the contact barrier layer 654 may be formed between a second grain boundary GB62 and the top surface of the third layer 653. For example, a first grain boundary GB61 and the second grain boundary GB62 may be formed between the inner sidewalls of the contact barrier layer 654.

A semiconductor device according to some embodiments of the present disclosure will hereinafter be described with reference to FIGS. 42 and 43, highlighting the differences with the semiconductor device of FIGS. 1 through 4, 29, and 30.

Figure 42:
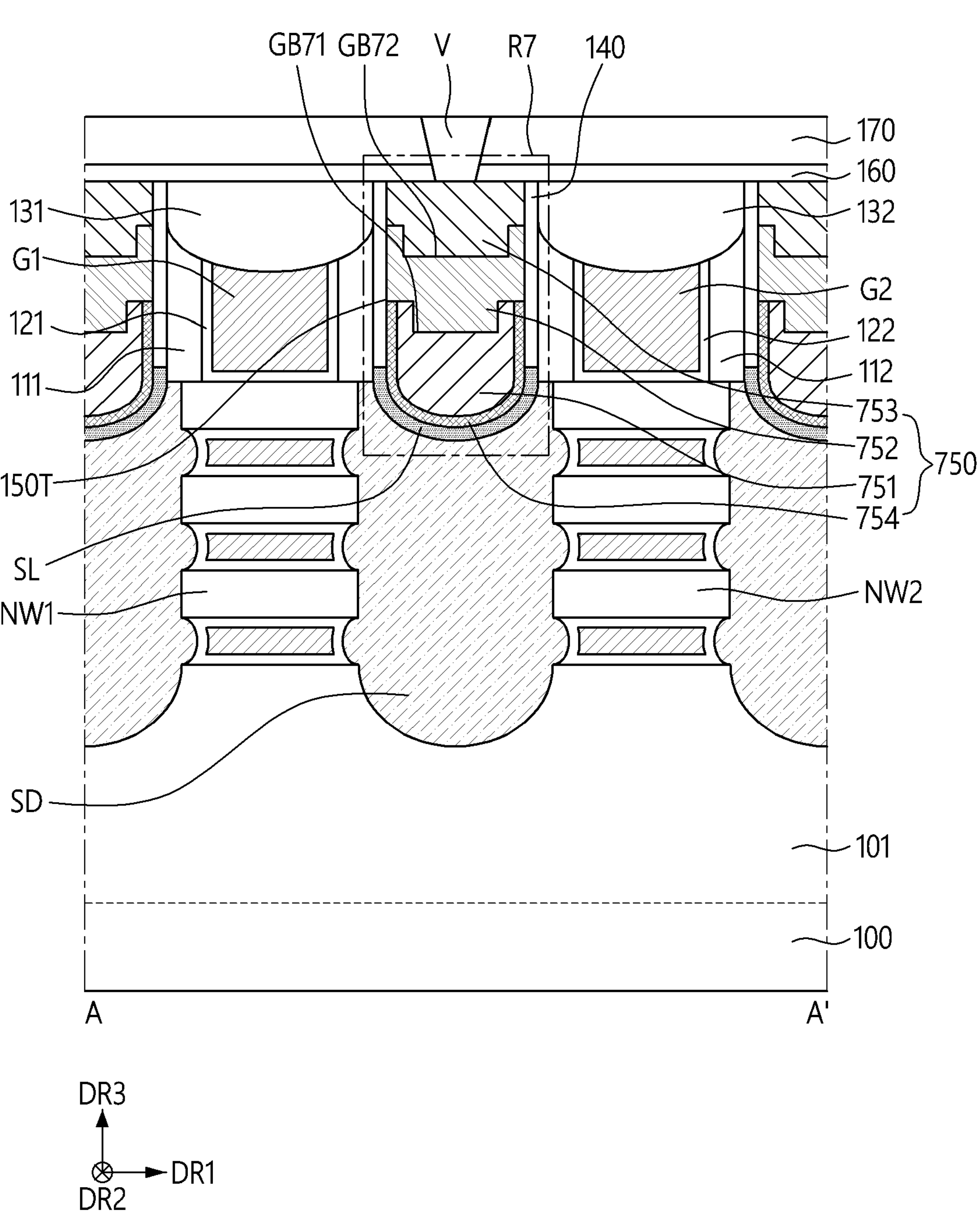
FIG. 42 is a cross-sectional view of a semiconductor device according to some embodiments of the present disclosure.

FIG. 42 is a cross-sectional view of a semiconductor device according to some embodiments of the present disclosure. FIG. 43 is an enlarged cross-sectional view of a region R7 of FIG. 42.

Figure 43:
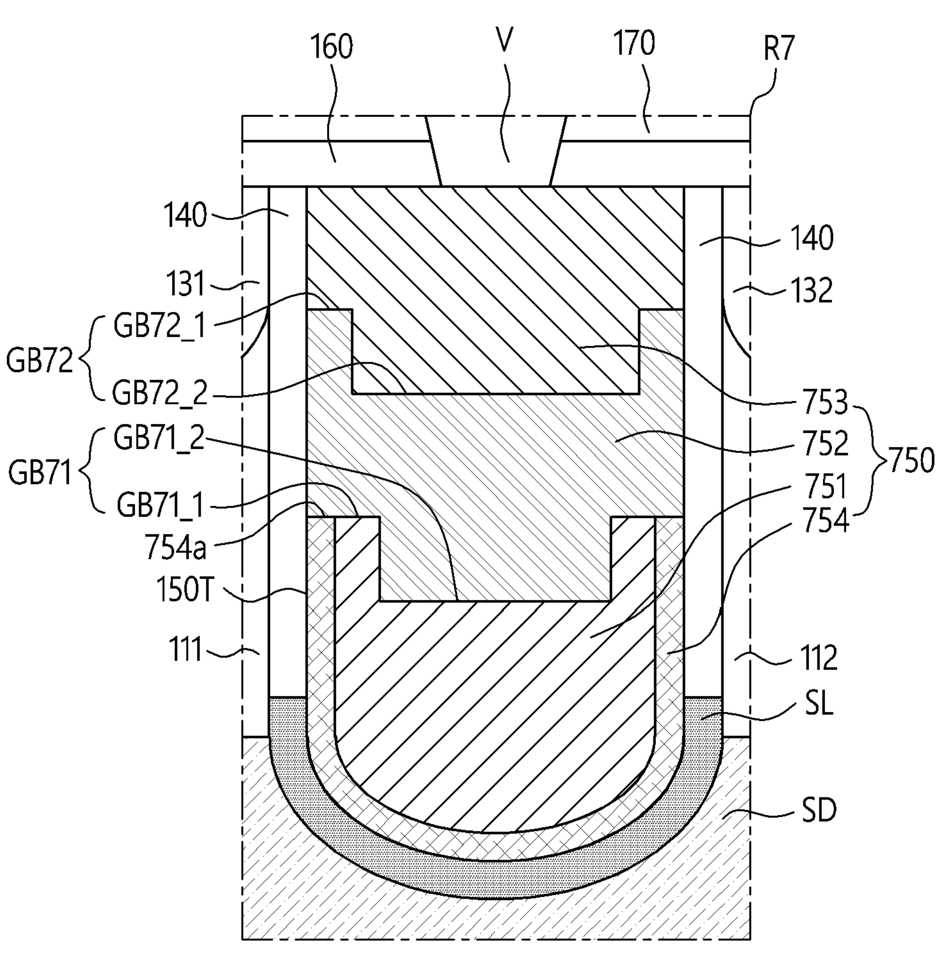
FIG. 43 is an enlarged cross-sectional view of a region R7 of FIG. 36.
Figure 43:
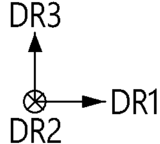

Referring to FIGS. 42 and 43, at least parts of the sidewalls of a second layer 752 may be in contact with a first layer 751, and at least parts of the sidewalls of a third layer 753 may be in contact with the second layer 752. A contact barrier layer 754 may be on the sidewalls and bottom surface of the first layer 751.

For example, a source/drain contact 750 may include the first layer 751, the second layer 752, the third layer 753, and the contact barrier layer 754. The top surfaces of portions of the first layer 751 that are adjacent to a first etch stopper layer 140 may be formed to be higher than the top surface of a middle portion of the first layer 751. At least part of the second layer 752 may be between the portions of the first layer 751 that are adjacent to the first etch stopper layer 140. The top surfaces of portions of the second layer 752 that are adjacent to the first etch stopper layer 140 may be formed to be higher than the top surface of a middle portion of the second layer 752. At least part of the third layer 753 may be between the portions of the second layer 752 that are adjacent to the first etch stopper layer 140.

For example, a first grain boundary GB71 may be formed at the interface between the first and second layers 751 and 752 and may include first boundaries GB71_1 and a second boundary GB71_2. The first boundaries GB71_1 may be formed at the interfaces between portions of the first layer 751 that are in contact with the first etch stopper layer 140 and portions of the second layer 752 that are in contact with the first etch stopper layer 140. The second boundary GB71_2 may be formed at the interface between the middle portions of the first and second layers 751 and 752. The first boundaries GB71_1 may be formed to be higher than the second boundary GB71_2.

For example, a second grain boundary GB72 may be formed at the interface between the second and third layers 752 and 753 and may include first boundaries GB72_1 and a second boundary GB72_2. The first boundaries GB72_1 may be formed at the interfaces between the portions of the second layer 752 that are in contact with the first etch stopper layer 140 and portions of the third layer 753 that are in contact with the first etch stopper layer 140. The second boundary GB72_2 may be formed at the interface between the middle portions of the second and third layers 752 and 753. The first boundaries GB72_1 may be formed to be higher than the second boundary GB72_2.

For example, the contact barrier layer 754 may be between a silicide layer SL and the sidewalls and bottom surface of the first layer 751. The contact barrier layer 754 may be between the first etch stopper layer 140 and the sidewalls of the first layer 751. For example, an uppermost surface 754*a* of the contact barrier layer 754 may be formed on the same plane as the first boundaries GB71_1 of the first grain boundary GB71.

A semiconductor device according to some embodiments of the present disclosure will hereinafter be described with reference to FIGS. 44 and 45, highlighting the differences with the semiconductor device of FIGS. 1 through 4.

Figure 44:
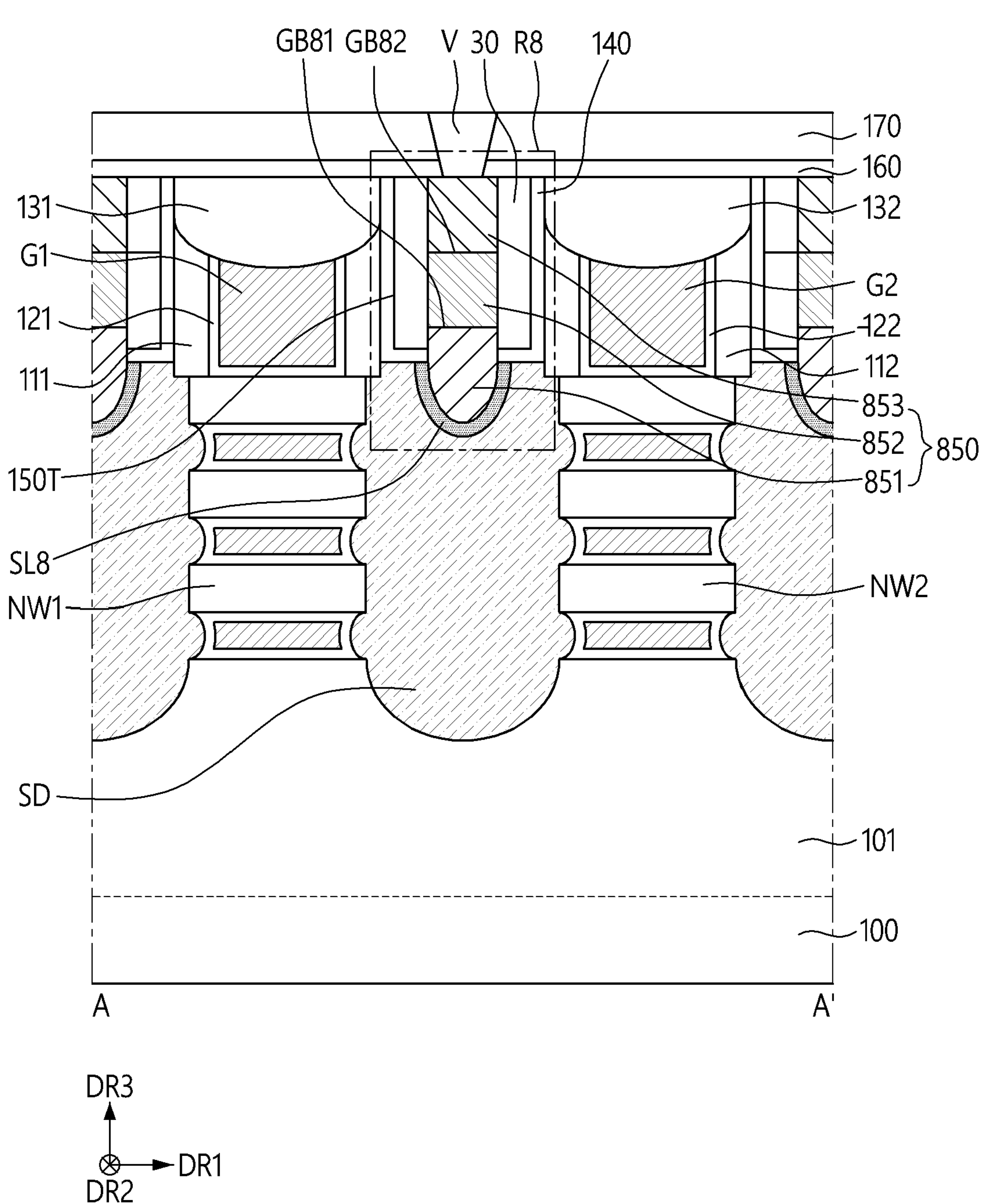
FIG. 44 is a cross-sectional view of a semiconductor device according to some embodiments of the present disclosure.

FIG. 44 is a cross-sectional view of a semiconductor device according to some embodiments of the present disclosure. FIG. 45 is an enlarged cross-sectional view of a region R8 of FIG. 44.

Figure 45:
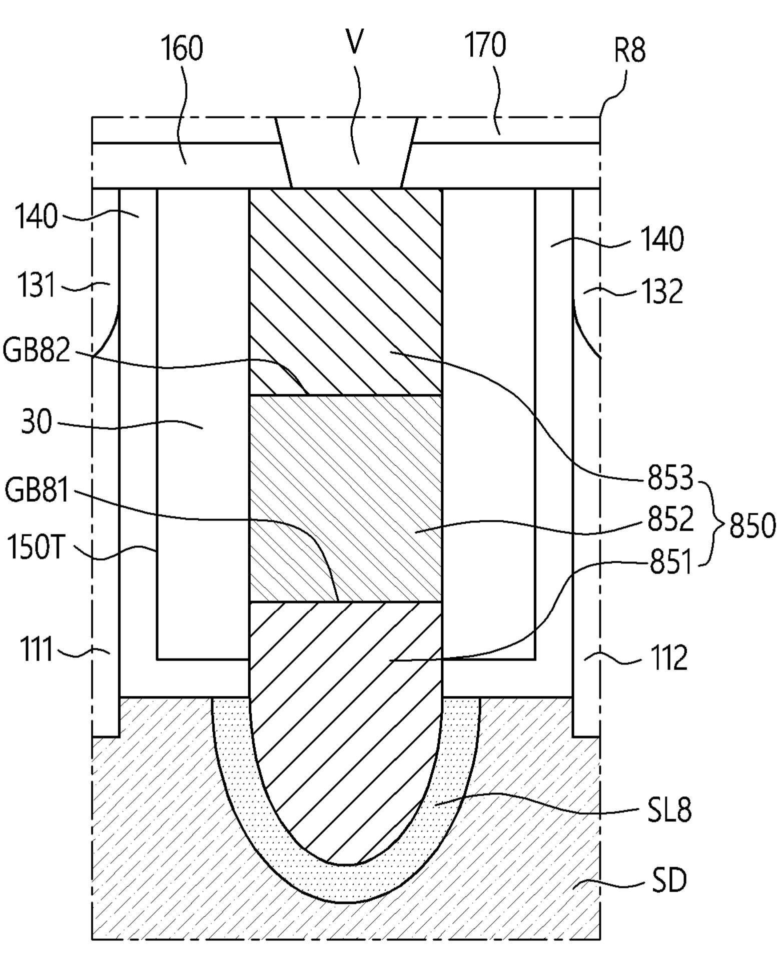
FIG. 45 is an enlarged cross-sectional view of a region R8 of FIG. 44.
Figure 45:
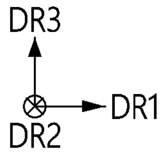

Referring to FIGS. 44 and 45, a first interlayer insulating layer 30 may be between a first etch stopper layer 140 and the sidewalls of a source/drain contact 850.

For example, the sidewalls, in a first horizontal direction DR1, of the source/drain contact 850 may be in contact with the first interlayer insulating layer 30. For example, the source/drain contact 850 may include first, second, and third layers 851, 852, and 853. For example, parts of the sidewalls of the first layer 851, the sidewalls of the second layer 852, and the sidewalls of the third layer 853 may be in contact with the first interlayer insulating layer 30. Other parts of the sidewalls of the first layer 851 may be in contact with the first etch stopper layer 140. For example, a silicide layer SL8 may be between the first layer 851 and a source/drain region SD. A first grain boundary GB81 may be formed at the interface between the first and second layers 851 and 852. A second grain boundary GB82 may be formed at the interface between the second and third layers 852 and 853.

A semiconductor device according to some embodiments of the present disclosure will hereinafter be described with reference to FIGS. 46 and 47, highlighting the differences with the semiconductor device of FIGS. 1 through 4.

Figure 46:
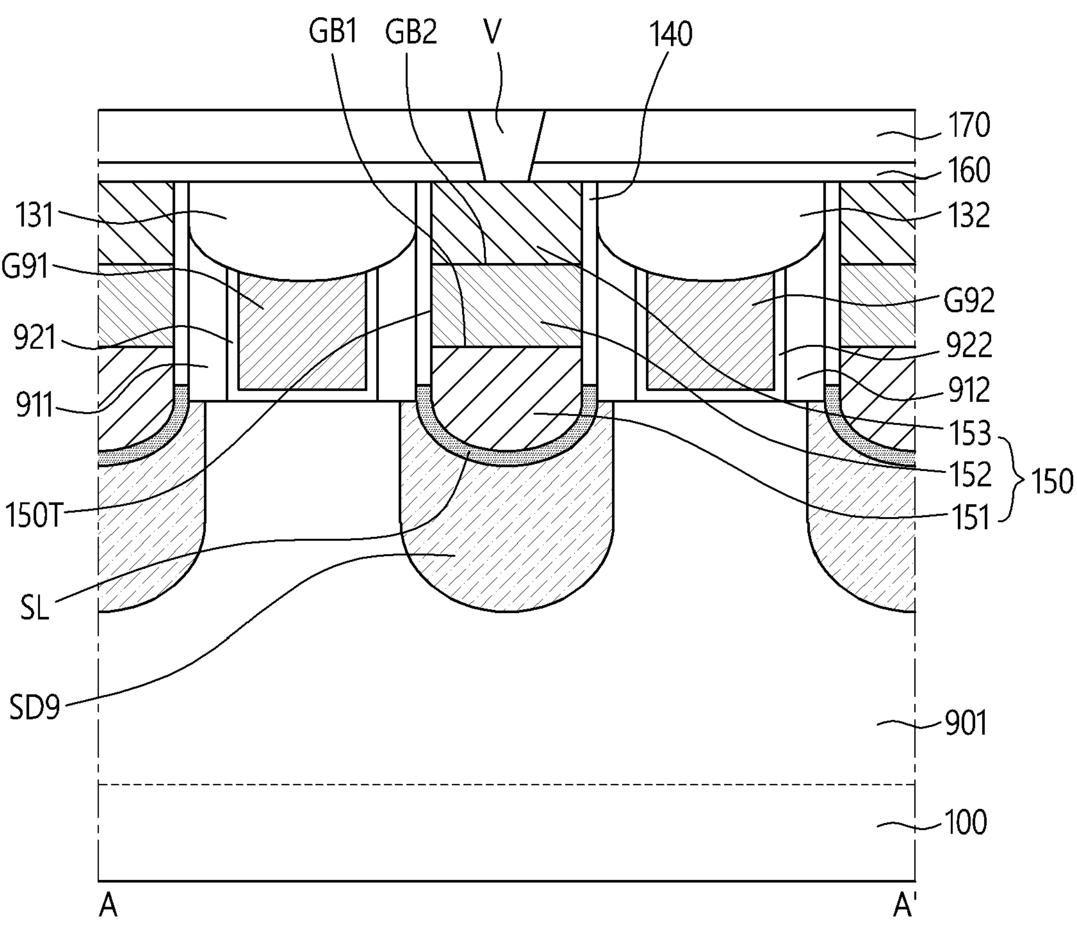
FIGS. 46 and 47 are cross-sectional views of a semiconductor device according to some embodiments of the present disclosure.
Figure 46:
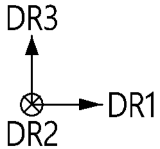
Figure 47:
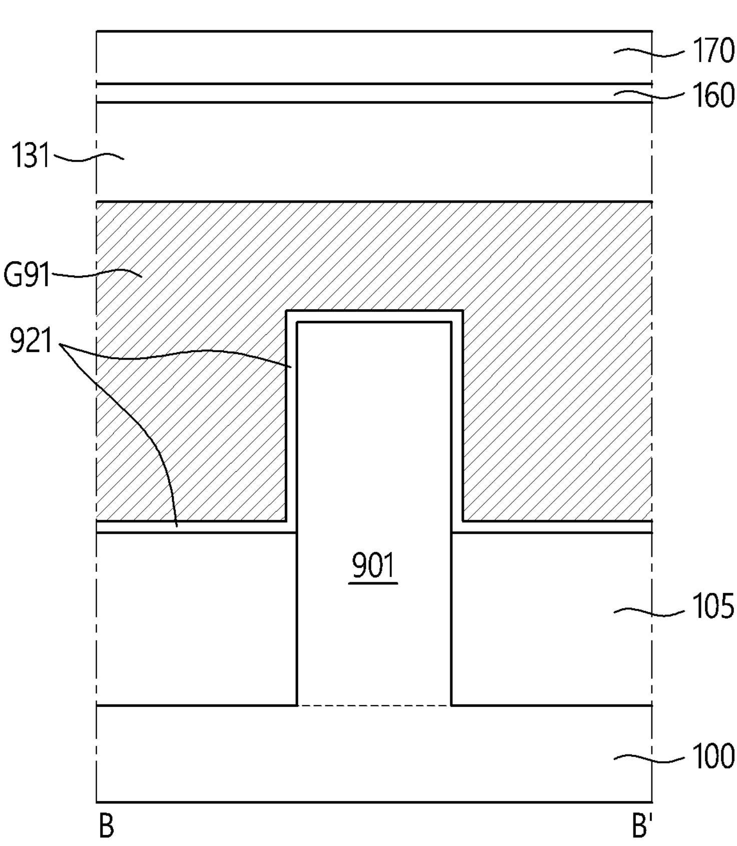
Figure 47:
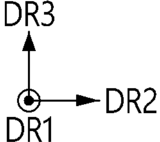

FIGS. 46 and 47 are cross-sectional views of a semiconductor device according to some embodiments of the present disclosure.

Referring to FIGS. 46 and 47, the semiconductor device according to some embodiments of the present disclosure may include a FinFET. For example, the semiconductor device according to some embodiments of the present disclosure may include a substrate 100, an active pattern 901, a field insulating layer 105, first and second gate electrodes G91 and G92, first gate spacers 911 and second gate spacers 912, first and second gate insulating layers 921 and 922, first and second capping patterns 131 and 132, a source/drain region SD9, a first etch stopper layer 140, a source/drain contact 150, a silicide layer SL, a second etch stopper layer 160, a second interlayer insulating layer 170, and a via V. Descriptions of the features that have been described earlier with reference to FIGS. 1 through 4 will be omitted.

The active pattern 901 may extend in a first horizontal direction DR1 on the substrate 100. The first gate electrode G91 may extend in a second horizontal direction DR2 on the active pattern 901. The second gate electrode G92 may extend in the second horizontal direction DR2 on the active pattern 901. The second gate electrode G92 may be spaced apart in the first horizontal direction DR1 from the first gate electrode G91. The first gate spacers 911 may extend in the second horizontal direction DR2 along both sidewalls of the first gate electrode G91, on the active pattern 901 and the field insulating layer 105. The second gate spacers 912 may extend in the second horizontal direction DR2 along both sidewalls of the second gate electrode G92, on the active pattern 901 and the field insulating layer 105.

The first gate insulating layer 921 may be between the first gate electrode G91 and the first gate spacers 911. The first gate insulating layer 921 may be between the first gate electrode G91 and the active pattern 901. The first gate insulating layer 921 may be between the first gate electrode G91 and the field insulating layer 105. The second gate insulating layer 922 may be between the second gate electrode G92 and the second gate spacers 912. The second gate insulating layer 922 may be between the second gate electrode G92 and the active pattern 901. The second gate insulating layer 922 may be between the second gate electrode G92 and the field insulating layer 105. The source/drain region SD9 may be on both sides of each of the first and second gate electrodes G91 and G92, on the active pattern 901.

Some examples of embodiments of the present disclosure have been described above and with reference to the accompanying drawings, but the inventive concepts of the present disclosure are not limited thereto and may be implemented in various different forms. It will be understood that the inventive concepts of the present disclosure can be implemented in other specific forms without changing the scope of the present disclosure. Therefore, it should be understood that the examples of embodiments set forth herein are illustrative in all respects and not limiting.

What is claimed is:

1. A semiconductor device comprising:

a substrate;

an active pattern that extends in a first horizontal direction on the substrate;

a gate electrode that extends in a second horizontal direction that is different from the first horizontal direction on the active pattern;

a source/drain region on at least a first side of the gate electrode on the active pattern; and a source/drain contact connected to the source/drain region on the first side of the gate electrode, the source/drain contact including first, second, and third layers which are sequentially stacked, the first, second, and third layers of the source/drain contact including a same metal, the first layer of the source/drain contact having a first crystal orientation, the second layer of the source/drain contact having a second crystal orientation different from the first crystal orientation, and the third layer of the source/drain contact having a third crystal orientation different from the second crystal orientation, wherein the source/drain contact includes a first grain boundary at an interface between the first layer and the second layer of the source/drain contact, and a second grain boundary at an interface between the second layer and the third layer of the source/drain contact.

2. The semiconductor device of claim 1, wherein each of the first, second, and third layers includes one of tungsten (W) and molybdenum (Mo).

3. The semiconductor device of claim 1, further comprising:

a capping pattern that extends in the second horizontal direction on a top surface of the gate electrode, wherein a top surface of the capping pattern is coplanar with a top surface of the third layer.

4. The semiconductor device of claim 1, further comprising:

a plurality of nanosheets stacked on the active pattern and spaced apart from one another in a vertical direction, the plurality of nanosheets surrounded by the gate electrode.

5. The semiconductor device of claim 4, wherein the first grain boundary is higher than a top surface of an uppermost nanosheet of the plurality of nanosheets.

6. The semiconductor device of claim 1, further comprising:

a gate spacer on first and second sidewalls in the first horizontal direction of the gate electrode; and an etch stopper layer between the source/drain contact and the gate spacer, wherein at least parts of first and second sidewalls in the first horizontal direction of the third layer of the source/drain contact are in contact with the etch stopper layer.

7. The semiconductor device of claim 1, wherein the source/drain contact further includes a contact barrier layer on a bottom surface and sidewalls of the first layer.

8. The semiconductor device of claim 7, wherein an uppermost surface of the contact barrier layer is between the first grain boundary and the second grain boundary.

9. The semiconductor device of claim 7, wherein an uppermost surface of the contact barrier layer is coplanar with the first grain boundary.

10. The semiconductor device of claim 1, further comprising:

a gate spacer on first and second sidewalls in the first horizontal direction of the gate electrode;

an etch stopper layer in contact with first and second sidewalls in the first horizontal direction of the gate spacer; and an interlayer insulating layer between the etch stopper layer and the source/drain contact, wherein first and second sidewalls in the first horizontal direction of the source/drain contact are in contact with the interlayer insulating layer.

11. The semiconductor device of claim 1, wherein the first grain boundary is parallel with a top surface of the substrate.

12. The semiconductor device of claim 1, wherein at least parts of first and second sidewalls of the second layer of the source/drain contact are in contact with the first layer.

13. A semiconductor device comprising:

a substrate;

an active pattern that extends in a first horizontal direction on the substrate;

a gate electrode that extends in a second horizontal direction that is different from the first horizontal direction on the active pattern;

a gate spacer on first and second sidewalls in the first horizontal direction of the gate electrode;

an etch stopper layer in contact with first and second sidewalls in the first horizontal direction of the gate spacer;

a source/drain region on at least a first side of the gate electrode on the active pattern; and a source/drain contact connected to the source/drain region on the first side of the gate electrode, the source/drain contact including first, second, and third layers which are sequentially stacked, each of the first, second, and third layers including tungsten (W), the first layer having a first crystal orientation, the second layer having a second crystal orientation different from the first crystal orientation, the third layer having a third crystal orientation different from the second crystal orientation, wherein the source/drain contact includes a first grain boundary at an interface between the first layer and the second layer, and a second grain boundary at an interface between the second layer and the third layer, wherein at least parts of first and second sidewalls in the first horizontal direction of the third layer are in contact with the etch stopper layer.

14. The semiconductor device of claim 13, wherein first and second sidewalls in the first horizontal direction of each of the first, second, and third layers are in contact with the etch stopper layer.

15. The semiconductor device of claim 13, wherein the source/drain contact further includes a contact barrier layer on a bottom surface and sidewalls of the first layer.

16. The semiconductor device of claim 15, wherein an uppermost surface of the contact barrier layer is coplanar with the second grain boundary.

17. The semiconductor device of claim 15, wherein an uppermost surface of the contact barrier layer is between the second grain boundary and a top surface of the third layer.

18. The semiconductor device of claim 13, wherein the second grain boundary is parallel to a top surface of the substrate.

19. The semiconductor device of claim 13, wherein at least parts of the first and second sidewalls of the third layer are in contact with the second layer of the source/drain contact.

20. A semiconductor device comprising:

a substrate;

an active pattern extending in a first horizontal direction on the substrate;

a first plurality of nanosheets stacked on the active pattern and spaced apart from one another in a vertical direction;

a second plurality of nanosheets stacked on the active pattern and spaced apart from one another in the vertical direction, the second plurality of nanosheets spaced apart from the first plurality of nanosheets in the first horizontal direction;

a first gate electrode extending in a second horizontal direction that is different from the first horizontal direction on the active pattern, the first gate electrode surrounding the first plurality of nanosheets;

a second gate electrode extending in the second horizontal direction on the active pattern, the second gate electrode spaced apart from the first gate electrode in the first horizontal direction, the second gate electrode surrounding the second plurality of nanosheets;

a first gate spacer on first and second sidewalls in the first horizontal direction of the first gate electrode;

a second gate spacer on first and second sidewalls in the first horizontal direction of the second gate electrode;

an etch stopper layer in contact with sidewalls in the first horizontal direction of each of the first gate spacer and the second gate spacer;

a source/drain region between the first gate electrode and the second gate electrode on the active pattern; and a source/drain contact connected to the source/drain region between the first gate electrode and the second gate electrode, the source/drain contact including first, second, and third layers which are sequentially stacked, each of the first, second, and third layers of the source/drain contact including tungsten (W), the first layer having a first crystal orientation, the second layer having a second crystal orientation different from the first crystal orientation, the third layer having a third crystal orientation different from the second crystal orientation, wherein a first grain boundary is formed at an interface between the first layer and the second layer, and a second grain boundary is formed at an interface between the second layer and the third layer, wherein a sidewall in the first horizontal direction of each of the first, second, and third layers of the source/drain contact is in contact with the etch stopper layer, and wherein each of the first grain boundary and the second grain boundary is parallel to a top surface of the substrate.

* * * * *